US012704925B2

(12) United States Patent
Kim et al.

(10) Patent No.: US 12,704,925 B2
(45) Date of Patent: Aug. 11, 2026

(54) TOUCH INPUT DEVICE INCLUDING A PLURALITY OF RECEIVING ELECTRODES DISPOSED TO INTERLEAVE A PLURALITY OF DRIVING ELECTRODES

(71) Applicant: HiDeep Inc., Seongnam-si (KR)

(72) Inventors: Bonkee Kim, Seongnam-si (KR); Seyeob Kim, Seongnam-si (KR); Jongsik Kim, Seongnam-si (KR); Sein Lee, Seongnam-si (KR)

(73) Assignee: HIDeep Inc. (KR)

( * ) Notice: Subject to any disclaimer, the term of this patent is extended or adjusted under 35 U.S.C. 154(b) by 0 days.

(21) Appl. No.: 18/958,700

(22) Filed: Nov. 25, 2024

(65) Prior Publication Data

US 2025/0093998 A1 Mar. 20, 2025

Related U.S. Application Data

(63) Continuation-in-part of application No. 18/210,499, filed on Jun. 15, 2023, now Pat. No. 12,468,412, which is a continuation of application No. 17/600,465, filed as application No. PCT/KR2020/001925 on Feb. 11, 2020, now Pat. No. 12,079,427.

(30) Foreign Application Priority Data

Apr. 2, 2019 (KR) ........................ 10-2019-0038292

(51) Int. Cl.

| | |
|---|---|
| ***G06F 3/041*** | (2006.01) |
| ***G06F 3/044*** | (2006.01) |
| ***H10K 59/40*** | (2023.01) |

(52) U.S. Cl.

CPC .......... *G06F 3/0418* (2013.01); *G06F 3/0446* (2019.05); *G06F 3/0447* (2019.05); *H10K 59/40* (2023.02); *G06F 2203/04112* (2013.01)

(58) Field of Classification Search

None

See application file for complete search history.

(56) References Cited

U.S. PATENT DOCUMENTS

| | | | |
|---|---|---|---|
| 8,525,941 | B2 | 9/2013 | Shi et al. |
| 8,730,189 | B2 | 5/2014 | Mamba et al. |

(Continued)

FOREIGN PATENT DOCUMENTS

| | | | |
|---|---|---|---|
| CN | 102929464 | A | 2/2013 |
| CN | 103246422 | A | 8/2013 |

(Continued)

*Primary Examiner* — Kirk W Hermann

(74) *Attorney, Agent, or Firm* — The Belles Group, P.C.

(57) ABSTRACT

A touch input device including a sensor detects whether a touch input to a touch surface is input by an object or/and a touch position even in a situation where the touch input device is in a floating state. The touch input device includes a touch surface, including: a sensor which is disposed under the touch surface and includes a plurality of driving electrodes, a plurality of receiving electrodes, and a plurality of dummy receiving electrodes; and a touch detection unit configured to detect a touch position of an object input to the touch surface based on a detection signal output from the plurality of receiving electrodes of the sensor, in which the touch detection unit detects the touch position of the object input to the touch surface.

20 Claims, 58 Drawing Sheets

(56) References Cited

U.S. PATENT DOCUMENTS

| | | | |
|---|---|---|---|
| 8,810,542 B2 | 8/2014 | Yousefpor | |
| 9,262,027 B2 | 2/2016 | Mamba et al. | |
| 9,495,039 B2 | 11/2016 | Mamba et al. | |
| 9,927,924 B2 | 3/2018 | Staton | |
| 10,338,747 B2 | 7/2019 | Kim et al. | |
| 10,782,826 B2 | 9/2020 | Kim et al. | |
| 11,061,508 B2 | 7/2021 | Kim et al. | |
| 11,294,502 B2 | 4/2022 | Kim et al. | |
| 2005/0122119 A1* | 6/2005 | Barlow | G01D 5/2405 324/662 |
| 2008/0158172 A1 | 7/2008 | Hotelling et al. | |
| 2009/0160787 A1* | 6/2009 | Westerman | G06F 3/0446 345/173 |
| 2009/0267916 A1 | 10/2009 | Hotelling | |
| 2010/0013800 A1* | 1/2010 | Elias | G06F 3/0418 345/178 |
| 2010/0060608 A1 | 3/2010 | Yousefpor | |
| 2010/0079401 A1 | 4/2010 | Staton | |
| 2010/0090979 A1 | 4/2010 | Bae | |
| 2010/0149108 A1 | 6/2010 | Hotelling et al. | |
| 2011/0006832 A1* | 1/2011 | Land | G06F 3/04166 327/517 |
| 2011/0080353 A1 | 4/2011 | Kang | |
| 2011/0175823 A1* | 7/2011 | Vieta | G06F 3/0412 345/173 |
| 2011/0175835 A1 | 7/2011 | Wang | |
| 2011/0187663 A1 | 8/2011 | Lin et al. | |
| 2011/0216033 A1 | 9/2011 | Mamba et al. | |
| 2012/0092577 A1 | 4/2012 | Shi et al. | |
| 2012/0169651 A1 | 7/2012 | Chang | |
| 2012/0287055 A1* | 11/2012 | Cheng | G06F 3/0446 345/173 |
| 2012/0319974 A1 | 12/2012 | Kim | |
| 2013/0069905 A1* | 3/2013 | Krah | G06F 3/04182 345/174 |
| 2014/0232684 A1 | 8/2014 | Mamba et al. | |
| 2014/0285465 A1* | 9/2014 | Hayashi | G06F 3/04166 345/174 |
| 2015/0002443 A1 | 1/2015 | Brunet et al. | |
| 2015/0242041 A1* | 8/2015 | Sugita | G06F 3/0412 345/174 |
| 2015/0277618 A1 | 10/2015 | Bulea | |
| 2015/0370380 A1 | 12/2015 | Hong et al. | |
| 2016/0117054 A1 | 4/2016 | Mamba et al. | |
| 2016/0170528 A1 | 6/2016 | Wu et al. | |
| 2016/0179283 A1 | 6/2016 | Hoch | |
| 2016/0313845 A1 | 10/2016 | Lin et al. | |
| 2016/0328053 A1 | 11/2016 | Veerasamy et al. | |
| 2017/0075491 A1 | 3/2017 | Ye et al. | |
| 2017/0153736 A1* | 6/2017 | Kim | G06F 3/0443 |
| 2017/0242534 A1* | 8/2017 | Gray | G06F 3/041662 |
| 2018/0321793 A1 | 11/2018 | Kim et al. | |
| 2018/0329576 A1 | 11/2018 | Kim et al. | |
| 2019/0146602 A1* | 5/2019 | Kadowaki | G06F 3/041661 345/174 |
| 2019/0302962 A1 | 10/2019 | Kim et al. | |
| 2021/0004120 A1 | 1/2021 | Kim et al. | |
| 2022/0229517 A1 | 7/2022 | Kim et al. | |

FOREIGN PATENT DOCUMENTS

| | | | |
|---|---|---|---|
| KR | 20110037579 A | 4/2011 | |
| KR | 20110053271 A | 5/2011 | |
| KR | 20110061637 A | 6/2011 | |
| KR | 20110099625 A | 9/2011 | |
| KR | 20120037461 A | 4/2012 | |
| KR | 101293165 B1 | 8/2013 | |
| KR | 20150031767 A * | 3/2015 | G06F 3/0416 |
| KR | 20180122761 A | 11/2018 | |
| KR | 20180125671 A | 11/2018 | |

* cited by examiner

100
Cover window glass
OCA
Polarizer
10
Touch sensor
OCA
encapsulation layer
200A
R
G
B
TFT layer

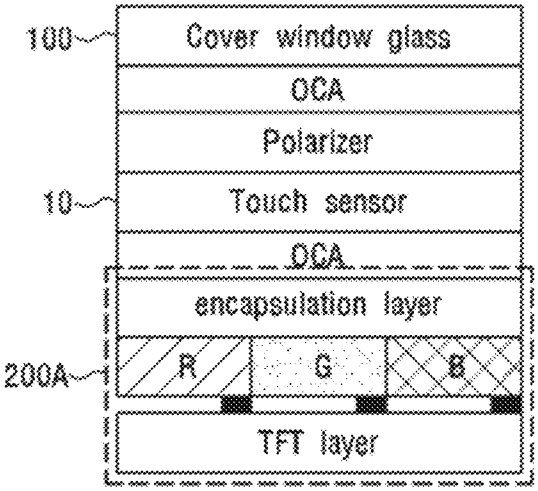

FIG. 4A
Cover window glass
100
OCA
Polarizer
Touch sensor
10
encapsulation layer
R
G
B
200A
TFT layer

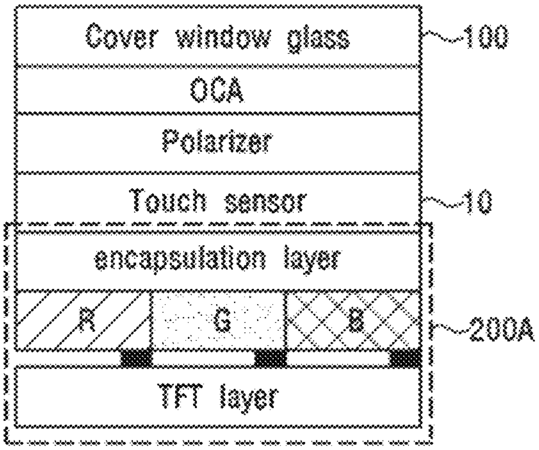

FIG. 4B
100
Cover window glass
OCA
Polarizer
encapsulation layer
10
Touch sensor
200A
R
G
B
TFT layer

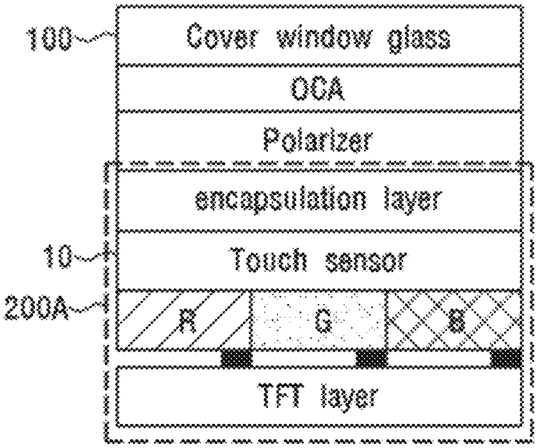

FIG. 4C
Cover window glass
100
Touch sensor
10
Polarizer
Color Filter Glass
200B
LC Molecule+ TFT Array
Polarizer
BLU
250

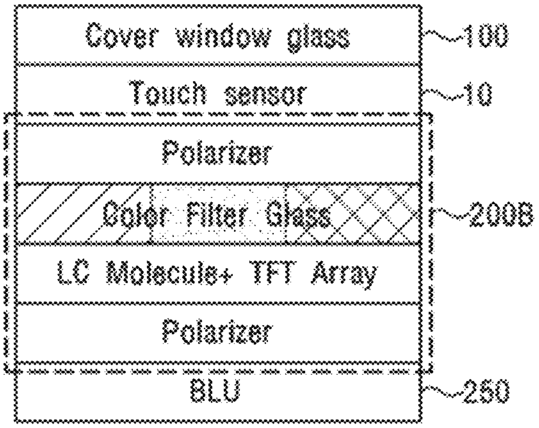

FIG. 4D
100
Cover window glass
Polarizer
10
Touch sensor
Color Filter Glass
200B
LC Molecule+ TFT Array
Polarizer
250
BLU

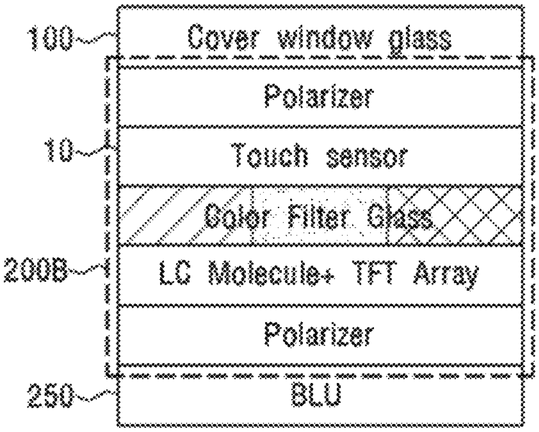

FIG. 4E
Cover window glass
100
Polarizer
Color Filter Glass
Touch sensor
10
LC Molecule+ TFT Array
200B
Polarizer
BLU

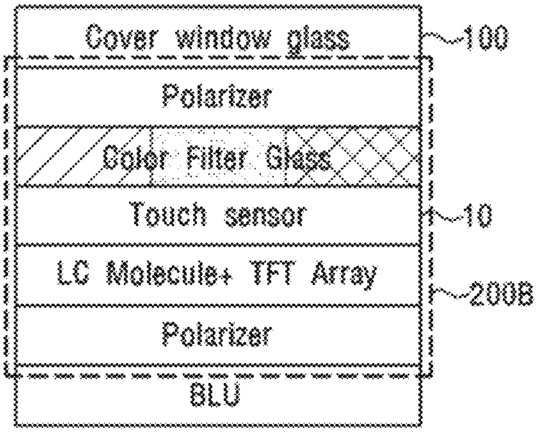

FIG. 4F

| | RX0 | RX1 | RX2 | RX3 | RX4 | RX5 | RX6 | RX7 | RX8 | RX9 | RX10 | RX11 | RX12 | RX13 | RX14 | RX15 | RX16 |
|---|---|---|---|---|---|---|---|---|---|---|---|---|---|---|---|---|---|
| TX0 | -3 | -2 | -1 | -3 | -2 | -2 | -3 | -2 | -2 | -2 | -2 | -1 | -1 | -1 | -2 | -2 | -4 |
| TX1 | -5 | -1 | -3 | -3 | -3 | -3 | -1 | -2 | -3 | -2 | -2 | -2 | -3 | -2 | -2 | -2 | -3 |
| TX2 | -4 | -4 | -2 | -2 | -3 | -2 | -1 | -3 | -1 | -1 | -1 | -1 | 0 | -1 | 0 | 0 | -1 |
| TX3 | -3 | -2 | -1 | -2 | -1 | -2 | -1 | -1 | -1 | -1 | -1 | -1 | -1 | 0 | 0 | 0 | -2 |
| TX4 | -3 | -3 | -3 | -4 | -4 | -1 | -4 | -4 | -3 | -2 | -3 | -2 | -2 | -3 | -1 | -1 | -5 |
| TX5 | -3 | -2 | -1 | -1 | -1 | -1 | -1 | 0 | 0 | -1 | 1 | -1 | 0 | 0 | 0 | 0 | 13 |
| TX6 | -4 | -4 | -3 | -3 | -4 | -3 | -2 | -2 | -2 | -2 | -2 | -2 | -2 | -3 | 0 | 0 | -5 |
| TX7 | -4 | -3 | -2 | -3 | -3 | -2 | -1 | -1 | -1 | -1 | 0 | -1 | -1 | 0 | 1 | 3 | 36 |
| TX8 | -4 | -4 | -3 | -3 | -3 | -3 | -2 | -2 | -3 | -1 | -1 | -1 | 0 | 1 | 2 | 5 | 42 |
| TX9 | -3 | -3 | -3 | -3 | -3 | -3 | -2 | -2 | -2 | -2 | -2 | -2 | -1 | -1 | 3 | 7 | 15 |
| TX10 | -5 | -4 | -5 | -5 | -5 | -5 | -4 | -3 | -4 | -3 | -4 | -2 | -2 | 3 | 4 | 6 | 6 |
| TX11 | -4 | -4 | -4 | -5 | -4 | -6 | -4 | -4 | -4 | -4 | -5 | -3 | -3 | -1 | 0 | 0 | 2 |
| TX12 | -5 | -4 | -3 | -4 | -5 | -4 | -3 | -3 | -3 | -2 | -3 | -2 | -1 | -1 | 1 | 1 | 3 |
| TX13 | -3 | -3 | -3 | -4 | -4 | -3 | -2 | -2 | -3 | -2 | -2 | -2 | -2 | -2 | -1 | -2 | -1 |
| TX14 | -5 | -3 | -4 | -4 | -4 | -3 | -3 | -2 | -2 | -3 | -3 | -3 | -3 | -3 | -2 | -2 | -3 |
| TX15 | -4 | -2 | -2 | -3 | -4 | -2 | -2 | -2 | -2 | -1 | -2 | -2 | -1 | -2 | -2 | -1 | -1 |
| TX16 | -5 | -4 | -4 | -5 | -6 | -3 | -4 | -4 | -4 | -3 | -4 | -4 | -3 | -3 | -4 | -3 | -3 |

| | RX17 | RX18 | RX19 | RX20 | RX21 | RX22 | RX23 | RX24 | RX25 | RX26 | RX27 | RX28 | RX29 | RX30 | RX31 | RX32 | RX33 |
|---|---|---|---|---|---|---|---|---|---|---|---|---|---|---|---|---|---|
| TX0 | -8 | -10 | -8 | -4 | -2 | 0 | 1 | 1 | 0 | -2 | -1 | -2 | -1 | -1 | -4 | -5 | -2 |
| TX1 | -9 | -9 | -6 | -4 | 1 | 1 | 0 | 1 | 0 | -3 | -2 | -2 | -1 | -2 | -4 | -5 | -2 |
| TX2 | -6 | -7 | -5 | -2 | 2 | 3 | 4 | 4 | 1 | -1 | 0 | 1 | 2 | 1 | -1 | -2 | -1 |
| TX3 | -9 | -9 | -5 | 4 | 5 | 6 | 6 | 4 | 3 | -1 | -1 | 0 | -1 | -2 | -5 | -6 | -5 |
| TX4 | 69 | 29 | 42 | 85 | 50 | 17 | 5 | 1 | 0 | -2 | -1 | -1 | -1 | -3 | -5 | -5 | -5 |
| TX5 | 77 | 36 | 82 | 77 | 108 | 56 | 8 | 3 | 2 | 0 | -1 | 1 | 1 | -1 | -3 | -3 | -1 |
| TX6 | 31 | 40 | 27 | 44 | 92 | 77 | 2 | -1 | -2 | -2 | -1 | 1 | 1 | 0 | -2 | -3 | -3 |
| TX7 | 80 | 36 | 22 | 39 | 79 | 21 | -1 | -1 | -1 | -1 | -1 | -2 | -2 | -3 | -3 | -3 | -2 |
| TX8 | 113 | 85 | 51 | 53 | 24 | 40 | -6 | -3 | -3 | -2 | 0 | -1 | -1 | -2 | -2 | -2 | -1 |
| TX9 | 86 | 122 | 78 | 29 | 79 | 40 | -6 | -3 | -3 | -4 | -4 | -5 | -4 | -5 | -5 | -6 | -4 |
| TX10 | 14 | 25 | 10 | -9 | -16 | -8 | -3 | -2 | -2 | -2 | -2 | -2 | -3 | -2 | -4 | -3 | -3 |
| TX11 | 5 | 7 | 3 | -5 | -11 | -7 | -3 | -2 | -4 | -5 | -5 | -5 | -6 | -6 | -5 | -5 | -5 |
| TX12 | 5 | 7 | 4 | -4 | -8 | -4 | -3 | -1 | -1 | -5 | -3 | -4 | -4 | -6 | -5 | -5 | -1 |
| TX13 | -3 | -5 | -4 | -5 | -3 | -3 | -2 | -1 | -2 | -2 | -2 | -3 | -4 | -4 | -3 | -3 | -1 |
| TX14 | -6 | -7 | -6 | -5 | -3 | -4 | -2 | -2 | -3 | -2 | -2 | -6 | -5 | -4 | -4 | -4 | -2 |
| TX15 | -5 | -6 | -7 | -6 | -2 | -3 | -2 | -2 | -2 | -2 | -1 | -5 | -4 | -3 | -4 | -3 | -2 |
| TX16 | -9 | -10 | -9 | -9 | -8 | -6 | -4 | -4 | -4 | -2 | -4 | -5 | -5 | -3 | -3 | -2 | -3 |

FIG. 6

| | | | | | | | | | | | | | | | |
|---|---|---|---|---|---|---|---|---|---|---|---|---|---|---|---|
| -4 | -6 | -11 | -11 | -16 | -15 | -5 | 0 | -9 | -11 | 13 | 5 | 5 | 2 | -12 | -9 |
| -18 | -17 | -1 | -1 | 9 | 9 | -3 | -4 | 6 | 3 | 9 | -3 | 4 | 4 | -5 | -6 |
| 0 | 0 | -7 | -8 | 1 | 1 | -2 | 0 | 17 | 13 | -1 | -4 | 2 | 4 | -10 | -11 |
| -11 | -11 | 5 | 7 | -2 | -2 | -11 | -7 | -9 | -14 | -18 | -18 | -3 | -3 | -1 | -1 |
| -12 | -11 | 4 | 5 | -6 | -5 | -32 | -25 | -14 | -18 | -2 | -10 | -1 | -5 | -1 | 1 |
| -5 | -4 | -11 | -13 | -4 | -2 | -37 | -29 | -6 | -1 | 15 | -2 | 7 | 2 | -11 | -14 |
| -19 | -19 | -3 | -4 | 6 | 5 | -44 | -26 | 20 | 61 | 82 | 39 | 17 | 6 | -6 | -7 |
| -10 | -7 | -13 | -20 | -21 | -18 | -31 | 85 | 137 | 167 | 173 | 160 | 46 | -2 | -12 | -13 |
| -14 | -12 | -16 | -17 | -20 | -12 | 14 | 139 | 68 | 104 | 93 | 34 | 14 | -15 | -14 | -15 |
| -24 | -23 | -5 | -9 | 1 | 12 | 74 | 159 | 142 | 161 | 151 | -1 | 3 | -3 | -10 | -10 |
| -10 | -9 | -14 | -16 | -6 | 3 | 40 | 170 | 186 | 160 | 72 | -21 | -2 | -4 | -15 | -16 |
| -18 | -15 | 1 | -1 | -8 | -1 | 5 | 107 | 110 | 22 | 4 | -24 | -4 | -7 | -2 | -4 |
| -4 | -5 | 11 | 11 | 6 | 9 | 0 | 7 | -4 | -10 | -14 | -14 | 0 | -2 | 3 | 4 |
| 3 | 2 | -4 | -2 | 5 | 7 | -3 | -2 | 6 | 6 | -1 | -2 | 3 | 3 | -9 | -8 |
| -12 | -12 | 3 | 3 | 12 | 12 | -9 | -8 | -6 | -5 | -4 | -6 | 5 | 5 | -5 | -4 |
| -2 | -2 | -7 | -5 | -10 | -9 | -10 | -10 | -24 | -23 | -2 | -4 | 5 | 5 | -8 | -8 |
| -1 | -2 | -5 | -6 | -10 | -9 | -8 | -9 | -20 | -19 | 1 | 0 | 7 | 8 | -8 | -8 |
| -10 | -10 | 4 | 5 | 11 | 10 | -8 | -7 | -3 | -2 | -1 | -3 | 5 | 4 | -4 | -3 |
| 2 | 1 | -4 | -6 | 1 | 1 | -7 | -5 | 6 | 7 | -1 | -2 | 3 | 3 | -8 | -9 |
| 0 | -1 | 9 | 9 | 2 | 2 | -8 | -8 | -14 | -15 | -14 | -14 | 0 | 1 | 4 | 4 |
| 2 | -1 | 10 | 11 | 1 | 1 | -9 | -8 | -14 | -13 | -13 | -13 | 0 | 0 | 5 | 4 |
| 2 | 3 | -5 | -4 | 1 | 0 | -7 | -8 | 4 | 6 | 1 | -1 | 4 | 3 | -9 | -9 |
| -11 | -10 | 4 | 4 | 9 | 10 | -9 | -10 | -4 | -3 | -3 | -5 | 4 | 3 | -4 | -4 |
| -1 | -3 | -6 | -7 | -11 | -10 | -11 | -10 | -22 | -21 | 3 | 2 | 5 | 7 | -8 | -8 |
| -4 | -5 | -6 | -6 | -12 | -11 | -10 | -10 | -20 | -20 | 4 | 4 | 6 | 8 | -8 | -10 |
| -12 | -11 | 4 | 6 | 9 | 8 | -9 | -11 | -2 | -2 | -4 | -4 | 4 | 4 | -4 | -4 |
| 1 | 1 | -4 | -6 | 0 | 1 | -5 | -7 | 3 | 5 | -1 | 0 | 3 | 3 | -9 | -10 |
| 3 | 3 | 7 | 10 | 1 | 1 | -8 | -7 | -16 | -15 | -13 | -13 | 1 | 2 | 3 | 4 |
| 2 | 2 | 8 | 9 | 2 | 1 | -5 | -9 | -16 | -16 | -14 | -14 | 3 | 2 | 6 | 3 |
| -1 | 0 | -4 | -4 | 0 | -2 | -8 | -8 | 5 | 3 | 1 | 1 | 2 | 3 | -10 | -10 |
| -10 | -11 | 6 | 6 | 9 | 8 | -11 | -11 | 0 | -1 | -3 | -5 | 3 | 4 | -5 | -5 |
| -5 | -5 | -9 | -8 | -12 | -14 | -13 | -13 | -22 | -23 | 3 | 2 | 6 | 7 | -9 | -8 |

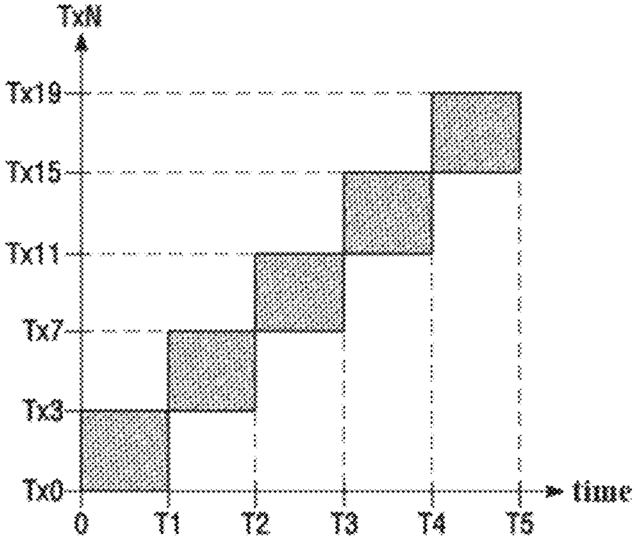
FIG. 55A
| Tx | Drive Signal | | | |
|---|---|---|---|---|
| Tx0 | 1 | 1 | 1 | -1 |
| Tx1 | 1 | 1 | -1 | 1 |
| Tx2 | 1 | -1 | 1 | 1 |
| Tx3 | -1 | 1 | 1 | 1 |
Drive sum = 2
FIG. 55B
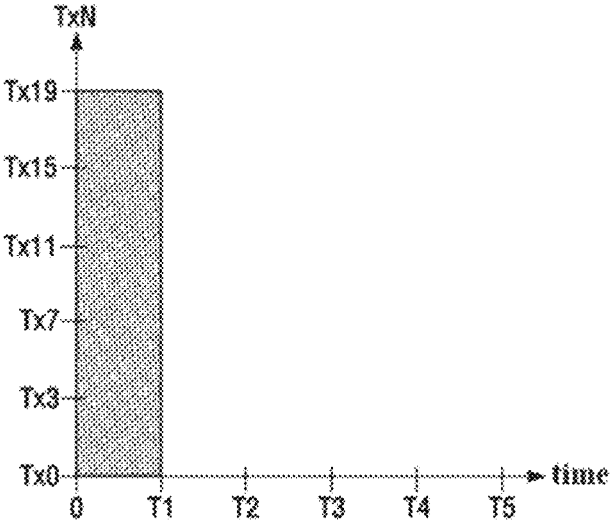
FIG. 56A
| Tx | Drive Signal | | | | |
|---|---|---|---|---|---|
| Tx0 | 1 | 1 | 1 | -1 | ... |
| Tx1 | -1 | -1 | -1 | 1 | ... |
| Tx2 | 1 | 1 | -1 | 1 | ... |
| Tx3 | -1 | -1 | 1 | -1 | ... |
| ... | ... | | | | |
Drive sum = 0
FIG. 56B

TOUCH INPUT DEVICE INCLUDING A PLURALITY OF RECEIVING ELECTRODES DISPOSED TO INTERLEAVE A PLURALITY OF DRIVING ELECTRODES

CROSS-REFERENCE TO RELATED APPLICATIONS

This U.S. Non-Provisional patent application is a Continuation-In-Part of U.S. patent application Ser. No. 18/210,499, filed on Jun. 15, 2023, that is a Continuation of U.S. patent application Ser. No. 17/600,465, filed on Apr. 25, 2022, that issued as U.S. Pat. No. 12,079,427 on Sep. 3, 2024, that is a U.S. National Stage Application under 35 U.S.C. § 371 of PCT Application No. PCT/KR2020/001925, filed Feb. 11, 2020, that claims priority to Korean Patent Application No. 10-2019-0038292, filed Apr. 2, 2019, the entire disclosures of all of which are hereby incorporated by reference herein, for all purposes.

BACKGROUND

The present invention relates to a touch input device, and more particularly, to a touch input device including a touch sensor, which is capable of accurately detecting whether a touch input to a touch surface by an object is input or/and a touch position in a situation where the touch input device is in a floating state.

Various types of input devices are used to operate a computing system. For example, the input devices, such as a button, a key, a joystick, and a touch screen, are used. Due to the easy and convenient operation of the touch screen, the use of the touch screen is increasing in the operation of computing systems.

The touch screen may configure a touch surface of a touch input device including a touch sensor panel that may be a transparent panel provided with a touch-sensitive surface. The touch sensor panel is attached to a front surface of a display screen, so that a touch-sensitive surface may cover a viewed surface of the display screen. A user is allowed to operate a computing system by simply touching the touch screen with a finger and the like. In general, the computing system recognizes a touch and a touch position on a touch screen and interprets the touch to perform a calculation according to the interpretation.

In the case where driving electrodes and receiving electrodes are implemented in the same layer or dual layers, when a touch input device, such as a smart phone, equipped with a touch sensor, is touched without being held by hand (floating state), a signal that should be normally detected disappears or a signal to be detected is split by Low Ground Mass (LGM), or a signal to be detected is split, so that there are cases where a signal appears as two or more points are touched.

Y-OCTA is a touch screen panel in which a touch sensor is directly deposited on a cell. Y-OCTA is named by attaching Y, from 'YOUM' of Samsung Display's flexible OLED brand name to the 'OCTA'. The Y-OCTA technology is applied to a Thin Film Encapsulation (TFE) process during an OLED manufacturing process. A touch screen is implemented by patterning an aluminum metal mesh sensor used as a touch sensor between an organic material for thin film encapsulation and a polarizer. According to the Y-OCTA, by attaching a polarizer closely to a cover window, a visibility problem occurring at a curved edge may be solved. In addition, by removing a support film, a panel thickness may be reduced. Since a laminating process may be omitted, costs may be reduced.

A conventional touch input device having a Y-OCTA touch screen panel has a problem in a Low Ground Mass (LGM) state. An LGM problem is a phenomenon in which a driving electrode and a receiving electrode are implemented as a single layer or a double layer in a touch sensor when a certain touch occurs in a state in which a user does not hold a touch input device equipped with the touch sensor by hand (so-called 'floating state'), a signal to be detected normally disappears from a point of view of the touch input device, or a signal to be detected normally is split and detected as if being touched at two or more points.

In addition, a conventional touch input device having a Y-OCTA touch screen panel has a flicker problem in a display panel according to driving of the touch sensor. The flicker problem is a phenomenon in which a display screen flickers or vibrates very quickly caused by various causes.

To solve this flicker problem, conventional attempts have been performed such as an attempt using dithering for each frame, using a lower driving voltage of the touch sensor, and another attempt using a received frame rate information from a display driving chip (DDI) during VRR (Variable Refresh Rate) operation and changing a frequency of a driving signal of the touch sensor accordingly. However, these attempts do not completely solve the flicker problem.

SUMMARY

An object to be solved by the present invention is to provide a touch sensor capable of detecting a touch signal in the same or similar manner to a grip state of a touch input device even in a floating state of the touch input device, and a touch input device including the same.

Further, the present invention provides a touch sensor capable of recognizing two or more multi-touches even in the state where a touch input device is in a floating state, and a touch input device including the same.

Furthermore, the present invention provides a touch sensor capable of recognizing a third touch touched together with a cross touch, and a touch input device including the same.

Furthermore, the present invention provides a touch input device capable of minimizing a display noise caused by driving of a display panel.

Furthermore, the present invention also provides a touch input device capable of minimizing a flicker effect that may occur on a display panel by driving of a touch sensor.

Furthermore, the present invention also provides a touch input device capable of improving a touch malfunction in an LGM state.

A touch input device according to an exemplary embodiment is a touch input device including a touch surface, including: a touch sensor which is disposed under the touch surface and includes a plurality of driving electrodes, a plurality of receiving electrodes, and a plurality of dummy receiving electrodes; and a touch detection unit configured to detect a touch position of an object input to the touch surface based on a detection signal output from the plurality of receiving electrodes of the touch sensor, in which the touch detection unit detects the touch position of the object input to the touch surface by subtracting a second detection signal output from a dummy receiving electrode that does not form mutual capacitance with the predetermined driving electrode among the plurality of dummy receiving electrodes from a first detection signal output from a predetermined receiving electrode that forms mutual capacitance with the predetermined driving electrode among the plurality of receiving electrodes.

A touch input device according to another exemplary embodiment is a touch input device including a touch surface, including: a touch sensor which is disposed under the touch surface and includes a plurality of driving electrodes, a plurality of receiving electrodes, and a plurality of dummy driving electrodes; and a touch detection unit configured to detect a touch position of an object input to the touch surface based on a detection signal output from the plurality of receiving electrodes of the touch sensor, in which the touch detection unit detects the touch position of the object input to the touch surface by subtracting a second detection signal output from a predetermined receiving electrode that does not form mutual capacitance with a predetermined dummy driving electrode among the plurality of receiving electrodes from a first detection signal output from a predetermined receiving electrode that forms mutual capacitance with a predetermined driving electrode among the plurality of receiving electrodes.

A touch input device according to still another exemplary embodiment is a touch input device including a touch surface, including: a touch sensor which is disposed under the touch surface and includes a plurality of driving electrodes and a plurality of receiving electrodes; and a touch detection unit configured to detect a touch position of an object input to the touch surface based on a detection signal output from the plurality of receiving electrodes of the touch sensor, in which the touch detection unit detects the touch position of the object input to the touch surface by subtracting a second detection signal output from another predetermined receiving electrode that does not form mutual capacitance with a predetermined driving electrode among the plurality of receiving electrodes from a first detection signal output from a predetermined receiving electrode that forms mutual capacitance with the predetermined driving electrode among the plurality of receiving electrodes.

A touch sensor according to an exemplary embodiment includes: a plurality of driving electrodes; a plurality of receiving electrodes which is electrically insulated from the plurality of driving electrodes, and forms mutual capacitance with the plurality of driving electrodes; and a plurality of dummy receiving electrodes which is electrically insulated from the plurality of driving electrodes and the plurality of receiving electrodes, and does not form mutual capacitance with the plurality of driving electrodes, in which when a driving signal is applied through a predetermined driving electrode among the plurality of driving electrodes, a first detection signal output from a predetermined receiving electrode among the plurality of receiving electrodes includes information on the amount of mutual capacitance changed between the predetermined driving electrode and the predetermined receiving electrode and noise information, a second detection signal output from a predetermined dummy receiving electrode among the plurality of dummy receiving electrodes includes the noise information, and the noise information includes information on the amount of negative (−) capacitance changed by an LGM jamming signal generated by coupling between an object and the predetermined driving electrode.

A touch sensor according to another exemplary embodiment includes: a plurality of driving electrodes; and a plurality of dummy driving electrodes electrically insulated from the plurality of driving electrodes; and a plurality of receiving electrodes which is electrically insulated from the plurality of driving electrodes and the plurality of dummy driving electrodes, forms mutual capacitance with the plurality of driving electrodes, and does not form the mutual capacitance with the plurality of dummy driving electrodes, in which a predetermined receiving electrode among the plurality of receiving electrodes outputs a first detection signal and a second detection signal, the first detection signal includes information on the amount of mutual capacitance changed between the predetermined receiving electrode and a predetermined driving electrode among the plurality of driving electrodes and noise information, a second detection signal includes the noise information, and the noise information includes information on the amount of negative (−) capacitance changed by an LGM jamming signal generated by coupling between an object and the predetermined driving electrode.

A touch sensor according to still another exemplary embodiment includes: a plurality of driving electrodes; and a plurality of receiving electrodes which is electrically insulated from the plurality of driving electrodes, in which when a driving signal is applied through a predetermined driving electrode among the plurality of driving electrodes, a first detection signal output from a first receiving electrode that forms mutual capacitance with the predetermined driving electrode among the plurality of receiving electrodes includes information on the amount of mutual capacitance changed between the predetermined driving electrode and the first receiving electrode and noise information, a second detection signal output from a second receiving electrode that does not form the mutual capacitance with the predetermined driving electrode among the plurality of receiving electrodes includes the noise information, and the noise information includes information on the amount of negative (−) capacitance changed by an LGM jamming signal generated by coupling between an object and the predetermined driving electrode.

A touch input device including a display panel according to an embodiment of the present invention includes: a touch sensor including a plurality of first electrodes and a plurality of second electrodes disposed to cross the plurality of first electrodes; and a circuitry electrically connected to the plurality of first electrodes and the plurality of second electrodes to control the touch sensor. Here, the second electrode includes a pair of electrode portions, one of the pair of electrode portions is disposed adjacent to at least one of the electrodes among the plurality of first electrodes, and the other of the pair of electrode portions is disposed adjacent to at least one of remaining electrodes among the plurality of first electrodes. Also, the circuitry is configured to drive the touch sensor in synchronization with at least one horizontal synchronization signal applied to the display panel and drive the touch sensor for a predetermined time after the horizontal synchronization signal starts to be applied to the display panel.

A touch input device including a display panel according to another embodiment of the present invention includes: a touch sensor including a plurality of first electrodes and a plurality of second electrodes disposed to cross the plurality of first electrodes; and a circuitry electrically connected to the plurality of first electrodes and the plurality of second electrodes to control the touch sensor. Here, the second electrode includes a pair of electrode portions, one of the pair of electrode portions is disposed adjacent to at least one of the electrodes among the plurality of first electrodes, and the other of the pair of electrode portions is disposed adjacent to at least one of remaining electrodes among the plurality of first electrodes. Also, the circuitry is configured to drive the touch sensor in a time interval different from a time interval in which horizontal synchronization signals are applied to the display panel.

BRIEF DESCRIPTION OF THE FIGURES

FIGS. 4A to 4F are exemplary cross-sectional structural views of a touch input device including a touch sensor.

FIGS. 5 and 6 are output data for explaining why an LGM jamming signal is generated in the touch input device including the touch sensor illustrated in FIG. 2 or/and FIG. 3.

FIG. 13 represents raw data when an object, such as a thumb, is in contact with a specific portion of a touch surface of a touch input device having a structure of a touch sensor illustrated in FIG. 12.

FIG. 55A is a graph showing a multi-driving which is performed for each of four driving electrodes of the touch input device in FIG. 37. FIG. 55B is a table showing an example of a driving signal (or a driving code) that is simultaneously applied to four driving electrodes Tx0, Tx1, Tx2, and Tx3 during the multi-driving in FIG. 55A.

FIG. 56A is a graph showing the multi-driving of all driving electrodes in the touch input device shown in FIG. 54. FIG. 56B is a table showing an example of a driving signal (or driving code) applied to all driving electrodes Tx0, Tx1, Tx2, Tx3, etc., simultaneously driven during the multi-driving in FIG. 56A.

DETAILED DESCRIPTION

Figure 1:
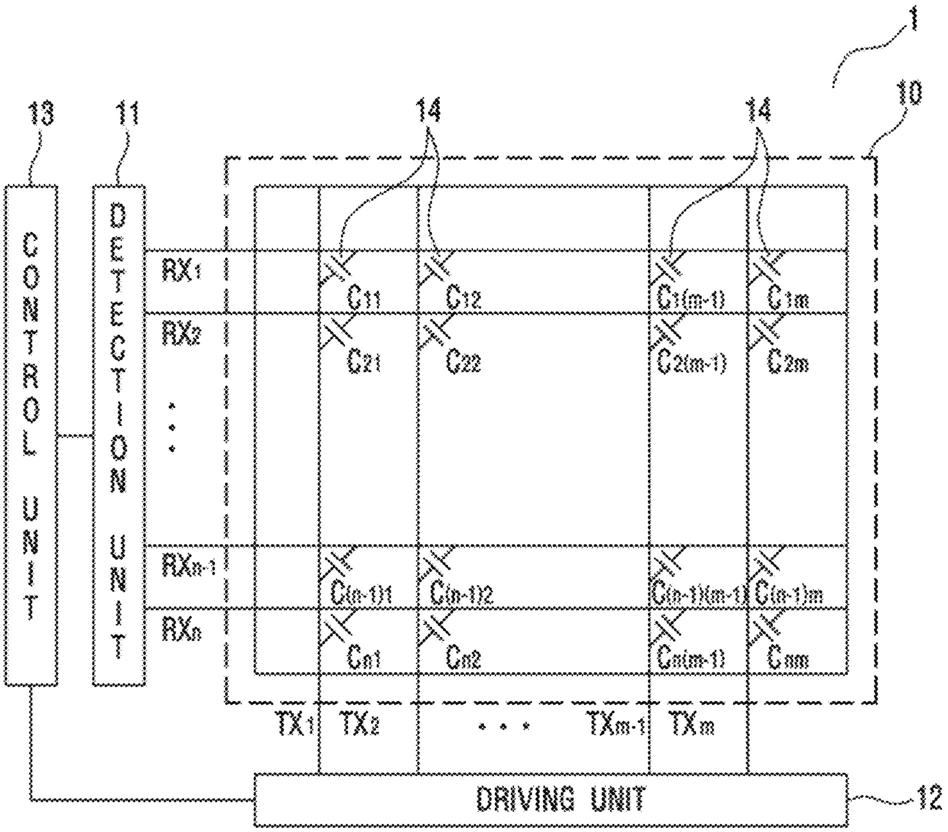
FIG. 1 is a schematic diagram illustrating a touch sensor 10 in a general touch input device and a configuration for operating the touch sensor.

In the detailed description of the present invention described below, reference is made to the accompanying drawings, which illustrate a specific exemplary embodiment in which the present invention may be carried out, as an example. The exemplary embodiment is described in detail sufficient to enable a person skilled in the art to carry out the present invention. It should be understood that various exemplary embodiments of the present invention are different from each other, but need not to be mutually exclusive. For example, specific shapes, structures, and characteristics described herein may be implemented in other exemplary embodiments without departing from the spirit and the scope of the present invention in relation to one exemplary embodiment. Further, it should be understood that a location or disposition of an individual component in each disclosed exemplary embodiment may be changed without departing from the spirit and the scope of the present invention. Accordingly, the detailed description below is not intended to be taken in a limited meaning, and the scope of the present invention, if appropriately described, is limited only by the appended claims along with all scopes equivalent to those claimed by the claims. Like reference numerals in the drawings refer to the same or similar functions over several aspects.

A touch input device according to various embodiments of the present document is an electronic device including at least one, for example, a smartphone, a tablet personal computer, a vehicle display device, a mobile phone, a video phone, an e-book reader, a laptop personal computer (laptop PC), a netbook computer, a mobile medical device, a camera, and a wearable device. Here, the wearable device is an accessory type (e.g. watch, ring, bracelet, anklet, necklace, glasses, contact lens, and head-mounted-device (HMD)), textile and clothing integral type (e.g. electronic clothing), a body attachment type (e.g. a skin pad or tattoo), and a living body implantation type (e.g. an implantable circuit).

Hereinafter, a touch sensor according to an exemplary embodiment of the present invention and a touch input device including the same will be described with reference to the accompanying drawings. Hereinafter, a capacitive touch sensor 10 is exemplified, but the present invention may also be identically/similarly applied to a touch sensor 10 capable of detecting a touch position by a predetermined method.

FIG. 1 is a schematic diagram illustrating a touch sensor 10 in a general touch input device and a configuration for operating the touch sensor.

Referring to FIG. 1, the touch sensor 10 may include a predetermined shape of patterns, and the predetermined patterns may include a plurality of driving electrodes TX0 to TXn and a plurality of receiving electrodes RX0 to RXm.

For an operation of the touch sensor 10, the touch sensor 10 may include a driving unit 12 which applies a driving signal to the plurality of driving electrodes TX0 to TXn, and a detection unit 11 which receives a detection signal including information about the amount of changed capacitance changed according to a touch to a touch surface from the plurality of receiving electrodes RX0 to RXm and detects a touch and a touch position.

FIG. 1 illustrates the case where the plurality of driving electrodes TX0 to TXn and the plurality of receiving electrodes RX0 to RXm of the touch sensor 10 configure an orthogonal array, but the present invention is not limited thereto, and the plurality of driving electrodes TX0 to TXn and the plurality of receiving electrodes RX0 to RXm may have any number of dimensions and applications arrangements thereof including a diagonal arrangement, a concentric arrangement, and a three-dimensional random arrangement. Herein, n and m are positive integers, and may have the same or different values, and have different sizes depending on an exemplary embodiment.

Figure 2:
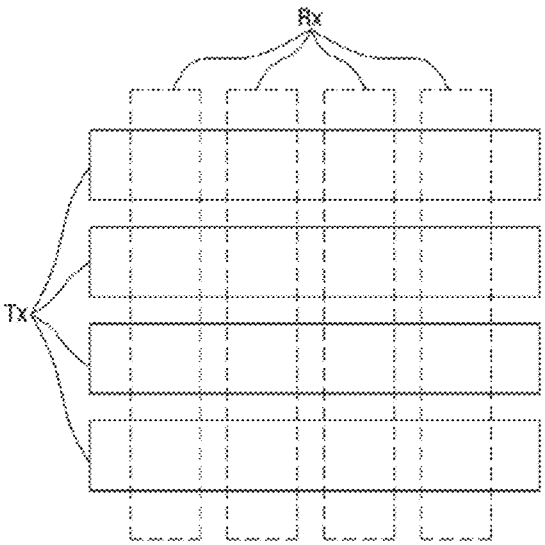
FIGS. 2 and 3 are diagrams illustrating an example of a touch sensor having a dual-layer structure.
Figure 3:
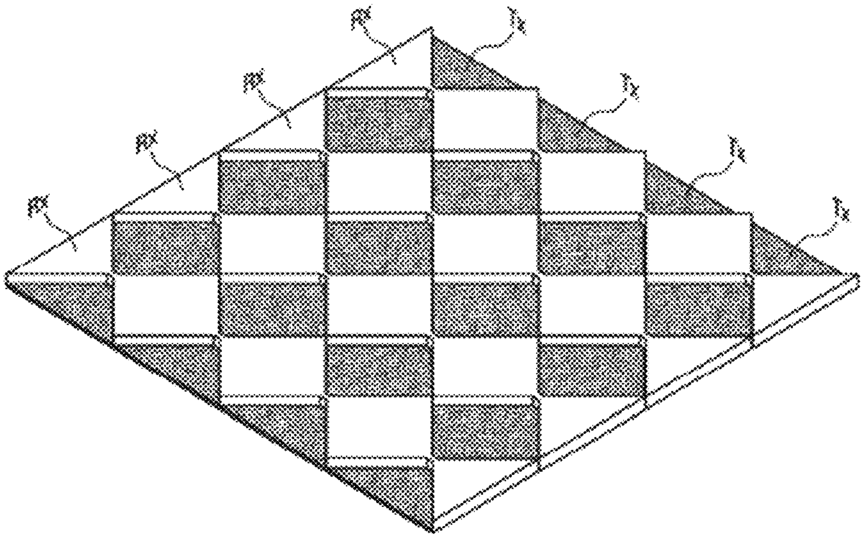

The plurality of driving electrodes TX0 to TXn and the plurality of receiving electrodes RX0 to RXm may be arranged to cross each other as illustrated in FIGS. 2 and 3. The driving electrode TX may include the plurality of driving electrodes TX0 to TXn extending in a first axis direction, and the receiving electrode RX may include the plurality of receiving electrodes RX0 to RXm extending in a second axis direction crossing the first axis direction.

The plurality of driving electrodes TX0 to TXn and the plurality of receiving electrodes RX0 to RXm may be formed on different dual layers (two layers) as illustrated in FIGS. 2 and 3. For example, the plurality of driving electrodes TX0 to TXn and the plurality of receiving electrodes RX0 to RXm may have a bar pattern as illustrated in FIG. 2, and may be a diamond pattern as illustrated in FIG. 3. Herein, the layer on which the plurality of driving electrodes TX0 to TXn is formed may also be disposed on a layer on which the plurality of receiving electrodes RX0 to RXm is formed, or the layers may be disposed in reverse. An insulating layer for preventing short-circuit between the plurality of driving electrodes and the plurality of receiving electrodes may be formed between the dual layers.

The touch sensor 10 including the plurality of driving electrodes TX0 to TXn and the plurality of receiving electrodes RX0 to RXm may be disposed between a cover layer 100 and a display panel 200A together with OCA disposed above and beneath the touch sensor 10 (add-on) as illustrated in FIG. 4A. As illustrated in FIG. 4B, the touch sensor 10 may be directly disposed on an upper surface of the display panel 200A (for example, an upper surface of an encapsulation layer of the display panel 200A) (on-cell). In the meantime, the touch sensor 10 including the plurality of driving electrodes TX0 to TXn and the plurality of receiving electrodes RX0 to RXm may be disposed inside the display panel 200A (for example, between the encapsulation layer and an organic light emitting layer of the display panel 200A) (in-cell) as illustrated in FIG. 4C.

In FIGS. 4A-C, the display panel 200A may be a rigid OLED panel, and may be a flexible OLED panel. When the display panel 200A is the rigid OLED panel, the encapsulation layer and a TFT layer may be formed of glass, and when the display panel 200A is the flexible OLED panel, the encapsulation layer may be formed of a thin film and a TFT layer may be formed of a PI film.

In the meantime, in FIGS. 4A-C, the display panel 200A is illustrated as an OLED panel, but the present invention is not limited thereto, and a display panel 200B may also be an LCD panel as illustrated in FIGS. 4D-E According to a characteristic of the LCD panel, a backlight unit (BLU) 250 is disposed under the display panel 200B.

In particular, as illustrated in FIG. 4D, the touch sensor 10 may be added on a cover window glass 100. Herein, although not illustrated in the drawing, the touch sensor 10 may also be added on an upper surface of the cover window glass 100 in the form of a film. As illustrated in FIG. 4E, the touch sensor 10 may be formed on a color filter glass of the display panel 200B (on-cell). Herein, the touch sensor 10 may also be formed on the upper surface of the color filter glass as illustrated in the drawing, and although not illustrated in the drawing, the touch sensor 10 may also be formed on a lower surface of the color filter glass. As illustrated in FIG. 4F, the touch sensor 10 may be formed on a TFT layer (TFT array) (in-cell). Herein, the touch sensor 10 may also be formed on an upper surface of the TFT layer (TFT array) as illustrated in the drawing, and although not illustrated in the drawing, the touch sensor 10 may also be formed on a lower surface of the TFT layer (TFT array). Further, although not illustrated in a separate drawing, one of the driving electrode and the receiving electrode may be formed on the color filter glass of the display panel 200B and the remaining one may also be formed on the TFT layer.

Referring back to FIG. 1, the plurality of driving electrodes TX0 to TXn and the plurality of receiving electrodes RX0 to RXm may be made of a transparent conductive material (for example, indium tin oxide (ITO) or antimony tin oxide (ATO) made of tin oxide ($SnO_2$) and indium oxide ($In_2O_3$)). However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT). Further, the driving electrode TX and the receiving electrode RX may be implemented with a metal mesh.

The driving unit 12 may apply a driving signal to the driving electrodes TX0 to TXn. The detection unit 11 may detect whether a touch is input and a touch position by receiving a detection signal including information about the amount of mutual capacitance (Cm: 14) changed generated between the driving electrodes TX0 to TXn and the receiving electrodes RX0 to RXm to which the driving signal is applied through the receiving electrodes RX0 to RXm. The detection signal includes a noise signal, as well as a signal in which the driving signal applied to the driving electrode TX is coupled by mutual capacitance (Cm: 14) generated between the driving electrode TX and the receiving electrode RX. The noise signal may include display noise information (for example, Zebra noise), information about the amount of change according to the change in an image displayed on the display, and information on an LGM jamming signal (for example, the amount of negative (−) capacitance changed) generated in a floating state.

The detection unit 11 may include a receiver (not illustrated) connected with each of the receiving electrodes RX0 to RXm through a switch. The switch is turned on in a time period for detecting the signal of the corresponding receiving electrode RX so that the sensing signal from the receiving electrode RX may be detected by the receiver. The receiver may include an amplifier (not illustrated) and a feedback capacitor coupled between a negative (−) input terminal of the amplifier and an output terminal of the amplifier, that is, a feedback path. In this case, a positive (+) input terminal of the amplifier may be connected to ground. Further, the receiver may further include a reset switch connected to the feedback capacitor in parallel. The reset switch may reset a conversion from a current to a voltage performed in the receiver. The negative input terminal of the amplifier may be connected to the corresponding receiving electrode RX and receive a current signal including information on the capacitance (Cm: 14) and then integrate the received current signal and convert the integrated current signal to a voltage. The detection unit 11 may further include an analog to digital converter (ADC) (not illustrated) which converts the data integrated through the receiver to digital data value. Later, the digital data may be input to a processor (not illustrated) and processed so as to obtain touch information for the touch sensor 10. The detection unit 11 may include the ADC and the processor together with the receiver.

A control unit 13 may perform a function of controlling the operations of the driving unit 12 and the detection unit 11. For example, the control unit 13 may generate a driving control signal and then transmit the generated driving control signal to the driving unit 12 so that the driving signal is applied to a predetermined driving electrode TX at a predetermined time. Further, the control unit 13 may generate a detection control signal and then transmit the generated detection control signal to the detection unit 11 to make the detection unit 11 receive the detection signal from a predetermined receiving electrode RX at a predetermined time and perform a predetermined function.

In FIG. 1, the driving unit 12 and the detection unit 11 may configure a touch detection unit (not illustrated) which is capable of detecting whether a touch is input to the touch sensor 10 and a touch position. Further, the touch detection unit may further include the control unit 13. The touch detection unit may be integrated on a touch sensing Integrated Circuit (IC). The driving electrode TX and the receiving electrode RX included in the touch sensor 10 may be connected to the driving unit 12 and the detection unit 11 included in the touch sensing IC through, for example, a conductive trace and/or a conductive pattern printed on a circuit board. The touch sensing IC may be positioned on a circuit board on which a conductive pattern is printed, for example, a touch circuit board (hereinafter, referred to as a touch PCB). According to the exemplary embodiment, the touch sensing IC may be mounted on a main board for operating the touch input device.

As described above, predetermined capacitance (Cm) is generated at each crossing point of the driving electrode TX and the receiving electrode RX, and when an object, such as a finger, approaches the touch sensor 10, a value of the capacitance (Cm) may be changed. In FIG. 1, the capacitance may represent mutual capacitance (Cm). The detection unit 11 may detect the electric characteristic to detect whether a touch is input to the touch sensor 10 and/or a touch position. For example, the detection unit 10 may detect whether a touch is input for the surface of the touch sensor 10, which is formed of a two-dimensional plane consisting of a first axis and a second axis, and/or the position of the touch.

Figure 5:
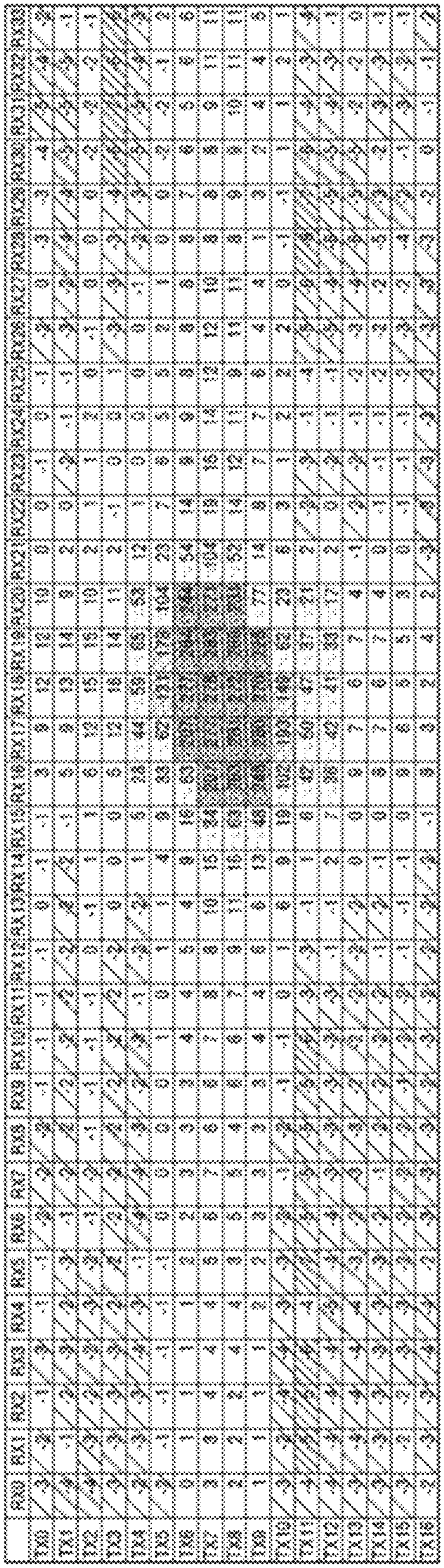

FIGS. 5 and 6 are output data for explaining why an LGM jamming signal is generated in the touch input device including the touch sensor illustrated in FIG. 2 or/and FIG. 3.

FIG. 5 illustrates data in which a detection signal output through the receiving electrodes RX0 to RX33 is converted to a digital value (or a signal level value) in the case where an object is in contact with a specific portion of a touch surface of the touch input device illustrated in FIG. 2 or FIG. 3 in a normal situation in which the touch input device is gripped, and FIG. 6 illustrates data in which a detection signal output through the receiving electrodes RX0 to RX33 is converted to a digital value (or a signal level value) in the case where an object is in contact with the specific portion of the touch surface of the touch input device illustrated in FIG. 2 or FIG. 3 in the state where the touch input device is in a floated state.

As illustrated in FIG. 5, in the normal situation, a region in which digital values having a relatively large value among the output digital values are distributed is located in the center part. However, as illustrated in FIG. 6, in the floating state, the digital values in the center part have a completely different aspect from that of FIG. 5. That is, in FIG. 6, the digital values of the center part have relatively low values. In this case, even though a user actually makes one touch (or big touch) on the touch surface of the touch input device, the touch input device may erroneously recognize that the one touch is not performed or the one touch is two or more touches. This is due to the amount of negative (−) capacitance changed by the LGM jamming signal generated by the coupling between the object and the driving electrode.

The normal situation of FIG. 5 is the situation in which the user touches the touch surface of the touch input device with his/her finger in the state where the user grips the touch input device, and the finger acts as normal ground. Further, the floating state illustrated in FIG. 6 exemplifies the situation where in the state where the touch input device is placed on the floor or a cradle (for example, a cradle inside a car), the user touches the touch surface of the touch input device with his/her finger, and the finger does not act as normal ground.

Hereinafter, the reason why the digital value (or the signal level value) output in the state where the touch input device illustrated in FIG. 6 is in the floating state is different from the digital value (or the signal level value) output in the normal situation will be described in detail with reference to FIGS. 7 to 9.

Figure 7:
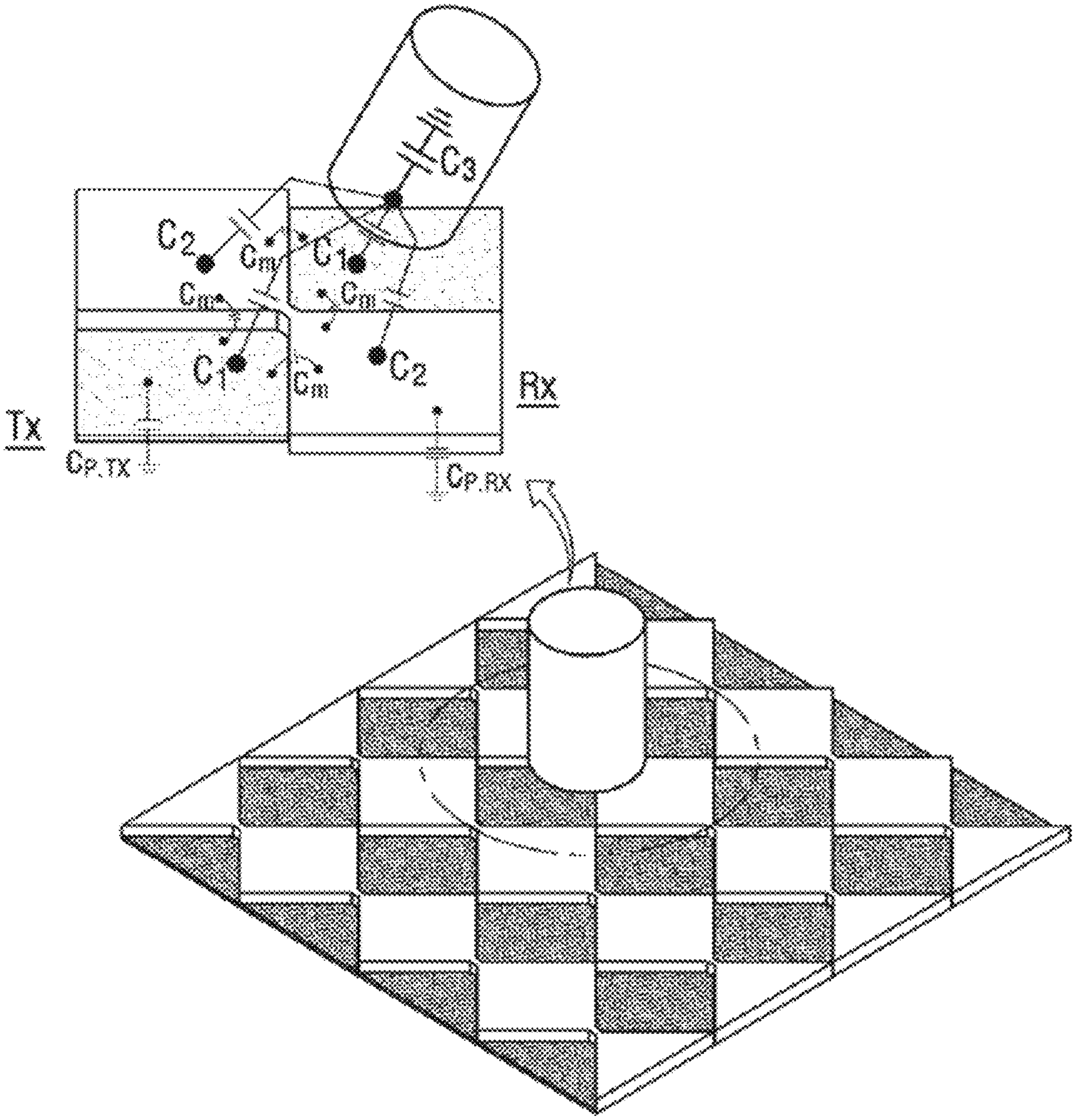
FIGS. 7 and 8 are diagrams for explaining a principle of generating an LGM jamming signal in the state where a touch input device including a touch sensor implemented with dual layers (two layers) is in a floating state.
Figure 8:
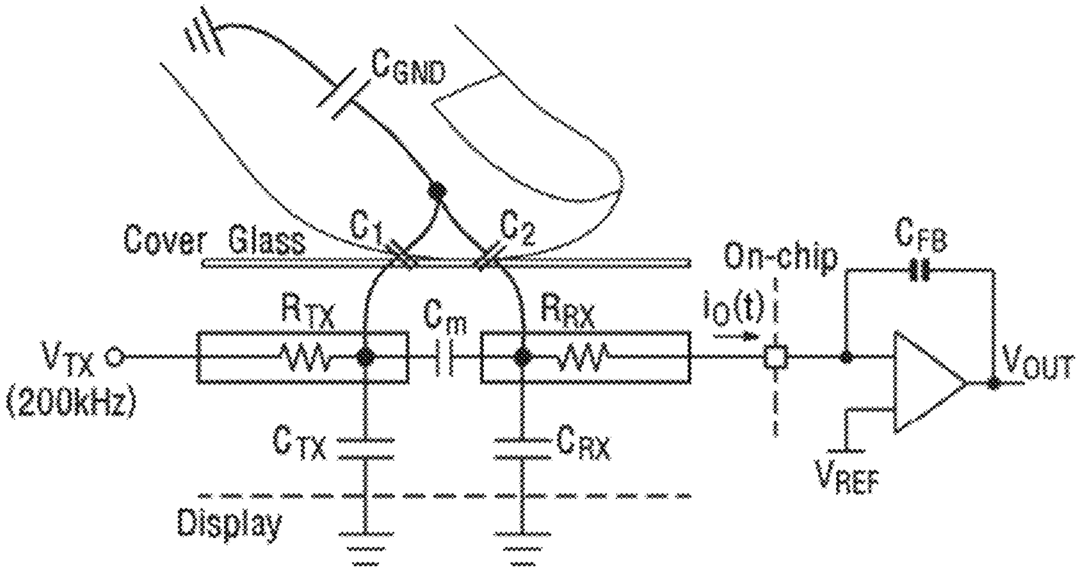

FIGS. 7 and 8 are diagrams for explaining a principle of generating an LGM jamming signal in the state where the touch input device including the touch sensor implemented with dual layers (two layers) is in the floating state. For reference, in the description below, the object may include a finger, a stylus, and the like.

Referring to FIGS. 7 and 8, in one predetermined cell region (including the plurality of driving electrodes and the plurality of receiving electrodes included in a dotted-line region), the amount of signal (hereinafter, referred to as the "LGM jamming signal") generated detected in Low Ground Mass (hereinafter, abbreviated as "LGM") is relatively increased. Accordingly, as illustrated in FIG. 6, the digital value corresponding to the finally output detection signal is decreased. In particular, in the case of the big touch (in the present invention, the big touch is defined as a case where the touch has a larger area than a touch area of the rest of the fingers, such as the touch area of the thumb), the LGM jamming signal is relatively increased.

As illustrated in FIGS. 7 and 8, the LGM jamming signal is generated by coupling capacitance (C1, C2, or CLGM) between the object and the driving electrode Tx and/or the receiving electrode Rx, in addition to mutual capacitance (ΔCm) between the driving electrode and the receiving electrode when the object touches the touch surface of the touch input device that is in the floating state.

Figure 9:
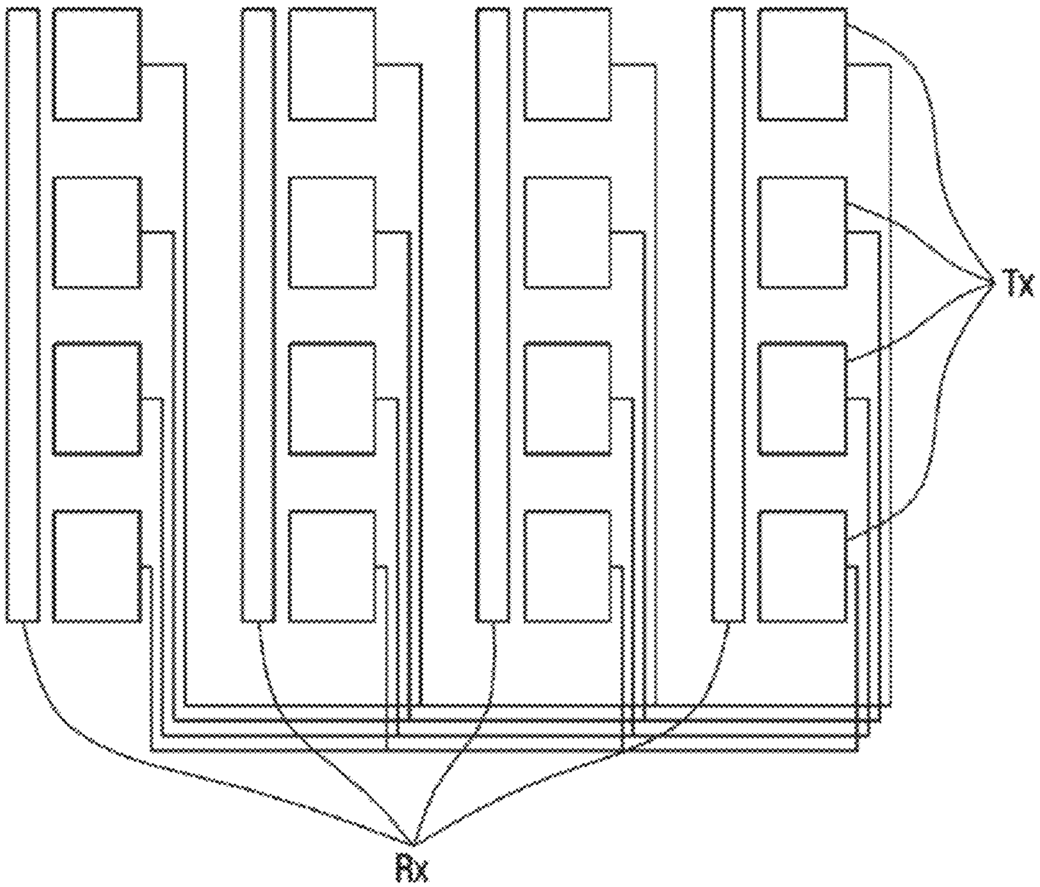
FIG. 9 is a diagram illustrating an example in which a touch sensor 10 illustrated in FIG. 1 is configured with a single layer (one layer).

FIG. 9 is a diagram illustrating an example in which the touch sensor 10 illustrated in FIG. 1 is configured with a single layer (one layer).

Referring to FIG. 9, the plurality of driving electrodes TX0 to TXm and the plurality of receiving electrodes RX0 to RXm illustrated in FIG. 1 are formed on one layer. For example, a set in which the plurality of driving electrodes Tx is disposed while being adjacent to one rectangular receiving electrode Rx may be arranged in the direction of the plurality of rows and columns. Herein, the number of driving electrodes Tx adjacent to one rectangular receiving electrode Rx may also be 4 as illustrated in the drawing, but the present invention is not limited thereto. For example, the number of driving electrodes Tx may be three, two, or five or more. Further, the driving electrode Tx and the receiving electrode Rx may be configured in reverse.

The touch input device including the touch sensor 10 having the single layer structure illustrated in FIG. 9 may exhibit different aspects according to the grip state and the floating state as illustrated in FIGS. 5 and 6. This is due to the fact that the object is placed in the LGM in the floating state.

In more particular, the driving signal applied through the specific driving electrode is input to the plurality of receiving electrodes RX that is in contact with the object through the object in the LGM state. That is, the object in the LGM state forms a current path. Accordingly, each of the receiving electrodes that is in contact with the object outputs the LGM jamming signal (−diff) having an opposite sign to that of a normal touch signal. Herein, the reason why the LGM jamming signal has the sign opposite to that of the normal touch signal is that in the normal touch signal, when the object is in contact with the receiving electrodes in the state where predetermined mutual capacitance (Cm) is formed between the driving electrode and the receiving electrode, the mutual capacitance (Cm) is decreased, but in the LGM jamming signal, the coupling capacitance is generated due to the contact of the object in the floating state, so that the LGM jamming signal and the normal touch signal have opposite signs. Accordingly, the LGM jamming signal generated in the floating state causes a decrease in the digital value (or the signal level value) corresponding to the detection signal output through each of the receiving electrodes.

Hereinafter, examples of the touch sensor in the single layer structure will be described in more detail with reference to FIGS. 10 and 12, and raw data output in the state where the touch input device including each touch sensor is in the floating state will be described.

Figure 10:
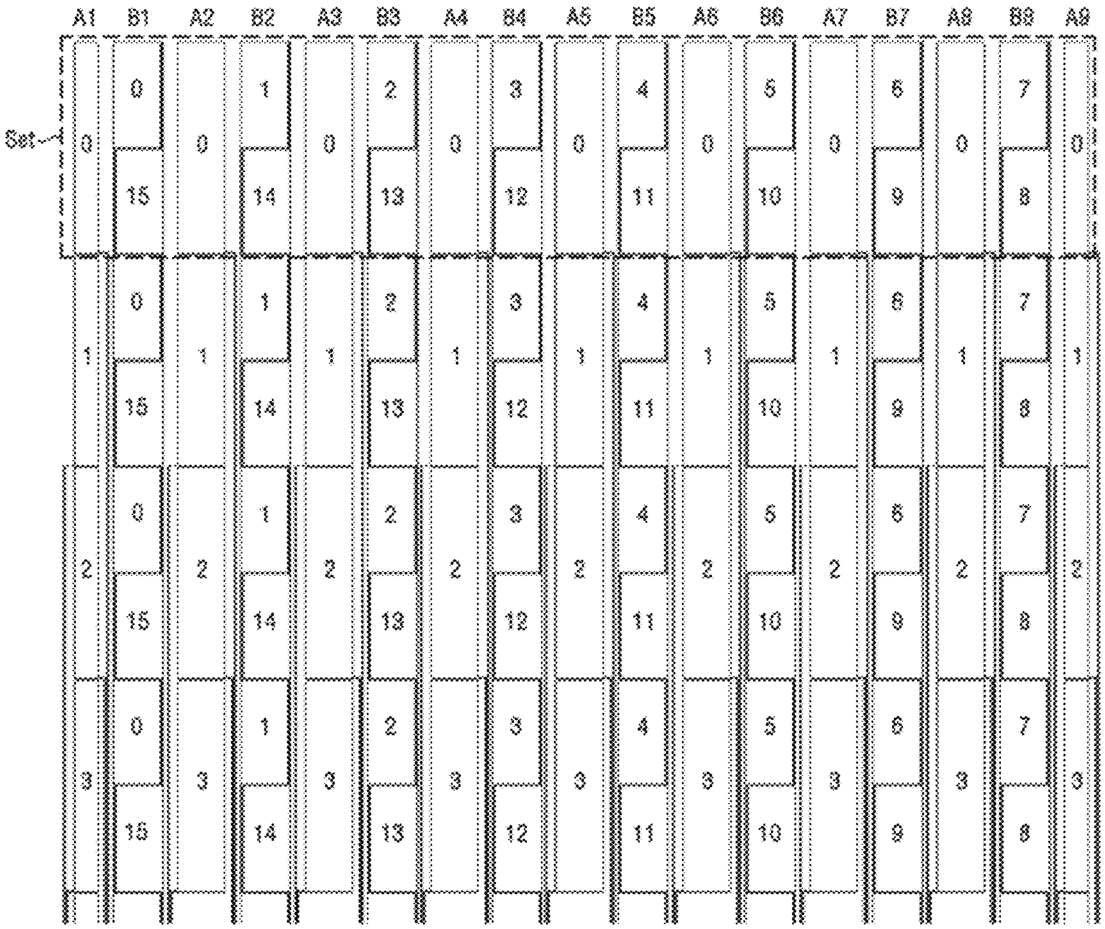
FIG. 10 is a diagram illustrating another example in which the touch sensor 10 illustrated in FIG. 1 is formed with a single layer (one layer), and is an enlarged view of only a part.

FIG. 10 is a diagram illustrating another example in which the touch sensor 10 illustrated in FIG. 1 is formed with a single layer (one layer), and is an enlarged view of only a part.

Referring to FIG. 10, the touch sensor includes the plurality of driving electrodes TX and the plurality of receiving electrodes RX. The plurality of driving electrodes TX and the plurality of receiving electrodes RX are arranged on the same layer in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO_2$) and indium oxide ($In_2O_3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor is arranged with respect to the plurality of receiving electrodes RX. Accordingly, hereinafter, the arrangement structure of the receiving electrodes RX disposed in plural in columns B1 to B8 will be first described, and then the arrangement structure of the plurality of driving electrodes TX will be described.

The plurality of receiving electrodes RX is arranged in each of the plurality of columns B1, B2, B3, B4, B5, B6, B7, and B8. Herein, the plurality of driving electrodes TX is arranged in the plurality of columns A1, A2, A3, A4, A5, A6, A7, A8, and A9 formed between the plurality of columns B1, B2, B3, B4, B5, B6, B7, and B8 in which the receiving electrodes RX are arranged, and B8, at the external side of the first column B1, and at the external side of the eighth column B8.

With respect to each receiving electrode RX of the plurality of receiving electrodes RX, the two driving electrodes TX adjacent to both sides are the same. That is, the two driving electrodes TX adjacent to both sides with respect to each receiving electrode RX have the same number. Herein, the meaning that the two driving electrodes TX are the same or that the numbers of the two driving electrodes TX are the same is that the two driving electrodes TX are electrically connected through wires.

The touch sensor includes one or more sets in which the plurality of receiving electrodes RX and the plurality of driving electrodes TX are disposed in a predetermined arrangement. The plurality of sets may be repeatedly arranged in the column direction.

One set may include the plurality of different receiving electrodes RX, and for example, one set may include 16 receiving electrodes including a 0th receiving electrode RX0 to a 15th receiving electrode RX15. The 16 receiving electrodes RX0, RX1, RX2, RX3, RX4, RX5, RX6, RX7, RX8, RX9, RX10, RX11, RX12, RX13, RX14, and RX15 may be disposed in a predetermined arrangement. The 16 receiving electrodes including the 0th receiving electrode RX0 to the 15th receiving electrode RX15 are divided and arranged in two rows consecutive in the column direction.

Accordingly, the eight receiving electrodes may be disposed in each of the two rows. The receiving electrodes numbered from 0 to 7 are arranged from left to right in the order of RX0, RX1, RX2, RX3, RX4, RX5, RX6, and RX7 in a first row, and the receiving electrodes numbered from 8 to 15 are arranged from left to right in the order of RX15, RX14, RX13, RX12, RX11, RX10, RX9, and RX8 in a second row.

In the meantime, the touch sensor includes the plurality of driving electrodes TX, and for example, the plurality of driving electrodes TX may include a 0th driving electrode TX0 to a third driving electrode TX3. Herein, each driving electrode may be disposed to satisfy the following arrangement condition.

The plurality of driving electrodes TX is arranged to satisfy the following conditions. 1) One driving electrode is disposed at each of the left side and the right side with respect to two different receiving electrodes RX0 and RX15 consecutive in the column direction. 2) Two facing driving electrodes TX0 and TX0 with respect to the two different receiving electrodes RX0 and RX15 consecutive in the column direction have the same number. 3) The driving electrodes TX arranged in the column direction have the different numbers, and the driving electrodes TX arranged in the row direction have the same number. 4) A length (horizontal length) of the driving electrodes arranged at both edges of each set may be half the length (horizontal length) of the other driving electrodes, but the present invention is not limited thereto, and the lengths may also be the same.

Figure 11B:
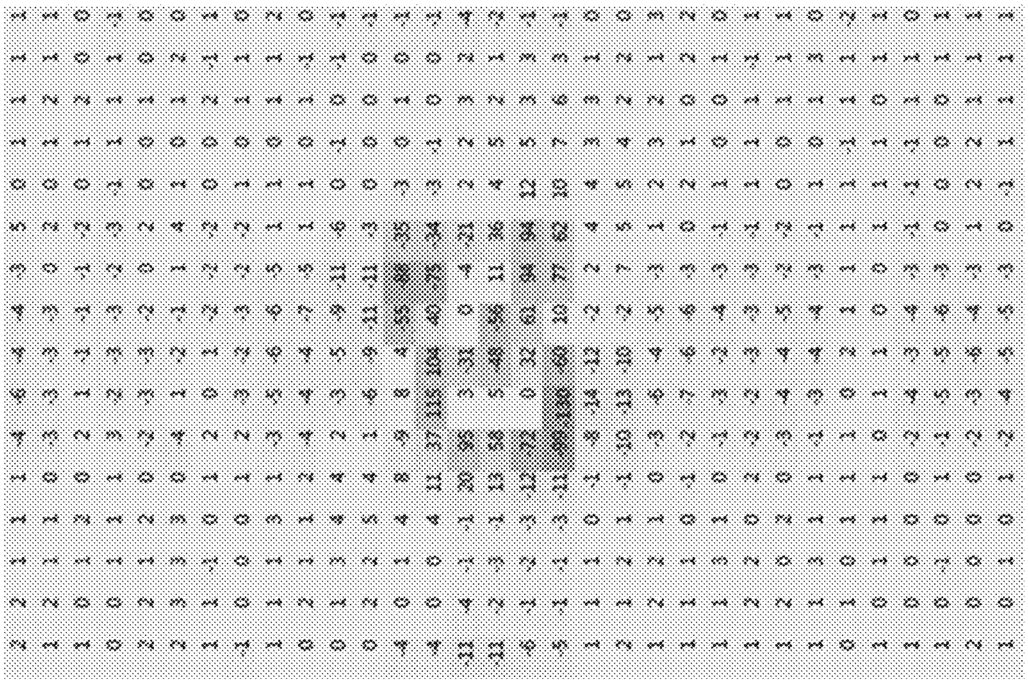
FIGS. 11A to 11B represent raw data output in a touch input device when an object, such as a thumb, is in contact with a specific portion of a touch surface of a touch input device having a structure of a touch sensor illustrated in FIG. 10.
Figure 11A:
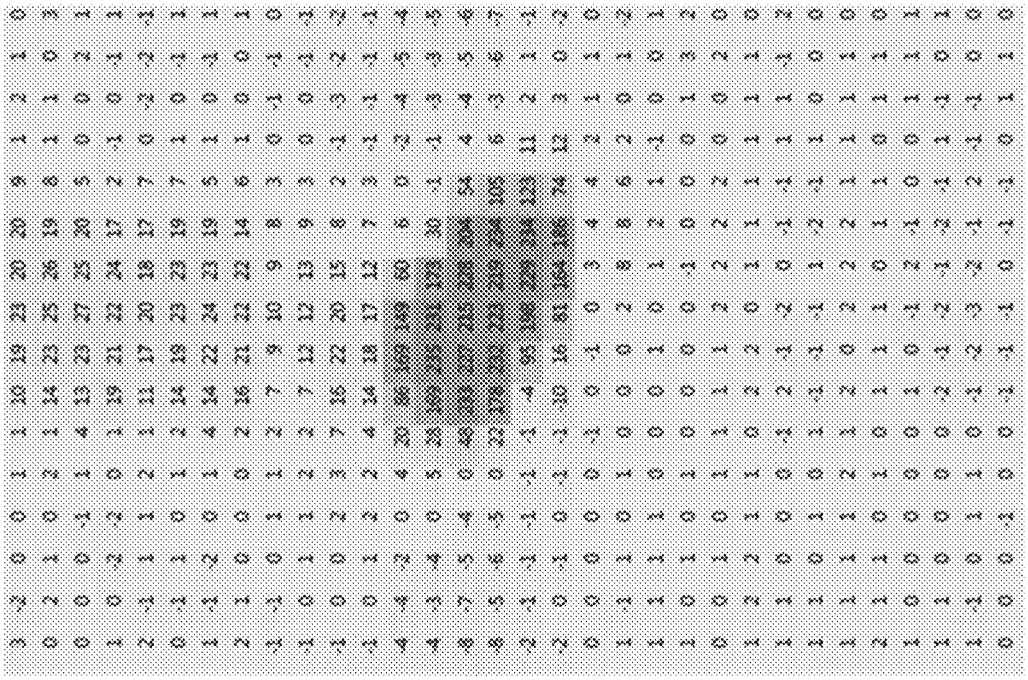

FIGS. 11A-B represent raw data output in a touch input device when an object, such as a thumb, is in contact with a specific portion of a touch surface of a touch input device having a structure of a touch sensor illustrated in FIG. 10.

In particular, FIG. 11A is raw data output in the state where the touch input device having the structure of the touch sensor illustrated in FIG. 10 is gripped, and FIG. 11B is raw data output in the state where the touch input device having the structure of the touch sensor illustrated in FIG. 10 is in a floating state.

The raw data of FIGS. 11A-B may be data derived through a following remap process. When the driving signal is sequentially applied to the plurality of driving electrodes of the touch sensor illustrated in FIG. 10, a predetermined detection signal is output from each of the plurality of receiving electrodes. The output detection signal is converted to a digital value (or signal level value) corresponding to the corresponding detection signal in the detection unit 11 illustrated in FIG. 1 and is output. Further, the detection unit 11 illustrated in FIG. 1 performs mapping so that the output digital values correspond to the respective locations of the touch surface of the touch input device. Through the mapping process, the raw data of FIGS. 11A-B may be output.

The numbers indicated in the raw data of FIGS. 11A-B may be expressed with integers, and when the corresponding integer is equal to or larger than a predetermined reference integer value (for example, +65), the touch detection unit of the touch input device may determine (or recognize) that the touch is input by the object to the part where the corresponding number is located.

Referring to FIG. 11A, in the grip state (normal situation), data values distributed in the middle part of the raw data have relatively larger integer values than other parts. In the meantime, referring to FIG. 11*i*, in the floating state, the digital values described in the middle part show a different aspect from FIG. 11A. In particular, the middle part generally includes the relatively low integer value compared to FIG. 11A, and even some parts of the middle part have negative values. This is due to the LGM jamming signal generated in the floating state, and as a result of this result, the touch input device may erroneously recognize that two touches, not one touch, are input to the middle part, and may also erroneously recognize that no touch is input in the middle part.

Figure 12:
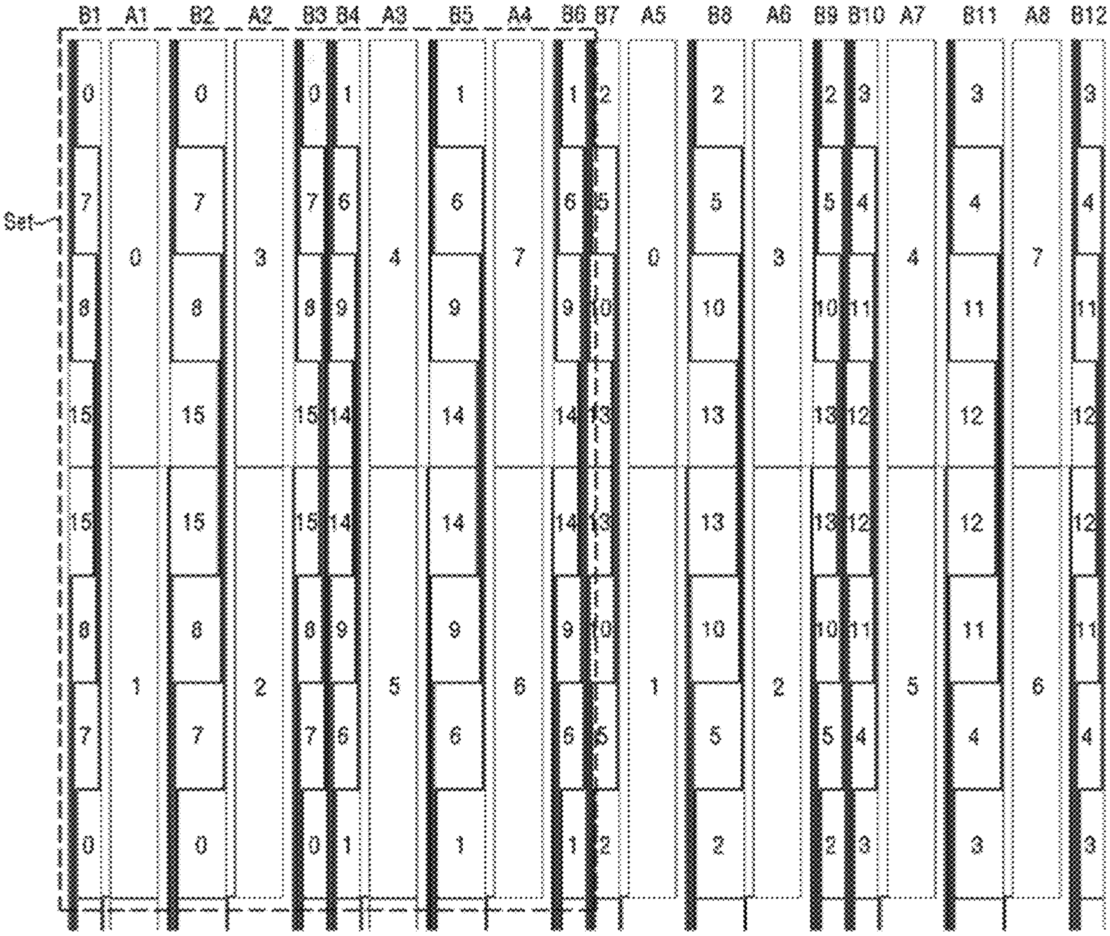
FIG. 12 is a diagram illustrating another example in which the touch sensor 10 illustrated in FIG. 1 is formed in a single layer (one layer), and is an enlarged diagram of only a part.

FIG. 12 is a diagram illustrating another example in which the touch sensor 10 illustrated in FIG. 1 is formed in a single layer (one layer), and is an enlarged diagram of only a part.

Referring to FIG. 12, the touch sensor includes the plurality of driving electrodes TX and the plurality of receiving electrodes RX. The plurality of driving electrodes TX and the plurality of receiving electrodes RX are arranged on the same layer in a matrix form.

The plurality of driving electrodes TX and the plurality of receiving electrodes RX may be made of a transparent conductive material (for example, indium tin oxide (ITO) or antimony tin oxide (ATO) made of tin oxide (SnO2) and indium oxide (In2O3)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor is arranged with respect to the plurality of receiving electrodes RX. Accordingly, the arrangement structure of the plurality of receiving electrodes RX will be described first, and the arrangement structure of the plurality of driving electrodes TX will be described.

The plurality of receiving electrodes RX is arranged in each of the plurality of columns A1, A2, A3, A4, A5, A6, A7, and A8. Herein, the plurality of driving electrodes TX is arranged in the plurality of columns B1, B2, B3, B4, B5, B6, B7, B8, B9, B10, B11, and B12 formed between the plurality of columns A1, A2, A3, A4, A5, A6, A7, and A8, in which the plurality of receiving electrodes RX is arranged, at the external side of the first column A1, and at the external side of the eighth column A8.

With respect to each receiving electrode RX of the plurality of receiving electrodes RX, the two driving electrodes TX adjacent to both sides have the same characteristic. That is, the two driving electrodes TX adjacent to both sides with respect to each receiving electrode RX have the same number. Herein, the meaning that the two driving electrodes TX are the same or that the numbers of the two driving electrodes TX are the same is that the two driving electrodes TX are electrically connected through wires.

The touch sensor includes one or more sets in which the plurality of receiving electrodes RX and the plurality of driving electrodes TX are disposed in a predetermined arrangement. The plurality of sets is repeatedly arranged in the row direction and the column direction to configure the touch sensor.

One set may include the plurality of different receiving electrodes RX, and for example, one set may include 8 receiving electrodes including a 0th receiving electrode RX0 to a seventh receiving electrode RX7. The eight receiving electrodes RX0, RX1, RX2, RX3, RX4, RX5, RX6, and RX7 may be disposed in a predetermined arrangement. The eight receiving electrodes of the 0th receiving electrode RX0 to the eighth receiving electrode RX are divided and arranged in the four columns A1, A2, A3, and A4 consecutive in the row direction. Accordingly, in each of the four columns, the two receiving electrodes may be disposed from top to bottom.

The plurality of receiving electrodes having the consecutive numbers is disposed in each column. Herein, the arrangement order of the odd-numbered columns A1 and A3 and the arrangement order of the even-numbered columns A2 and A4 may be opposite to each other. For example, the receiving electrodes RX0 and RX1 having the consecutive numbers are sequentially arranged from top to bottom in the first column A1, the receiving electrodes RX2 and RX3 having the consecutive numbers are sequentially arranged from bottom to top in the second column A2, the receiving electrodes RX4 and RX5 having the consecutive numbers are sequentially arranged from top to bottom in the third column A3, and the receiving electrodes RX6 and RX7 having the consecutive numbers are sequentially arranged from bottom to top in the fourth column A4. Herein, although not illustrated in the drawing, the plurality of different receiving electrodes included in one set may not be sequentially arranged in the row or column direction, but may be arranged randomly.

In the meantime, the touch sensor includes the plurality of driving electrodes TX, and for example, the plurality of driving electrodes TX may include a 0th driving electrode TX0 to a fifteenth driving electrode TX15. Herein, each driving electrode may be disposed to satisfy the following arrangement condition.

The plurality of driving electrodes TX is arranged to satisfy the following conditions. 1) With respect to one receiving electrode RX, four different driving electrodes are arranged at the left side, and four different driving electrodes are arranged at the right side. 2) With respect to each receiving electrode RX, two facing driving electrodes TX have the same number. 3) Three driving electrodes having the same number are consecutively arranged in the row direction. 4) Eight driving electrodes adjacent to the receiving electrode RX1 in the even-numbered row are arranged to be symmetric to eight driving electrodes adjacent to the receiving electrode RX0 in the odd-numbered row. 5) A length (horizontal length) of the driving electrodes TX arranged at both edges of each set and the driving electrodes arranged at the center of each set is half the length (horizontal length) of the other driving electrodes.

FIG. 13 represents raw data when an object, such as a thumb, is in contact with a specific portion of the touch surface of the touch input device having the structure of the touch sensor illustrated in FIG. 12. In particular, FIG. 13 represents raw data in the state where the touch input device having the structure of the touch sensor illustrated in FIG. 12 is in a floating state.

Referring to FIG. 13, it is confirmed that in the floating state, digital values (or level values) output in a specific part of the raw data have relatively larger integer values than other parts.

When the raw data illustrated in FIG. 13 is compared with the raw data illustrated in FIG. 11B, it can be seen that in the floating state, the structure of the touch sensor illustrated in FIG. 12 has a more LGM improvement effect than the structure of the touch sensor illustrated in FIG. 10.

Figure 14:
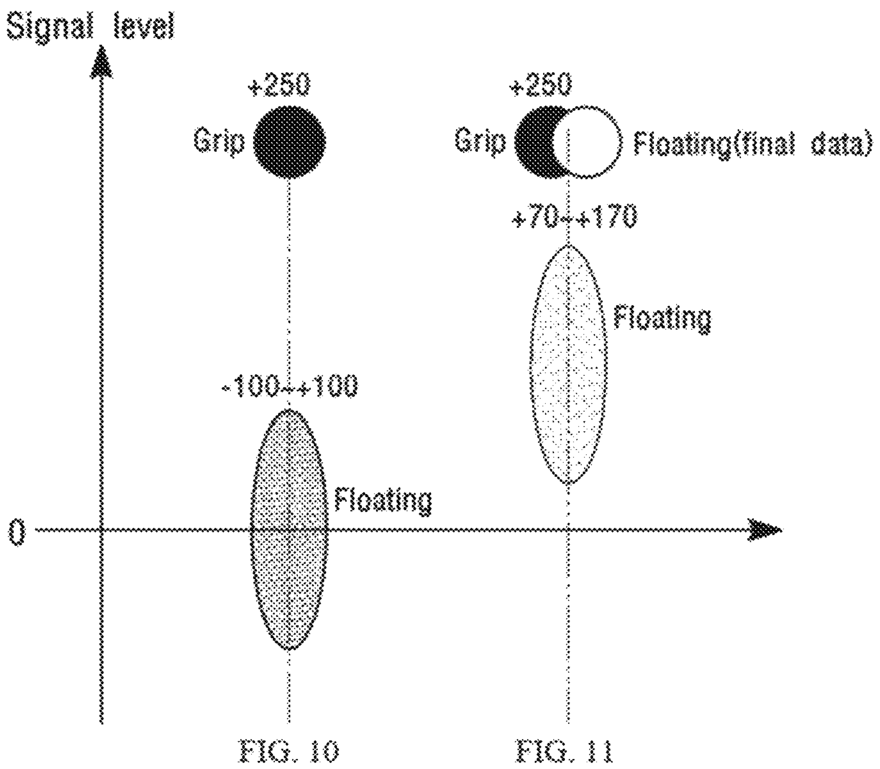
FIG. 14 is a graph representing a rough comparison of LGM performance between the touch sensors illustrated in FIGS. 10 and 12.

FIG. 14 is a graph representing a rough comparison of LGM performance between the touch sensors illustrated in FIGS. 10 and 12.

Referring to FIG. 14, in the touch sensor illustrated in FIG. 10, in the grip state, the relatively large level values among the level values in the touch area have values of about +250, but in the floating state, the relatively large values have values between −100 to +100.

In the meantime, the touch sensor illustrated in FIG. 12, in the grip state, the relatively large level values among the level values in the touch area have level values of about +250, but in the floating state, the relatively large values have values between +70 to +170.

According to the graph of FIG. 14, the touch input device including the touch sensor illustrated in FIG. 10 is difficult to accurately recognize whether a touch is input and a touch position in the floating state, but in the touch input device including the touch sensor illustrated in FIG. 12, the relatively large level values are +70 or more even in the floating state, so that the touch input device does not have a problem in recognizing whether a touch is input and a touch position. However, the output of the relatively large level values (+250) like the grip state or the output of the values similar to the relatively large level values (+250) in the grip state even in the floating state is very important for the touch input device to accurately recognize whether a touch is input and/or a touch position.

Hereinafter, the touch sensor capable of outputting (floating (final data)) a signal level value output in a floating state of the touch input devices including the touch sensor of FIGS. 9 and 10 and the touch sensor of the dual layers (two layers) illustrated in FIGS. 2 and 3, as well as the touch sensor (one layer) of FIG. 12 to be the same as or similar to a signal level value output in a grip state of the touch input device, and the touch input devices including the same will be described with reference to the drawings in detail.

The touch sensor of the single layer structure or the dual-layer structure may also be applied to any one of FIGS. 4A-E. That is, the method to be described below may be applied to the touch sensors having all currently known structures and touch input devices including the same. Further, although not illustrated in a separate drawing, one of the plurality of driving electrodes and the plurality of receiving electrodes in the touch sensor of the dual-layer structure may be disposed between the touch surface and the display panel, and the other one may be disposed inside the display panel.

Further, the exemplary embodiment of the present invention is not applied only to the touch input devices including the touch sensors illustrated in FIGS. 2, 3, 9, 10, and 12, and may also be applied to the touch input device including the touch sensor of another single layer structure or dual-layer structure which is not illustrated in the present specification. As another specific example, the exemplary embodiment of the present invention may also be applied to the touch input devices including the touch sensor illustrated in FIGS. 15 and 16.

Figure 15:
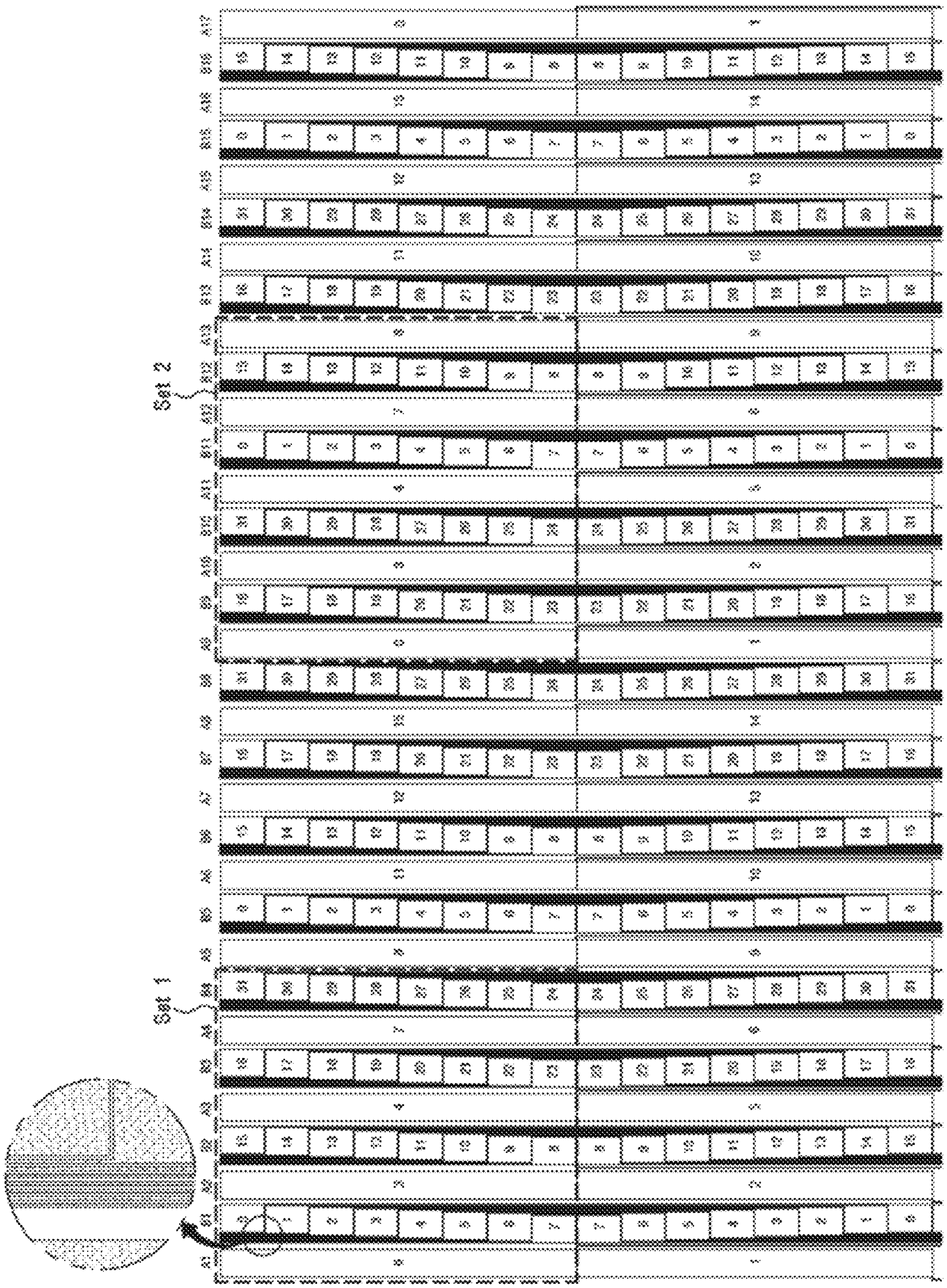
FIG. 15 is a diagram illustrating another example in which the touch sensor 10 illustrated in FIG. 1 is formed in a single layer (one layer), and is an enlarged diagram of only a part.

FIG. 15 is a diagram illustrating another example in which the touch sensor 10 illustrated in FIG. 1 is formed in a single layer (one layer), and is an enlarged diagram of only a part.

Referring to FIG. 15, the touch sensor according to the exemplary embodiment includes the plurality of driving electrodes TX and the plurality of receiving electrodes RX. The plurality of driving electrodes TX and the plurality of receiving electrodes RX are arranged in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO_2$) and indium oxide ($In_2O_3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor according to the exemplary embodiment is arranged with respect to the plurality of driving electrodes TX. Accordingly, hereinafter, the arrangement structure of the driving electrodes TX disposed in columns B1 to B16 will be first described, and then the arrangement structure of the plurality of receiving electrodes RX will be described.

The plurality of driving electrodes TX is arranged in each of the plurality of columns B1, B2, B3, B4, B5, B6, B7, B8, B9, B10, B11, B12, B13, B14, B15, and B16. Herein, the plurality of receiving electrodes RX is arranged in the plurality of columns A1, A2, A3, A4, A5, A6, A7, A8, A9, A10, A11, A12, A13, A14, A15, A16 formed between the plurality of columns B1, B2, B3, B4, B5, B6, B7, B8, B9, B10, B11, B12, B13, B14, B15, and B16, in which the driving electrodes TX is arranged, at the external side of the first column B1, and at the external side of the 16th column B16.

With respect to each driving electrode TX of the plurality of driving electrodes TX, the two receiving electrodes RX adjacent to both sides have the different characteristic. That is, the two receiving electrodes RX adjacent to both sides with respect to each driving electrode TX have the different number. Herein, the meaning that the two receiving electrodes RX are different or the two receiving electrodes RX have different numbers is that the receiving electrodes are not electrically connected through wires.

The plurality of driving electrodes TX includes a first set, set 1 in which 32 driving electrodes including the 0th driving electrode TX0 to the 31st driving electrode TX31 are disposed in a first arrangement, and a second set, set 2 in which the 32 driving electrodes including the 0th driving electrode TX0 to the 31st driving electrode TX31 are disposed in a second arrangement.

The first set, set 1 may be provided with two consecutively in the row direction and two in the column direction, and the first set, set 1 located in the even-numbered row may be symmetric to the first set, set 1 located in the odd-numbered row.

The second set, set 2 may be provided with two consecutively in the row direction and two in the column direction, and the second set, set 2 located in the even-numbered row may be symmetric to the second set, set 2 located in the odd-numbered row.

Further, the plurality of second sets may be disposed at one side of the plurality of first sets.

In the first arrangement of the first set, set 1, the 32 driving electrodes including the 0th driving electrode TX0 to the 31st driving electrode TX31 are divided and arranged in four columns consecutively in the row direction, and in the first column, the driving electrodes numbered from 0 to 7 are arranged from top to bottom in the order of TX0, TX1, TX2, TX3, TX4, TX5, TX6, and TX7, in the second column, the driving electrodes numbered from 8 to 15 are arranged from top to bottom in the order of TX15, TX14, TX13, TX12, TX11, TX10, TX9, and TX8, in the third column, the driving electrodes numbered from 16 to 23 are arranged from top to bottom in the order of TX16, TX17, TX18, TX19, TX20, TX21, TX22, and TX23, and in the fourth column, the driving electrodes numbered from 24 to 31 are arranged from top to bottom in the order of TX31, TX30, TX29, TX28, TX27, TX26, TX25, and TX24.

In the second arrangement of the second set, set 2, the 32 driving electrodes including the 0th driving electrode TX0 to the 31st driving electrode TX31 are divided and arranged in four columns consecutively in the row direction, and in the first column, the driving electrodes numbered from 16 to 23 are arranged from top to bottom in the order of TX16, TX17, TX18, TX19, TX20, TX21, TX22, and TX23, in the second column, the driving electrodes numbered from 24 to 31 are arranged from top to bottom in the order of TX31, TX30, TX29, TX28, TX27, TX26, TX25, and TX24, in the third column, the driving electrodes numbered from 0 to 7 are arranged from top to bottom in the order of TX0, TX1, TX2, TX3, TX4, TX5, TX6, and TX7, and in the fourth column, the driving electrodes numbered from 8 to 15 are arranged from top to bottom in the order of TX15, TX14, TX13, TX12, TX11, TX10, TX9, and TX8.

In the meantime, the touch sensor according to the exemplary embodiment includes the plurality of receiving electrodes RX, and for example, the plurality of receiving electrodes RX may include a 0th receiving electrode RX0 to a 15th receiving electrode RX15. Herein, each receiving electrode may be disposed so as to satisfy the following arrangement condition.

The plurality of receiving electrodes RX are disposed so as to satisfy the following conditions. 1) With respect to the eight different driving electrodes TX consecutive in the column direction, one receiving electrode is disposed at the left side and one receiving electrode is disposed at the right side. 2) With respect to the eight different driving electrodes TX consecutive in the column direction, two facing receiving electrodes RX have different numbers. 3) Two different receiving electrodes RX are arranged in the column direction, and eight different receiving electrodes RX are repeatedly arranged in the row direction. 4) A length (horizontal length) of the receiving electrodes arranged at both edges in the column direction may be the same as the length (horizontal length) of the other receiving electrodes, but is not limited thereto, and a length (horizontal length) of the receiving electrodes arranged at both edges in the column direction may be half the length (horizontal length) of the other receiving electrodes.

Figure 16:
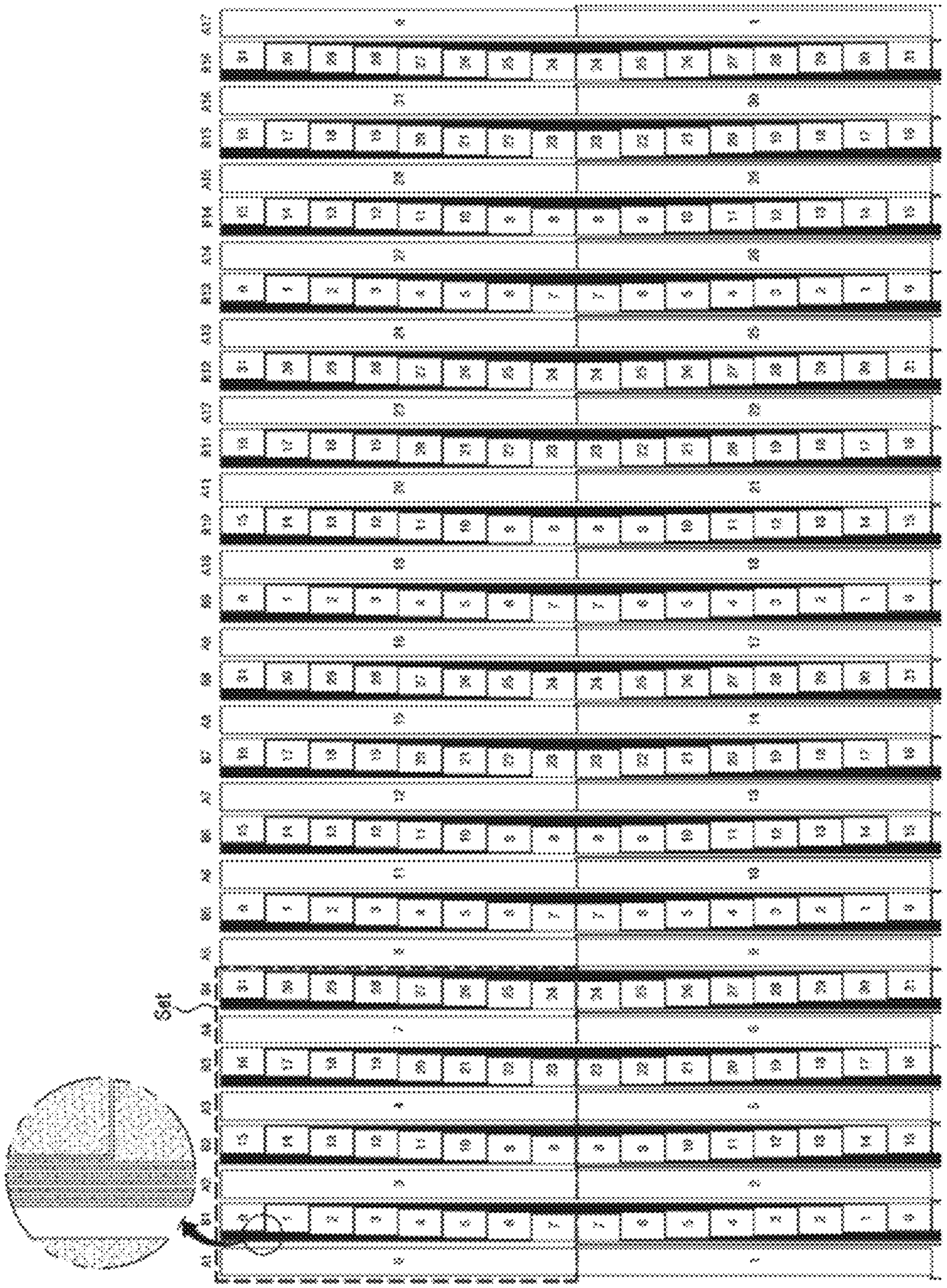
FIG. 16 is a diagram illustrating another example in which the touch sensor 10 illustrated in FIG. 1 is formed in a single layer (one layer), and is an enlarged diagram of only a part.

FIG. 16 is a diagram illustrating another example in which the touch sensor 10 illustrated in FIG. 1 is formed in a single layer (one layer), and is an enlarged diagram of only a part.

Referring to FIG. 16, the touch sensor according to the exemplary embodiment includes the plurality of driving electrodes TX and the plurality of receiving electrodes RX. The plurality of driving electrodes TX and the plurality of receiving electrodes RX are arranged in a matrix form.

The plurality of driving electrodes TX and the plurality of receiving electrodes RX may be made of a transparent conductive material (for example, indium tin oxide (ITO) or antimony tin oxide (ATO) made of tin oxide ($SnO2$) and indium oxide ($In2O3$)) and the like. However, this is merely an example, and the driving electrode TX and the receiving electrode RX may also be formed of other transparent conductive materials or an opaque conductive material. For example, the driving electrode TX and the receiving electrode RX may include at least one of silver ink, copper, nano silver, and carbon nanotube (CNT).

Further, the driving electrode TX and the receiving electrode RX may be implemented with a metal mesh. When the driving electrode TX and the receiving electrode RX are implemented with the metal mesh, the wires connected to the driving electrode TX and the receiving electrode RX may also be implemented with the metal mesh, and the driving electrode TX and the receiving electrode RX and the wires may also be integrally implemented with the metal mesh. When the driving electrode TX, the receiving electrode RX, and the wires are integrally implemented with the metal mesh, a dead zone, such as a space between the electrode and the wire and/or a space between the electrode and another electrode, in which a touch position is not detected, is reduced, so that sensitivity of detecting a touch position may be further improved.

The touch sensor according to the exemplary embodiment is arranged with respect to the plurality of driving electrodes TX. Accordingly, hereinafter, the arrangement structure of the driving electrodes TX disposed in columns B1 to B16 will be first described, and then the arrangement structure of the plurality of receiving electrodes RX will be described.

The plurality of driving electrodes TX is arranged in each of the plurality of columns B1, B2, B3, B4, B5, B6, B7, B8, B9, B10, B11, B12, B13, B14, B15, and B16. Herein, the plurality of receiving electrodes RX is arranged in the plurality of columns A1, A2, A3, A4, A5, A6, A7, A8, A9, A10, A11, A12, A13, A14, A15, A16 formed between the plurality of columns B1, B2, B3, B4, B5, B6, B7, B8, B9, B10, B11, B12, B13, B14, B15, and B16, in which the driving electrodes TX is arranged, at the external side of the first column B1, and at the external side of the 16th column B16.

With respect to each driving electrode TX of the plurality of driving electrodes TX, the two receiving electrodes RX adjacent to both sides have the different characteristic. That is, the two receiving electrodes RX adjacent to both sides with respect to each driving electrode TX have the different number. Herein, the meaning that the two receiving electrodes RX are different or the two receiving electrodes RX have different numbers is that the receiving electrodes are not electrically connected through wires.

The plurality of driving electrodes TX includes a set in which 32 driving electrodes including a 0th driving electrode TX0 to a 31st driving electrode TX31 are disposed in a first arrangement. Herein, the set may be repeatedly arranged in plural in the row direction and the column direction. The set located in the even-numbered row may be symmetric to the set located in the odd-numbered row.

In the first arrangement of the first set, set 1, the 32 driving electrodes including the 0th driving electrode TX0 to the 31st driving electrode TX31 are arranged in four columns consecutively in the row direction, and in the first column, the driving electrodes numbered from 0 to 7 are arranged from top to bottom in the order of TX0, TX1, TX2, TX3, TX4, TX5, TX6, and TX7, in the second column, the driving electrodes numbered from 8 to 15 are arranged from top to bottom in the order of TX15, TX14, TX13, TX12, TX11, TX10, TX9, and TX8, in the third column, the driving electrodes numbered from 16 to 23 are arranged from top to bottom in the order of TX16, TX17, TX18, TX19, TX20, TX21, TX22, and TX23, and in the fourth column, the driving electrodes numbered from 24 to 31 are arranged from top to bottom in the order of TX31, TX30, TX29, TX28, TX27, TX26, TX25, and TX24.

In the meantime, the touch sensor according to the exemplary embodiment includes the plurality of receiving electrodes RX, and for example, the plurality of receiving electrodes RX may include a 0th receiving electrode RX0 to a 31st receiving electrode RX31. Herein, each receiving electrode may be disposed so as to satisfy the following condition.

The plurality of receiving electrodes RX are disposed so as to satisfy the following arrangement condition. 1) With respect to the eight different driving electrodes TX consecutive in the column direction, one receiving electrode is disposed at the left side and one receiving electrode is disposed at the right side. 2) With respect to the eight different driving electrodes TX consecutive in the column direction, two facing receiving electrodes RX have different numbers. 3) Two different receiving electrodes are arranged in the column direction, and 16 different receiving electrodes are repeatedly arranged in the row direction. 4) A length (horizontal length) of the receiving electrodes arranged at both edges in the column direction may be the same as the length (horizontal length) of the other receiving electrodes, but is not limited thereto, and a length (horizontal length) of the receiving electrodes arranged at both edges in the column direction may be half the length (horizontal length) of the other receiving electrodes.

Figure 17:
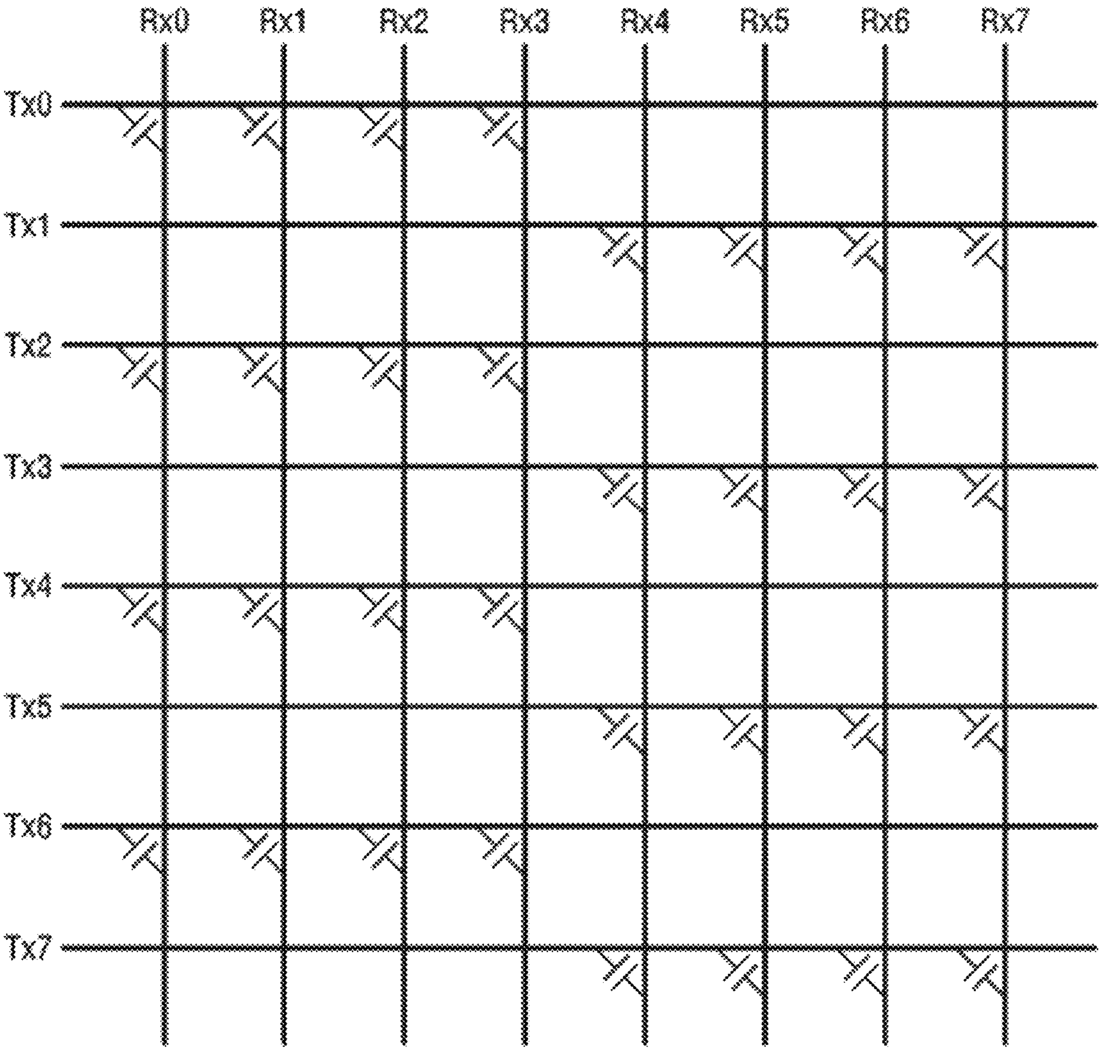
FIG. 17 is one exemplary conceptual diagram in which a touch sensor according to an exemplary embodiment of the present invention is conceptualized.

FIG. 17 is one exemplary conceptual diagram in which the touch sensor according to the exemplary embodiment of the present invention is conceptualized.

Referring to FIG. 17, the touch sensor according to the exemplary embodiment of the present invention includes the plurality of driving electrodes TX0 to TX7 and the plurality of receiving electrodes RX0 to RX7. Herein, the plurality of driving electrodes TX0 to TX7 and the plurality of receiving electrodes RX0 to RX7 may be formed on the single layer as illustrated in FIG. 10 or 12, and may be formed on the dual layers as illustrated in FIG. 2 or 3.

The touch sensor according to the exemplary embodiment of the present invention including the plurality of driving electrodes TX0 to TX7 and the plurality of receiving electrodes RX0 to RX7 includes nodes that form mutual capacitance (Cm) between the plurality of driving electrodes TX0 to TX7 and the plurality of receiving electrodes RX0 to RX7 and nodes that do not form mutual capacitance (Cm).

For example, in FIG. 17, the nodes that form mutual capacitance (Cm) are (Tx0, Rx0), (Tx0, Rx1), (Tx0, Rx2), (Tx0, Rx3), (Tx1, Rx4), (Tx1, Rx5), (Tx1, Rx6), (Tx1, Rx7), (Tx2, Rx0), (Tx2, Rx1), (Tx2, Rx2), (Tx2, Rx3), (Tx3, Rx4), (Tx3, Rx5), (Tx3, Rx6), (Tx3, Rx7), (Tx4, Rx0), (Tx4, Rx1), (Tx4, Rx2), (Tx4, Rx3), (Tx5, Rx4), (Tx5, Rx5), (Tx5, Rx6), (Tx5, Rx7), (Tx6, Rx0), (Tx6, Rx1), (Tx6, Rx2), (Tx6, Rx3), (Tx7, Rx4), (Tx7, Rx5), (Tx7, Rx6), and (Tx7, Rx7).

The respective receiving electrodes Rx of the nodes that form mutual capacitance (Cm) may be named as active receiving electrodes Rx.

The detection signal output from the receiving electrode Rx of each of the nodes that form mutual capacitance (Cm) include noise information, as well as information about the amount of capacitance changed by a touch of the object. Herein, the noise information includes display noise (for example, Zebra noise) information, information about the amount of change according to the change in an image displayed on the display panel, and information on the amount of negative (−) capacitance changed by an LGM jamming signal generated in a floating state. Accordingly, when the detection signals received from the respective receiving electrodes RX of the nodes that form mutual capacitance (Cm) are converted into predetermined level values and output, the information on the amount of mutual capacitance changed and the noise information are reflected to the output level value.

In the meantime, in FIG. 17, the nodes that do not form mutual capacitance (Cm) are Tx0, Rx4), (Tx0, Rx5), (Tx0, Rx6), (Tx0, Rx7), (Tx1, Rx0), (Tx1, Rx1), (Tx1, Rx2), (Tx1, Rx3), (Tx2, Rx4), (Tx2, Rx5), (Tx2, Rx6), (Tx2, Rx7), (Tx3, Rx0), (Tx3, Rx1), (Tx3, Rx2), (Tx3, Rx3), (Tx4, Rx4), (Tx4, Rx5), (Tx4, Rx6), (Tx4, Rx7), (Tx5, Rx0), (Tx5, Rx1), (Tx5, Rx2), (Tx5, Rx3), (Tx6, Rx4), (Tx6, Rx5), (Tx6, Rx6), (Tx6, Rx7), (Tx7, Rx0), (Tx7, Rx1), (Tx7, Rx2), and (Tx7, Rx3).

The respective receiving electrodes Rx of the nodes that do form mutual capacitance (Cm) may be named as dummy receiving electrodes Rx. The dummy receiving electrode may be the configuration independently of the plurality of receiving electrodes within the touch sensor, and some receiving electrodes among the plurality of receiving electrodes may also be used as the dummy receiving electrodes in a specific situation and condition.

The detection signal output from the receiving electrode RX of each of the nodes that do form mutual capacitance (Cm) does not include information about the amount of capacitance changed by a touch of the object, but includes only noise information.

Accordingly, the touch input device according to the exemplary embodiment of the present invention including the touch sensor may remove the noise information and obtain the information on the amount of capacitance changed by the touch of the object by subtracting a detection signal (a second signal) output from the receiving electrode Rx of each of the nodes that do not form mutual capacitance (Cm) from a detection signal (a first signal) output from the receiving electrode Rx of each of the nodes that form mutual capacitance (Cm). A digital value (or a signal level value) corresponding to a final detection signal obtained by subtracting, by the touch input device, the detection signal output from the receiving electrode Rx of each of the nodes that do not form mutual capacitance (Cm) from the detection signal output from the receiving electrode Rx of each of the nodes that form mutual capacitance (Cm) is the value based on the information on the amount of capacitance changed by the touch of the object. As a result, even though the touch input device is in the floating state, the digital value that is the same as or almost similar to the digital value output from the state where the touch input device is in the grip state may be output.

Herein, more preferably, the touch input device according to the exemplary embodiment of the present invention may subtract a value obtained by multiplying a detection signal (a second detection signal) output from the receiving electrode Rx of each of the nodes that do not form mutual capacitance (Cm) and a predetermined factor from a detection signal (a first detection signal) output from the receiving electrode Rx of each of the nodes that form mutual capacitance (Cm). The reason why the factor is multiplied with the second detection signal is to compensate for a change in a size of the detection signal incurable due to the difference in the configuration between an active channel and a dummy channel. For example, the factor may have a predetermined value, such as 0.8, but is not limited thereto, and the value of the factor may be changed depending on a design.

Hereinafter, a particular example will be described with reference to FIGS. 18 to 24.

Figure 18:
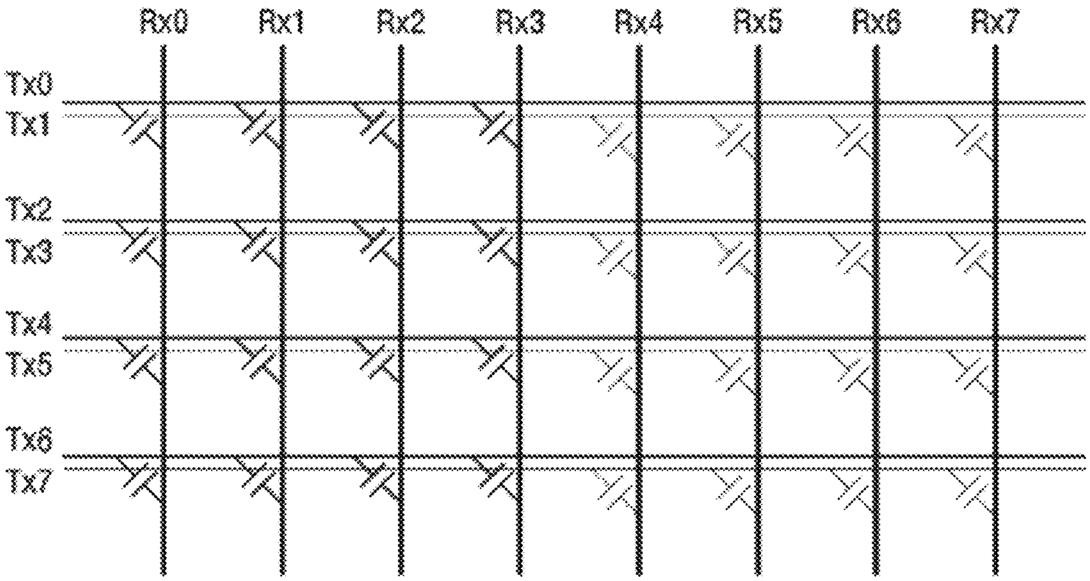
FIG. 18 is a conceptual diagram in which a touch sensor according to an exemplary embodiment of the present invention illustrated in FIG. 12 is conceptualized.

FIG. 18 is a conceptual diagram in which a touch sensor according to an exemplary embodiment of the present invention illustrated in FIG. 12 is conceptualized.

Referring to FIGS. 18, the touch sensor according to the exemplary embodiment of the present invention includes the plurality of driving electrodes TX0 to TX7 and the plurality of receiving electrodes RX0 to RX7. At least a part of the plurality of receiving electrodes RX0 to RX7 is used as dummy receiving electrodes Rx. Herein, the receiving electrodes among the plurality of receiving electrodes RX0 to RX7 used as the dummy receiving electrodes are determined according to the driving electrode to which the driving signal is applied.

For example, when the driving signal is applied to the 0th driving electrode TX0, the fourth receiving electrode Rx4, the fifth receiving electrode Rx5, the sixth receiving electrode Rx6, and the seventh receiving electrode Rx7 among the plurality of receiving electrodes Rx0 to Rx7 are used as the dummy receiving electrodes. That is, when the driving signal is applied to the 0th driving electrode TX0, the fourth, fifth, sixth, and seventh receiving electrodes Rx4, Rx5, Rx6, and Rx7 are the receiving electrodes that do not form the mutual capacitance (Cm) with the 0th driving electrode Tx0, and the 0th, first, second, and third receiving electrodes Rx0, Rx1, Rx2, and Rx3 are the receiving electrodes that form the mutual capacitance (Cm) with the 0th driving electrode Tx0.

When the driving signal is applied to the first driving electrode Tx1, the fourth, fifth, sixth, and seventh receiving electrodes Rx4, Rx5, Rx6, and Rx7 are the receiving electrodes that form the mutual capacitance (Cm) with the first driving electrode Tx1, and the 0th, first, second, and third receiving electrodes Rx0, Rx1, Rx2, and Rx3 are the receiving electrodes that do not form the mutual capacitance (Cm) with the first driving electrode Tx1.

The touch input device according to the exemplary embodiment of the present invention including the touch sensor may remove the noise information, particularly, the information on the amount of negative (−) capacitance changed by the LGM jamming signal by subtracting a detection signal output from the receiving electrode Rx of each of the nodes that do not form mutual capacitance (Cm) from a detection signal output from the receiving electrode Rx of each of the nodes that form mutual capacitance (Cm). Herein, the touch input device according to the exemplary embodiment of the present invention including the touch sensor may subtract a value obtained by multiplying a detection signal output from the receiving electrode Rx of each of the nodes that do not form mutual capacitance (Cm) and a predetermined factor from a detection signal output from the receiving electrode Rx of each of the nodes that form mutual capacitance (Cm).

Figure 19:
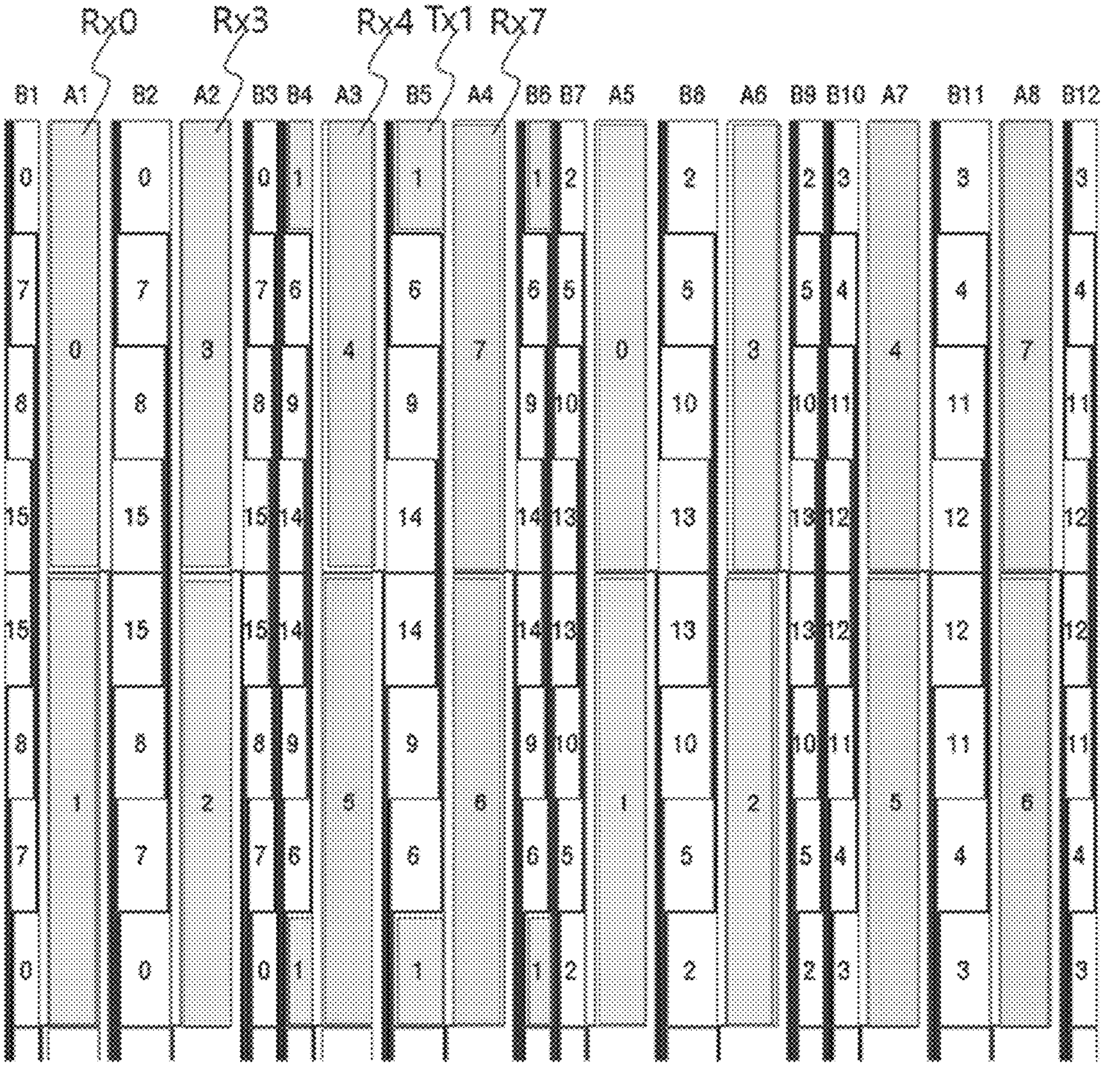
FIG. 19 is a diagram illustrating an example for describing electrodes used as dummy receiving electrodes among a plurality of receiving electrodes of the touch sensor illustrated in FIG. 12.

FIG. 19 is a diagram illustrating an example for describing electrodes used as dummy receiving electrodes among the plurality of receiving electrodes of the touch sensor illustrated in FIG. 12.

Referring to FIG. 19, when the driving signal is applied to the first driving electrode Tx1, the fourth, fifth, sixth, and seventh receiving electrodes Rx4, Rx5, Rx6, and Rx7 are the receiving electrodes Active Rx that form the mutual capacitance (Cm) with the first driving electrode Tx1, and the 0th, first, second, and third receiving electrodes Rx0, Rx1, Rx2, and Rx3 are the dummy receiving electrodes Dummy Rx that do not form the mutual capacitance (Cm) with the first driving electrode Tx1.

The detection signals output from the active receiving electrodes Rx4, Rx5, Rx6, Rx7 include noise information, as well as the information on the amount of capacitance changed by the touch of the object. Herein, the noise information includes display noise (for example, Zebra noise), information about the amount of change according to the change in an image displayed on the display panel, and information on the amount of negative (−) capacitance changed by an LGM jamming signal generated in a floating state. Accordingly, when the touch detection unit of the touch input device converts the detection signals output from the active receiving electrodes Rx4, Rx5, Rx6, and Rx7 into predetermined level values and outputs the converted level value, the information on the amount of mutual capacitance changed and the noise information are reflected to the output level value.

On the other hand, the detection signal output from the dummy receiving electrodes Rx0, Rx1, Rx2, and Rx3 includes little information on the amount of capacitance changed by the touch of the object, but includes only the noise information.

Figure 20C:
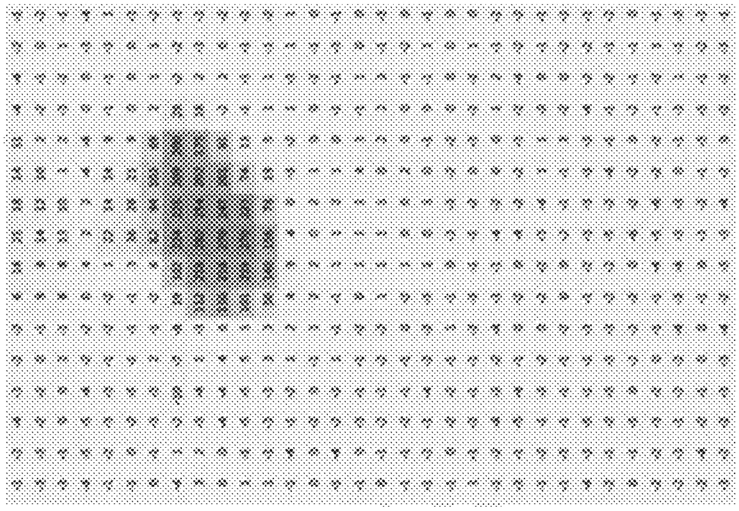
FIGS. 20A to 20C are diagrams illustrating an example of raw data output in a touch input device including a touch sensor according to an exemplary embodiment of the present invention illustrated in FIG. 12.
Figure 20B:
Figure 20A:

FIGS. 20A-C are diagrams illustrating an example of raw data output in the touch input device including the touch sensor according to the exemplary embodiment of the present invention illustrated in FIG. 12.

The raw data illustrated in FIG. 20A is the same as the raw data illustrated in FIG. 13. That is, the raw data illustrated in FIG. 13 is the raw data based on the detection signal output from the receiving electrode (active Rx) of each of the nodes that form mutual capacitance (Cm) in the touch sensor illustrated in FIG. 12, and FIG. 20B is the raw data based on the detection signal output from the receiving electrode (dummy Rx) of each of the nodes that do not form mutual capacitance (Cm) in the touch sensor illustrated in FIG. 12.

FIG. 20C is the raw data when the detection signal output from the receiving electrode (dummy Rx) of each of the nodes that do not form mutual capacitance (Cm) is subtracted from the detection signal output from the receiving electrode (active Rx) of each of the nodes that form mutual capacitance (Cm).

In the comparison between the raw data of FIG. 20C and the raw data of FIG. 20A, it can be seen that the digital values (or level values) within the touch area in which the touch is actually input by the object) in the raw data of FIG. 20C are relatively larger than the digital value (or level value) of the corresponding portion of FIG. 20A. That is, it can be seen that the central portion of the touch area has a level value of about +250 or more, so that it can be confirmed that even in the floating state, the touch input device may obtain the same or similar level values as those in the grip state.

Although the raw data is not separately illustrated, it is expected that the raw data obtained by subtracting a value obtained by multiplying the detection signal output from the receiving electrode (dummy Rx) of each of the nodes that do not form mutual capacitance (Cm) and a predetermined factor from the detection signal output from the receiving electrode (active Rx) of each of the nodes that form mutual capacitance (Cm) is similar to the raw data of FIG. 20C.

Figure 21:
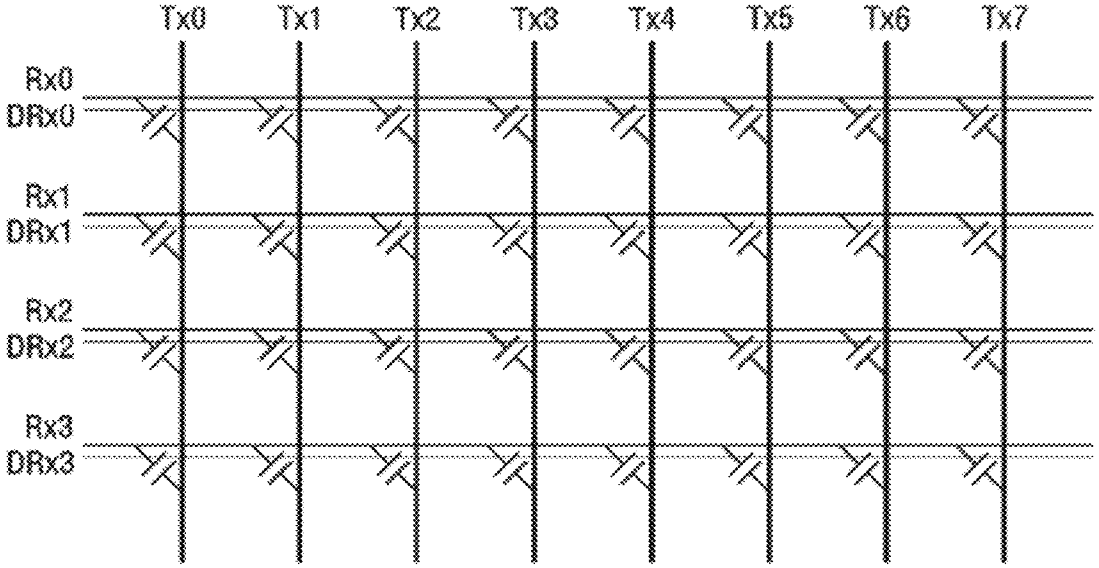
FIG. 21 is a conceptual diagram illustrating a touch sensor according to an exemplary embodiment of the present invention having a bridge structure is conceptualized.

FIG. 21 is a conceptual diagram illustrating a touch sensor according to an exemplary embodiment of the present invention having a bridge structure is conceptualized.

Referring to FIG. 21, the touch sensor according to the exemplary embodiment of the present invention includes the plurality of driving electrodes TX0 to TX7 and the plurality of receiving electrodes RX0 to RX3. Further, the touch sensor according to the exemplary embodiment of the present invention includes the plurality of dummy receiving electrodes DRx0 to DRx3.

Mutual capacitance (Cm) is formed between the plurality of driving electrodes TX0 to TX7 and the plurality of receiving electrodes RX0 to RX3, but mutual capacitance (Cm) is not formed between the plurality of driving electrodes TX0 to TX7 and the plurality of dummy receiving electrodes DRx0 to DRx3. Herein, actually, mutual capacitance (Cm) may be marginally formed between the plurality of driving electrodes TX0 to TX7 and the plurality of dummy receiving electrodes DRx0 to DRx3, but the marginal mutual capacitance is ignorable when whether the touch is input is detected.

The touch input device according to the exemplary embodiment of the present invention including the touch sensor may remove the noise information, particularly, the information on the amount of negative (−) capacitance changed by the LGM jamming signal by subtracting a detection signal output from the receiving electrode Rx of each of the nodes that do not form mutual capacitance (Cm) from a detection signal output from the receiving electrode Rx of each of the nodes that form mutual capacitance (Cm). Herein, the touch input device according to the exemplary embodiment of the present invention including the touch sensor may also subtract a value obtained by multiplying a detection signal output from the receiving electrode Rx of each of the nodes that do not form mutual capacitance (Cm) and a predetermined factor from a detection signal output from the receiving electrode Rx of each of the nodes that form mutual capacitance (Cm).

Figure 22:
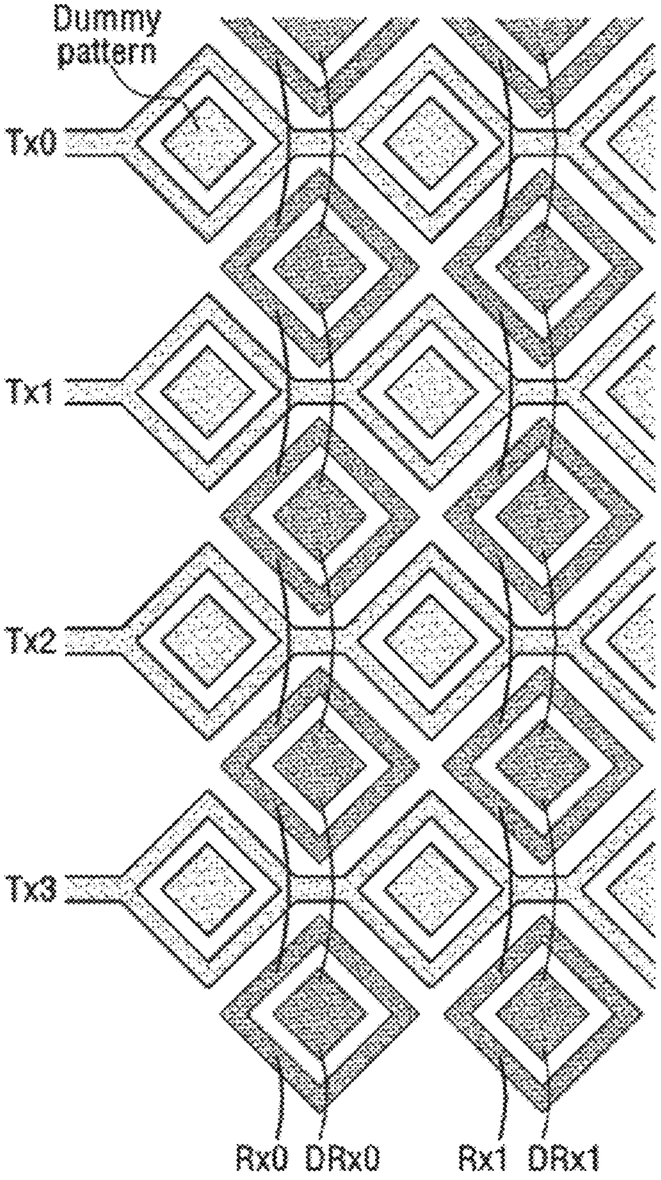
FIG. 22 is a configuration diagram of a touch sensor according to an example to which the conceptual diagram of the touch sensor illustrated in FIG. 21 is applicable.

FIG. 22 is a configuration diagram of a touch sensor according to an example to which the conceptual diagram of the touch sensor illustrated in FIG. 21 is applicable.

Referring to FIG. 22, the plurality of driving electrodes Tx0, Tx1, Tx2, and Tx3 is arranged in parallel in the horizontal direction, and the plurality of receiving electrodes Rx0 and Rx1 is arranged in parallel in the vertical direction.

Each of the plurality of driving electrodes Tx0, Tx1, Tx2, and Tx3 and the plurality of receiving electrodes Rx0 and Rx1 has a diamond shape, and the two adjacent driving electrodes and the two adjacent receiving electrodes are electrically connected with each other through a conductive connection unit.

The plurality of driving electrodes Tx0, Tx1, Tx2, and Tx3 and the plurality of receiving electrodes Rx0 and Rx1 may be implemented with a metal mesh. Herein, the conductive connection unit connecting the plurality of driving electrodes Tx0, Tx1, Tx2, and Tx3 may also be implemented with a metal mesh. The conductive connection unit connecting the plurality of driving electrodes Tx0, Tx1, Tx2, and Tx3 may also be implemented with a metal mesh, and may also be implemented in a conductive trace.

Each of the plurality of driving electrodes Tx0, Tx1, Tx2, and Tx3 and the plurality of receiving electrodes Rx0 and Rx1 has an electrically insulated dummy pattern inside thereof. The dummy pattern may be formed in order to reduce base capacitance of each receiving electrode and driving electrode. After the pattern of each driving electrode and the pattern of each receiving electrode are formed of the metal mesh, the dummy pattern may be formed by cutting a part of the metal mesh in each pattern.

In the plurality of dummy receiving electrodes DRx0 and DRx1, the dummy patterns inside the plurality of receiving electrodes Rx0 and Rx1 may be electrically connected. Since the plurality of receiving electrodes Rx0 and Rx1 are very adjacent to the plurality of driving electrodes Tx0, Tx1, Tx2, and Tx3, the mutual capacitance (Cm) is formed, but the plurality of dummy receiving electrodes DRx0 and DRx1 are relatively spaced apart from the plurality of driving electrodes Tx0, Tx1, Tx2, and Tx3, so that the mutual capacitance (Cm) is formed small which is negligible.

Figure 23:
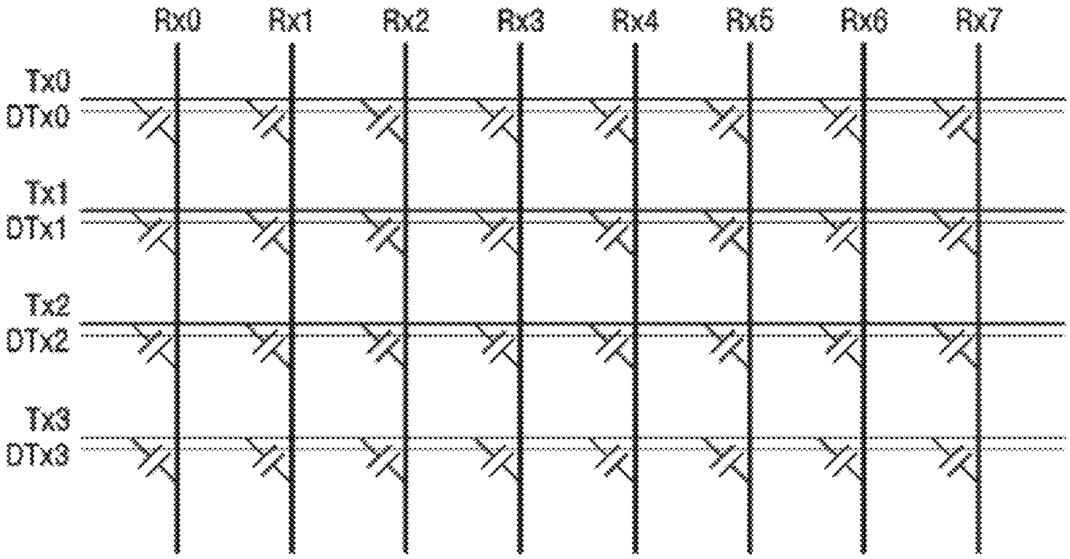
FIG. 23 is another conceptual diagram in which the touch sensor according to the exemplary embodiment of the present invention having the bridge structure is conceptualized.

FIG. 23 is another conceptual diagram in which the touch sensor according to the exemplary embodiment of the present invention having the bridge structure is conceptualized.

Referring to FIG. 23, the touch sensor according to the exemplary embodiment of the present invention includes the plurality of driving electrodes TX0 to TX3 and the plurality of receiving electrodes RX0 to RX7. Further, the touch sensor according to the exemplary embodiment of the present invention includes the plurality of dummy driving electrodes DTx0 to DTx3.

Mutual capacitance (Cm) is formed between the plurality of driving electrodes TX0 to TX3 and the plurality of receiving electrodes RX0 to RX7, but mutual capacitance (Cm) is not formed between the plurality of dummy driving electrodes DTX0 to DTX3 and the plurality of receiving electrodes Rx0 to Rx7. Herein, actually, mutual capacitance may be marginally formed between the plurality of dummy driving electrodes DTX0 to DTX3 and the plurality of receiving electrodes Rx0 to Rx7, but the marginal mutual capacitance is ignorable when the touch is detected.

The touch input device according to the exemplary embodiment of the present invention including the touch sensor may remove the noise information, particularly, the information on the amount of negative (−) capacitance changed by the LGM jamming signal by subtracting a detection signal output from the receiving electrode Rx of each of the nodes that do not form mutual capacitance (Cm) from a detection signal output from the receiving electrode Rx of each of the nodes that form mutual capacitance (Cm). Herein, the touch input device according to the exemplary embodiment of the present invention may subtract a value obtained by multiplying a detection signal output from the receiving electrode Rx of each of the nodes that do not form mutual capacitance (Cm) and a predetermined factor from a detection signal output from the receiving electrode Rx of each of the nodes that form mutual capacitance (Cm).

Figure 24:
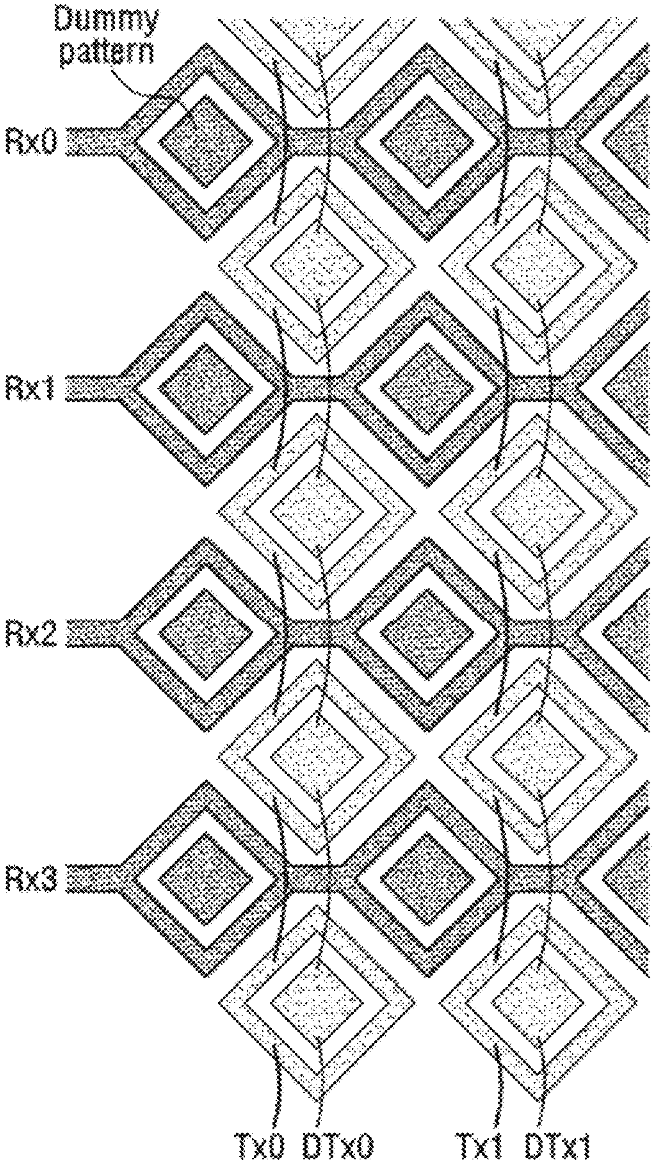
FIG. 24 is a configuration diagram of a touch sensor according to an example to which the conceptual diagram of the touch sensor illustrated in FIG. 23 is applicable.

FIG. 24 is a configuration diagram of a touch sensor according to an example to which the conceptual diagram of the touch sensor illustrated in FIG. 23 is applicable.

Referring to FIG. 24, the plurality of receiving electrodes Rx0, Rx1, Rx2, and Rx3 is arranged in parallel in the horizontal direction, and the plurality of driving electrodes Tx0 and Tx1 is arranged in parallel in the vertical direction.

Each of the plurality of receiving electrodes Rx0, Rx1, Rx2, and Rx3 and the plurality of driving electrodes Tx0 and Tx1 has a diamond shape, and the two adjacent driving electrodes and the two adjacent receiving electrodes are electrically connected with each other through a conductive connection part.

The plurality of receiving electrodes Rx0, Rx1, Rx2, and Rx3 and the plurality of driving electrodes Tx0 and Tx1 may be implemented with a metal mesh. Herein, the conductive connection unit connecting the plurality of receiving electrodes Rx0, Rx1, Rx2, and Rx3 may also be implemented with a metal mesh. The conductive connection unit connecting the plurality of receiving electrodes Rx0, Rx1, Rx2, and Rx3 may also be implemented with a metal mesh, and may also be implemented in a conductive trace.

Each of the plurality of receiving electrodes Rx0, Rx1, Rx2, and Rx3 and the plurality of driving electrodes Tx0 and Tx1 has an electrically insulated dummy pattern inside thereof. The dummy pattern may be formed in order to reduce base capacitance of each receiving electrode and driving electrode. After the pattern of each driving electrode and the pattern of each receiving electrode are formed in the metal mesh, the dummy pattern may be formed by cutting a part of the metal mesh in each pattern.

In the plurality of dummy driving electrodes DTx0 and DTx1, the dummy patterns inside the plurality of driving electrodes Tx0 and Tx1 may be electrically connected. Since the plurality of driving electrodes Tx0 and Tx1 are very adjacent to the plurality of receiving electrodes Rx0, Rx1, Rx2, and Rx3, the mutual capacitance (Cm) is formed, but the plurality of dummy driving electrodes DTx0 and DTx1 are relatively spaced apart from the plurality of driving electrodes Tx0, Tx1, Tx2, and Tx3, so that the mutual capacitance (Cm) is formed small which is negligible.

Figure 25:
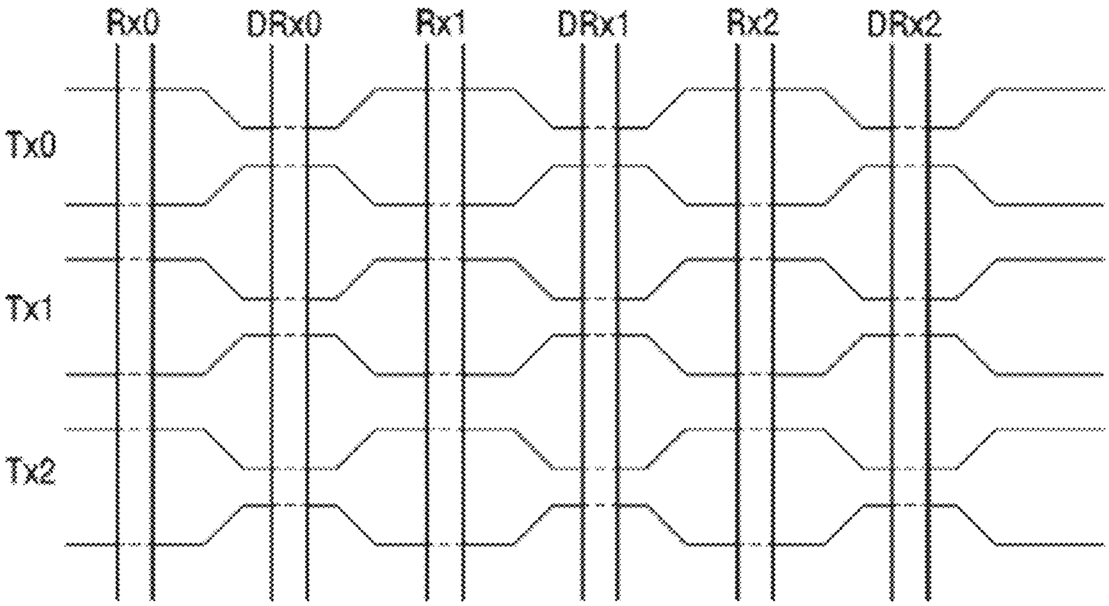
FIG. 25 is a configuration diagram of a touch sensor according to another example to which the conceptual diagram of the touch sensor illustrated in FIG. 21 is applicable.

FIG. 25 is a configuration diagram of a touch sensor according to another example to which the conceptual diagram of the touch sensor illustrated in FIG. 21 is applicable.

Referring to FIG. 25, the plurality of receiving electrodes Rx0, Rx1, and Rx2 is arranged in parallel in the horizontal direction, and the plurality of driving electrodes Tx0, Tx1, and TX2 is arranged in parallel in the vertical direction. Herein, the horizontal direction and the vertical direction may be changed.

Each of the plurality of receiving electrodes Rx0, Rx1, and Rx2 and the plurality of driving electrodes Tx0, Tx1, and Tx2 has a bar shape.

The plurality of receiving electrodes Rx0, Rx1, and Rx2 is formed on a first layer, and the plurality of driving electrodes Tx0, Tx1, and Tx2 is formed on a second layer. The first layer and the second layer are not disposed on the same plane. For example, the first layer may be disposed on the second layer. An insulating layer may be disposed between the first layer and the second layer.

The plurality of receiving electrodes Rx0, Rx1, and Rx2 and the plurality of driving electrodes Tx0, Tx1, and Tx2 may be implemented with a metal mesh or a conductive metal.

The touch sensor illustrated in FIG. 25 includes the plurality of dummy receiving electrodes DRx0, DRx1, and DRx2. The plurality of dummy receiving electrodes DRx0, DRx1, and DRx2 may be formed together on the layer on which the plurality of receiving electrodes Rx0, Rx1, and Rx2 are formed, and one dummy receiving electrode DRx0, DRx1, and DRx2 may be disposed between the plurality of receiving electrodes Rx0, Rx1, and Rx2.

Each of the driving electrodes Tx0, Tx1, and Tx2 includes a first area overlapping each of the receiving electrodes Rx0, Rx1, and Rx2 and a second area overlapping each of the dummy receiving electrodes DRx0, DRx1, and DRx2. Herein, an area of the first area is larger than an area of the second area. Particularly, the area of the second area is preferably formed as small as possible. This is for the purpose of reducing mutual capacitance between the dummy receiving electrode and the driving electrode as much as possible. Otherwise, under the condition in which the receiving electrode and the dummy receiving electrode have the same shape, a width of the first area overlapping the receiving electrode in each driving electrode may also be designed to be larger than a width of the second area overlapping the dummy receiving electrode.

Since the plurality of driving electrodes Tx0, Tx1, and Tx2 have a relatively large area overlapping the plurality of receiving electrodes Rx0, Rx1, and Rx2, relatively large mutual capacitance (Cm) is formed, but the plurality of dummy receiving electrodes DRx0, DRx1, DRx2 relatively little overlaps the plurality of driving electrodes Tx0, Tx1, and Tx2, so that the mutual capacitance (Cm) between the dummy receiving electrode and the driving electrode is formed to be small which is negligible.

Figure 26:
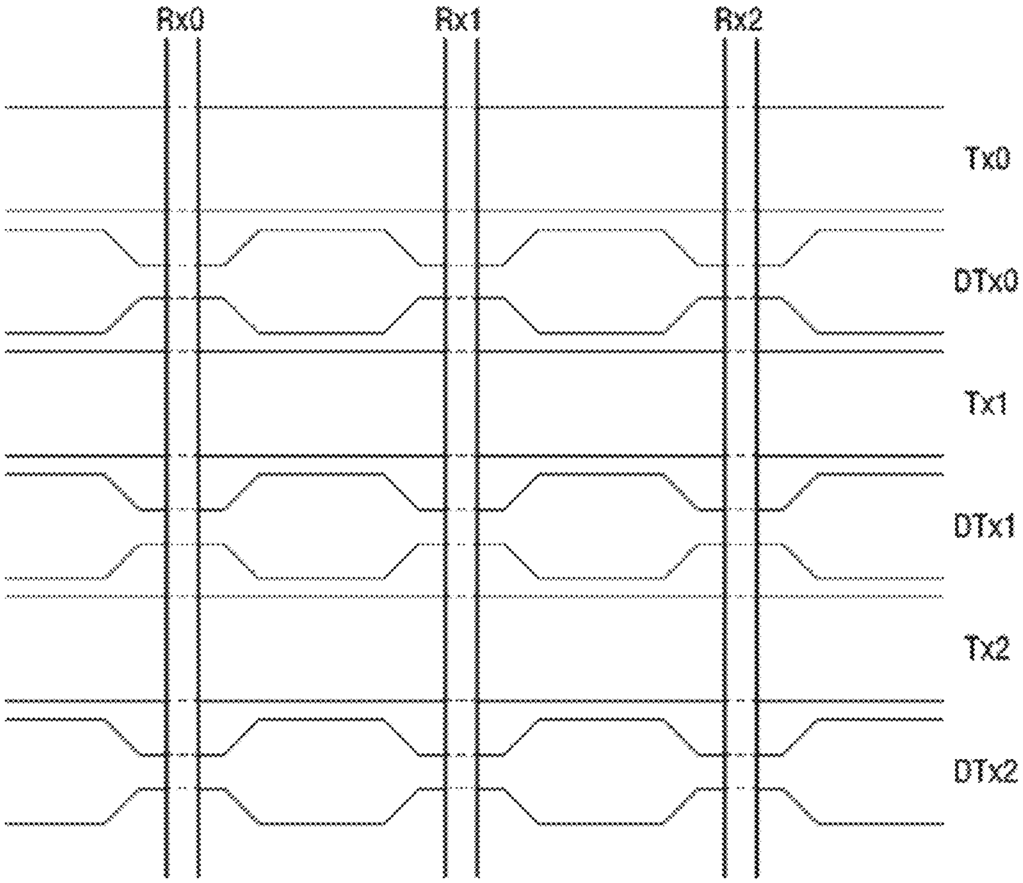
FIG. 26 is a configuration diagram of a touch sensor according to another example to which the conceptual diagram of the touch sensor illustrated in FIG. 23 is applicable.

FIG. 26 is a configuration diagram of a touch sensor according to another example to which the conceptual diagram of the touch sensor illustrated in FIG. 23 is applicable.

Referring to FIG. 26, the plurality of receiving electrodes Rx0, Rx1, and Rx2 is arranged in parallel in the vertical direction, and the plurality of driving electrodes Tx0, Tx1, and TX2 is arranged in parallel in the horizontal direction. Herein, the horizontal direction and the vertical direction may be changed.

Each of the plurality of receiving electrodes Rx0, Rx1, and Rx2 and the plurality of driving electrodes Tx0, Tx1, and Tx2 has a bar shape.

The plurality of receiving electrodes Rx0, Rx1, and Rx2 is formed on a first layer, and the plurality of driving electrodes Tx0, Tx1, and Tx2 is formed on a second layer. The first layer and the second layer are not disposed on the same plane. For example, the first layer may be disposed on the second layer. An insulating layer may be disposed between the first layer and the second layer.

The plurality of receiving electrodes Rx0, Rx1, and Rx2 and the plurality of driving electrodes Tx0, Tx1, and Tx2 may be implemented with a metal mesh or a conductive metal.

The touch sensor illustrated in FIG. 26 includes the plurality of dummy driving electrodes DTx0, DTx1, and DTx2. The plurality of dummy driving electrodes DTx0, DTx1, and DTx2 may be formed together on the layer on which the plurality of driving electrodes Tx0, Tx1, and Tx2 are formed, and one dummy driving electrode DTx0, DTx1, and DTx2 may be disposed between the plurality of driving electrodes Tx0, Tx1, and Tx2.

Each of the receiving electrodes Rx0, Rx1, and Rx2 includes a first area overlapping each of the driving electrodes Tx0, Tx1, and Tx2 and a second area overlapping each of the dummy driving electrodes DTx0, DTx1, and DTx2. Herein, an area of the first area is larger than an area of the second area. Particularly, the area of the second area is preferably formed as small as possible. This is for the purpose of reducing mutual capacitance between the dummy driving electrode and the receiving electrode as much as possible. Otherwise, under the condition in which the receiving electrodes have the same shape, a width of the first area in which the driving electrode overlaps the receiving electrode may also be designed to be larger than a width of the second area in which the dummy driving electrode overlaps the receiving electrode.

Since each of the plurality of driving electrodes Tx0, Tx1, and Tx2 has a relatively large area overlapping each of the plurality of receiving electrodes Rx0, Rx1, and Rx2, relatively large mutual capacitance (Cm) is formed, but each of the plurality of dummy driving electrodes DTx0, DTx1, and DTx2 relatively little overlaps each of the plurality of receiving electrodes Rx0, Rx1, and Rx2, so that the mutual capacitance (Cm) between the dummy driving electrode and the receiving electrode is formed to be small which is negligible.

Figure 27:
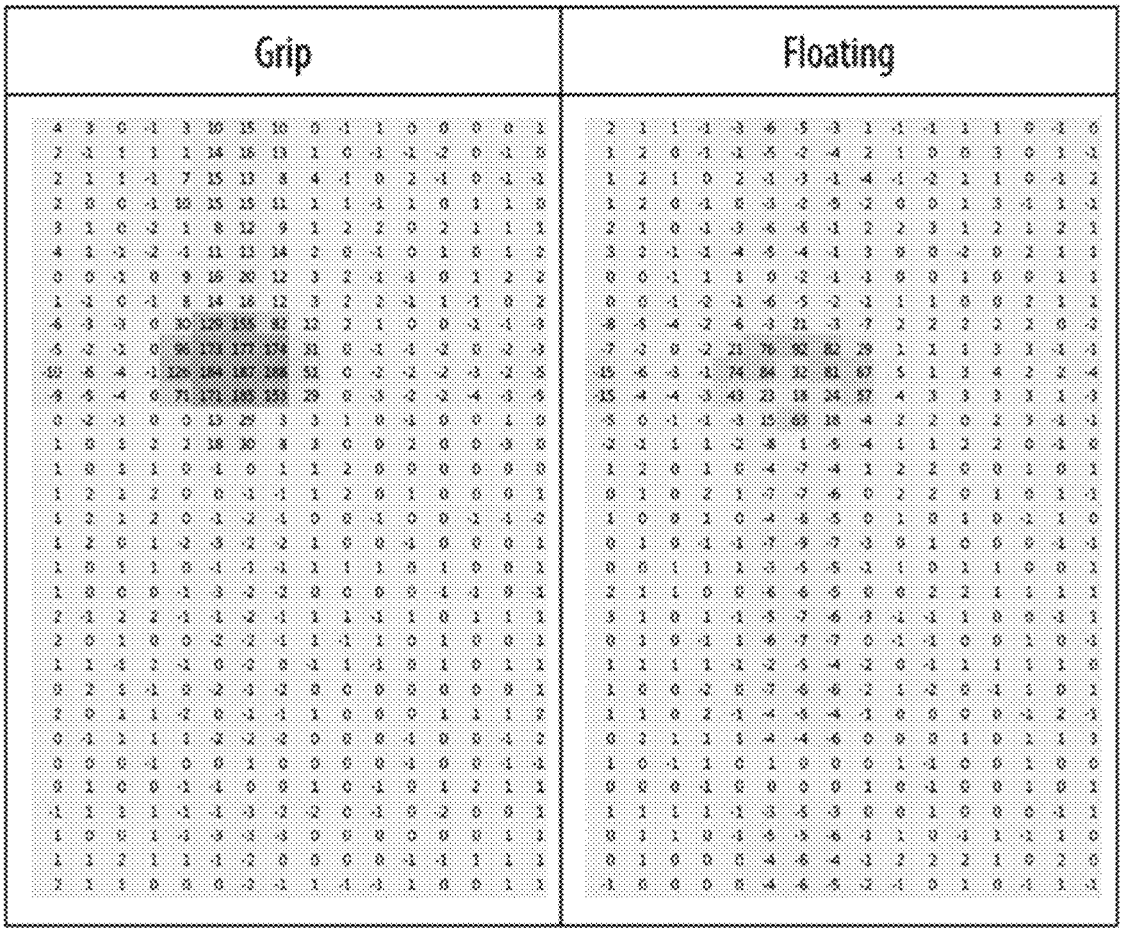
FIG. 27 is raw data output from each of a state where a touch input device including a touch sensor illustrated in FIG. 10 is in a grip state and a state where a touch input device including a touch sensor illustrated in FIG. 10 is in a floating state when a test is performed using a conductive rod of 15 phi.

When the present applicant performed the test using a conductive rod having a diameter of 15 phi in the state where the touch input device including the touch sensor illustrated in FIG. 10 is in the grip state and the state where the touch input device including the touch sensor illustrated in FIG. 10 is in the floating state, the present applicant could obtain raw data in each state. The obtained raw data is illustrated in FIG. 27, and the left raw data of FIG. 27 is the raw data in the grip state, and the right raw data of FIG. 27 is the raw data in the floating state. When the left and right raw data of FIG. 27 are compared, it can be seen that the level values of the touch area are remarkably decreased by the LGM jamming signal generated in the floating state.

Figure 28:
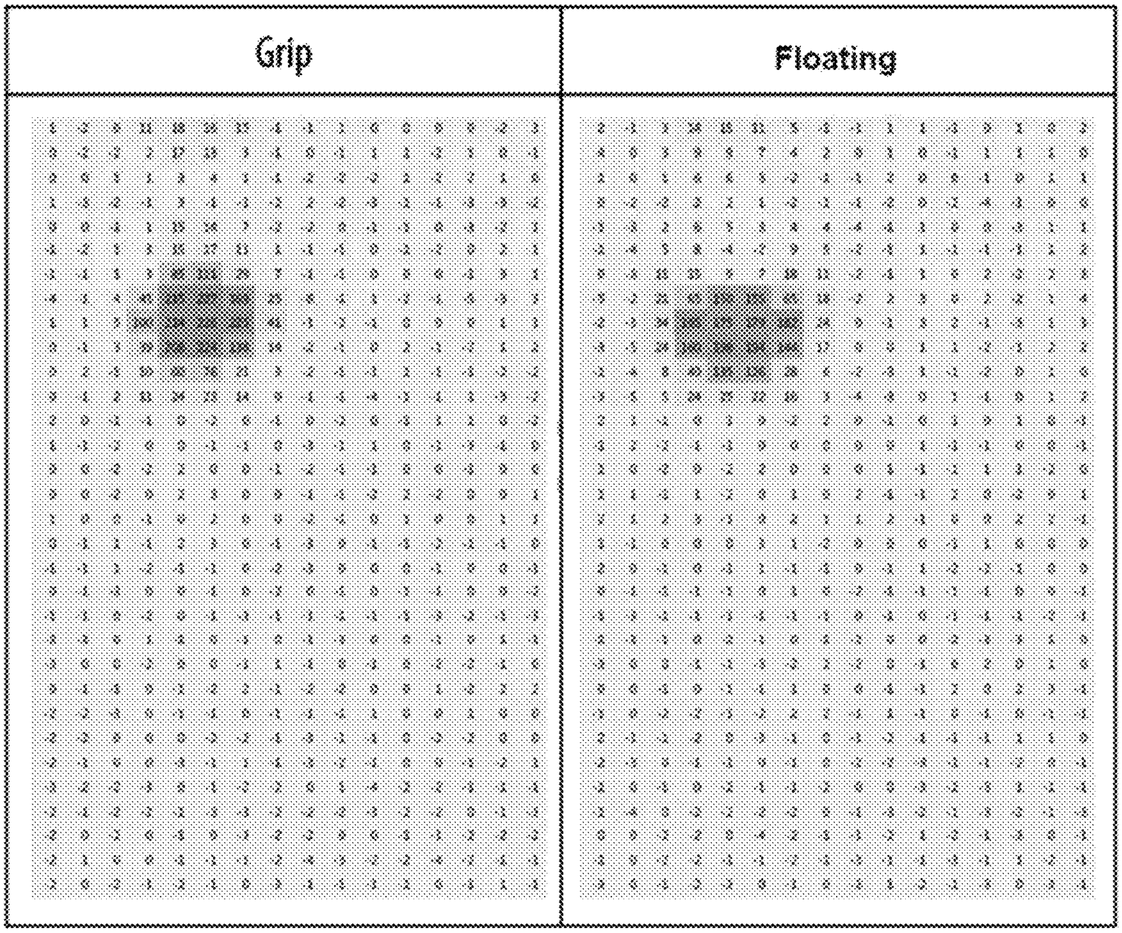
FIG. 28 is raw data output from each of a state where a touch input device according to an exemplary embodiment of the present invention including a touch sensor illustrated in FIG. 12 is in a grip state and a state where a touch input device according to an exemplary embodiment of the present invention including a touch sensor illustrated in FIG. 12 is in a floating state when a test is performed using a conductive rod of 15 phi.

Further, the present applicant performed the test using the conductive rod having a diameter of 15 phi in the state where the touch input device including the touch sensor illustrated in FIG. 12 is in the grip state and the state where the touch input device including the touch sensor illustrated in FIG. 12 is in the floating state, and as described with reference to FIGS. 20A-C, the raw data of each state could be obtained by subtracting the detection signal output from the receiving electrode that does not form mutual capacitance with the driving electrode from the detection signal output from the receiving electrode that forms mutual capacitance with the driving electrode. The obtained raw data is illustrated in FIG. 28, and the left raw data of FIG. 28 is the raw data in the grip state, and the right raw data of FIG. 28 is the raw data in the floating state. When the left and right raw data of FIG. 28 is compared, it can be seen that the deviation of the level values within the touch area in the grip state and the floating state is considerably low compared to FIG. 27.

Figure 29:
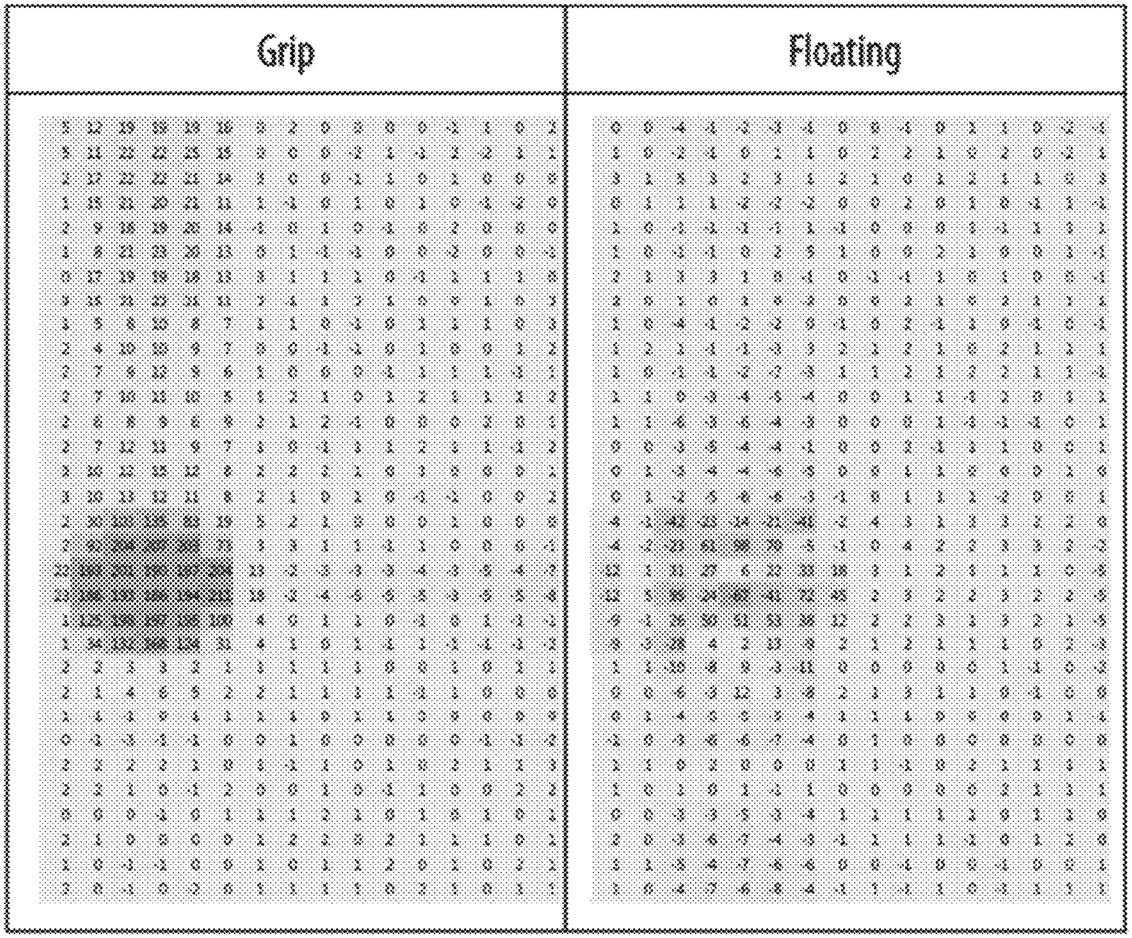
FIG. 29 is raw data output from each of a state where a touch input device including a touch sensor illustrated in FIG. 10 is in a grip state and a state where a touch input device including a touch sensor illustrated in FIG. 10 is in a floating state when a test is performed using a conductive rod of 20 phi.

Further, when the present applicant performed the test using a conductive rod having a diameter of 20 phi in the state where the touch input device including the touch sensor illustrated in FIG. 10 is in the grip state and the state where the touch input device including the touch sensor illustrated in FIG. 10 is in the floating state, the present applicant could obtain raw data in each state. The obtained raw data is illustrated in FIG. 29, and the left raw data of FIG. 29 is the raw data in the grip state, and the right raw data of FIG. 29 is the raw data in the floating state. When the left and right raw data of FIG. 29 is compared, it can be seen that the level values of the touch area are remarkably decreased by the LGM jamming signal generated in the floating state.

Figure 30:
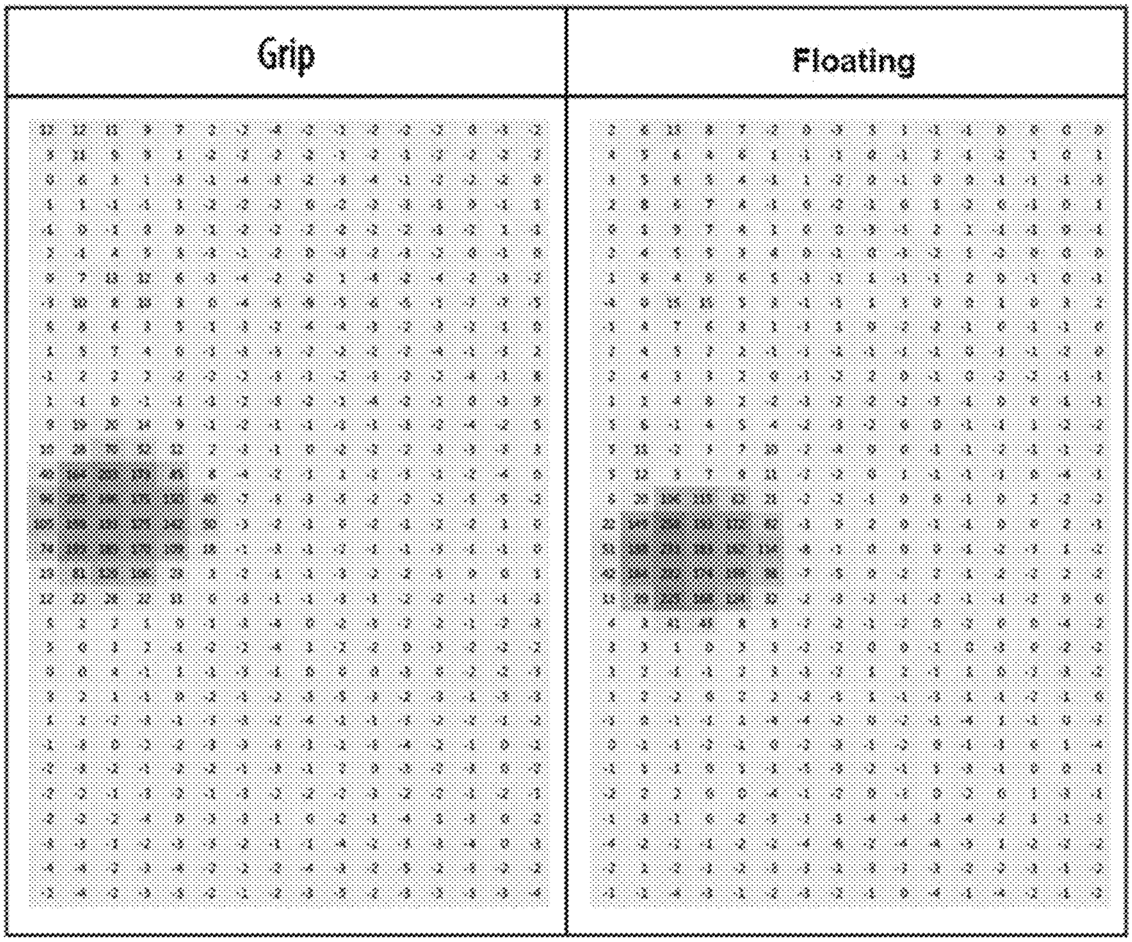
FIG. 30 is raw data output from each of a state where a touch input device according to an exemplary embodiment of the present invention including a touch sensor illustrated in FIG. 12 is in a grip state and a state where a touch input device according to an exemplary embodiment of the present invention including a touch sensor illustrated in FIG. 12 is in a floating state when a test is performed using a conductive rod of 20 phi.

Further, the present applicant performed the test using the conductive rod having a diameter of 15 phi in the state where the touch input device including the touch sensor illustrated in FIG. 12 is in the grip state and the state where the touch input device including the touch sensor illustrated in FIG. 12 is in the floating state, and as described with reference to FIGS. 20A-C, the raw data of each state could be obtained by subtracting the detection signal output from the receiving electrode that does not form mutual capacitance with the driving electrode from the detection signal output from the receiving electrode that forms mutual capacitance with the driving electrode. The obtained raw data is illustrated in FIG. 30, and the left raw data of FIG. 30 is the raw data in the grip state, and the right raw data of FIG. 30 is the raw data in the floating state. When the left and right raw data of FIG. 30 is compared, it can be seen that the deviation of the level values within the touch area is small in the grip state and the floating state, and there is even a part where the level value in the floating state is larger.

Figure 31:
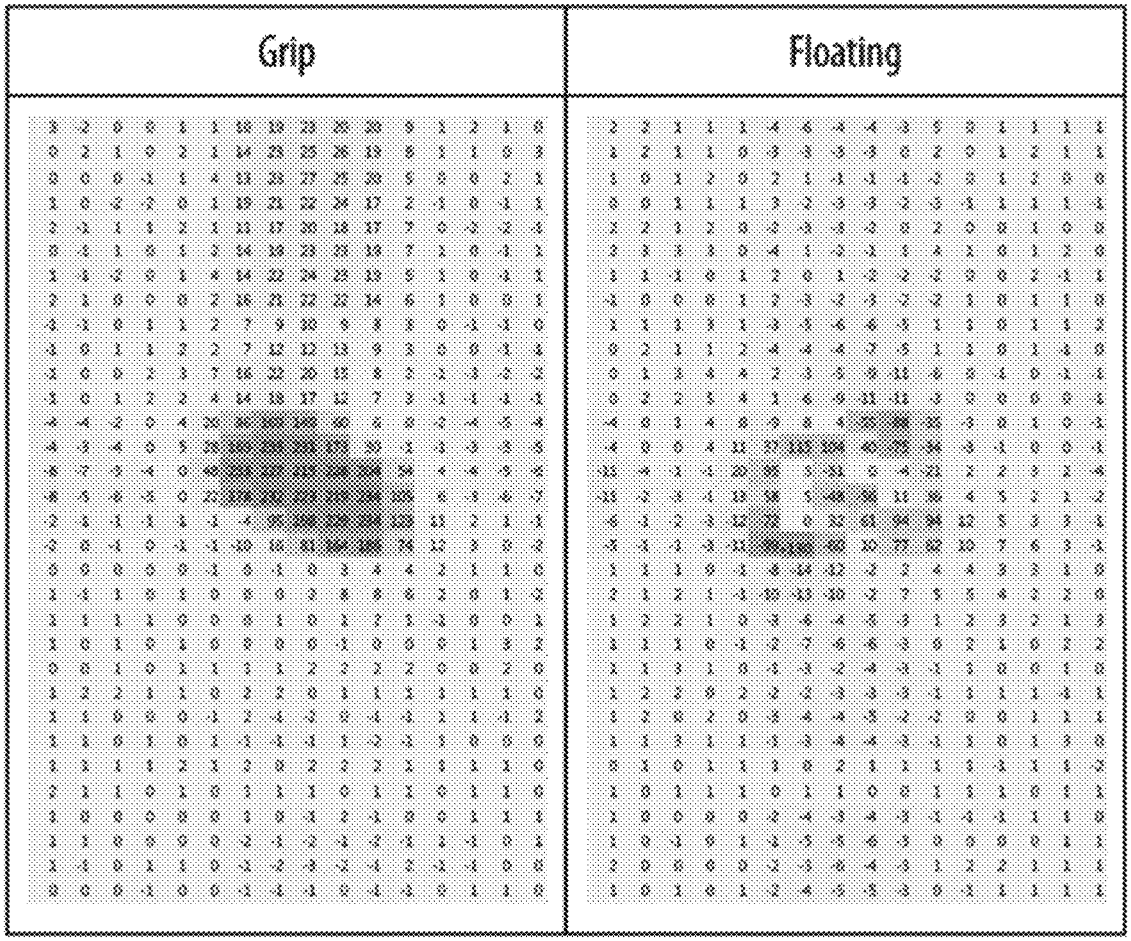
FIG. 31 is raw data output from each of a state where a touch input device including a touch sensor illustrated in FIG. 10 is in a grip state and a state where a touch input device including a touch sensor illustrated in FIG. 10 is in a floating state when a test is performed using a thumb of a person.

Furthermore, when the applicant performed the test using a thumb of an actual person in the state where the touch input device including the touch sensor illustrated in FIG. 10 is in the grip state and the state where the touch input device including the touch sensor illustrated in FIG. 10 is in the floating state, the applicant could obtain raw data in each state. The obtained raw data is illustrated in FIG. 31, and the left raw data of FIG. 31 is the raw data in the grip state, and the right raw data of FIG. 31 is the raw data in the floating state. When the left and right raw data of FIG. 31 is compared, it can be seen that the level values of the touch area are remarkably decreased by the LGM jamming signal generated in the floating state.

Figure 32:
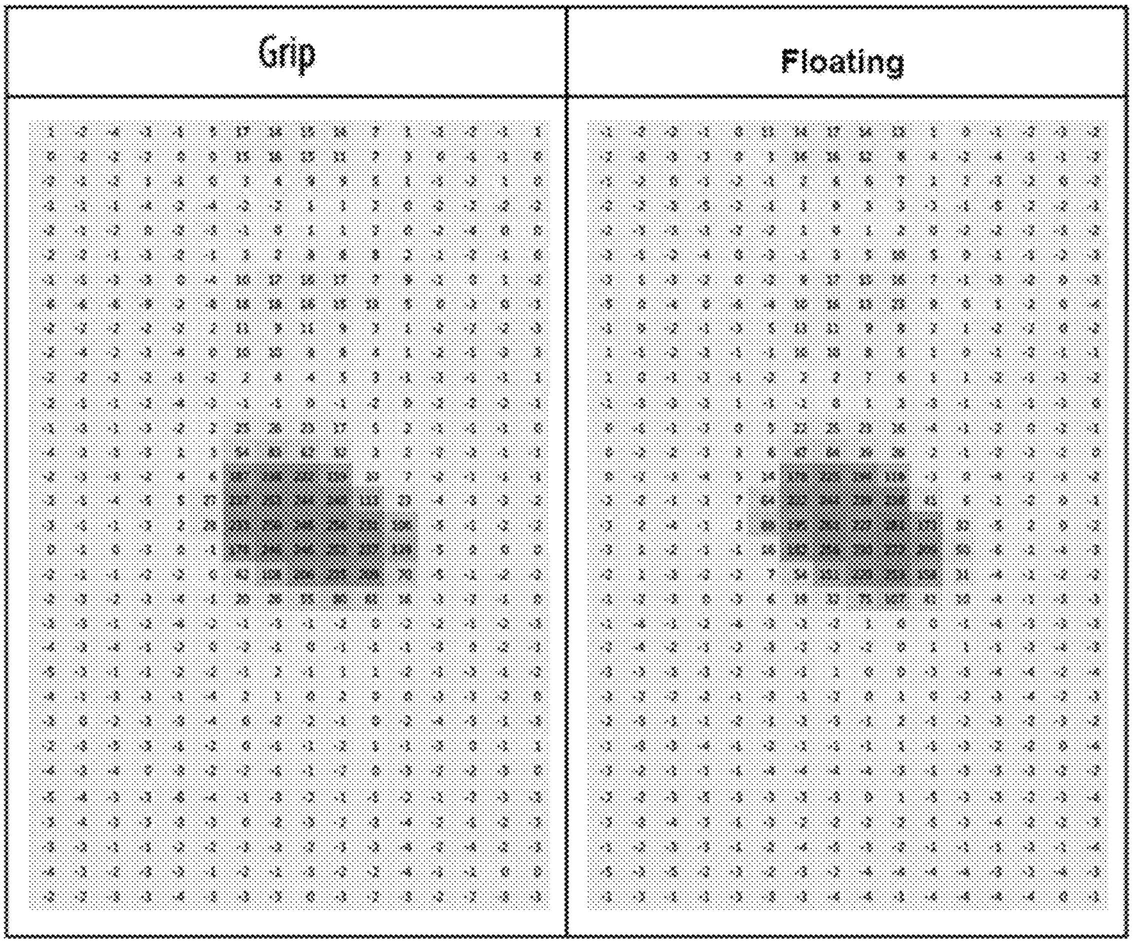
FIG. 32 is raw data output from each of a state where a touch input device according to an exemplary embodiment of the present invention including a touch sensor illustrated in FIG. 12 is in a grip state and a state where a touch input device according to an exemplary embodiment of the present invention including a touch sensor illustrated in FIG. 12 is in a floating state when a test is performed using a thumb of a person.

Further, the present applicant performed the test using the conductive rod having a diameter of 15 phi in the state where the touch input device including the touch sensor illustrated in FIG. 12 is in the grip state and the state where the touch input device including the touch sensor illustrated in FIG. 12 is in the floating state, and as described with reference to FIGS. 20A-C, the raw data of each state could be obtained by subtracting the detection signal output from the receiving electrode that does not form mutual capacitance with the driving electrode from the detection signal output from the receiving electrode that forms mutual capacitance with the driving electrode. The obtained raw data is illustrated in FIG. 32, and the left raw data of FIG. 32 is the raw data in the grip state, and the right raw data of FIG. 32 is the raw data in the floating state. When the left and right raw data of FIG. 32 is compared, it can be seen that there is almost no deviation between the level values within the touch area in the grip state and the floating state.

The touch input device including the touch sensor according to the exemplary embodiment of the present invention has a unique advantage in that it is possible to discriminate two or more multi-touches even in the floating state.

Figure 33:
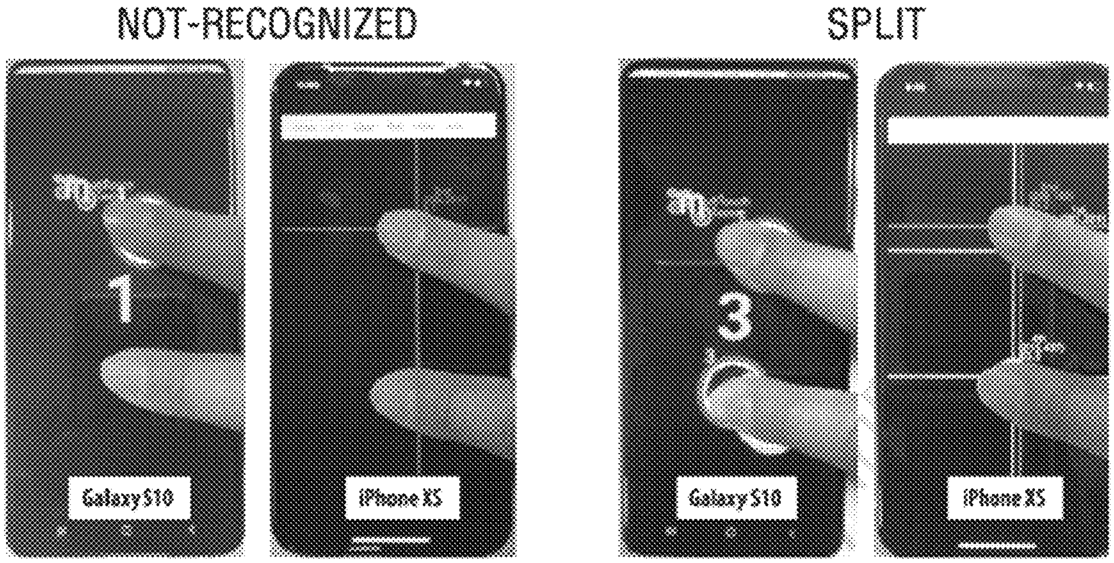
FIG. 33 is a diagram illustrating the case where the touch input devices in the related art cannot recognize multi-touches by multiple objects when the touch input devices in the related art are in the floating state.

FIG. 33 is a diagram illustrating the case where the touch input devices in the related art cannot recognize multi-touches by multiple objects when the touch input devices in the related art are in the floating state.

The situation of FIG. 33 may be, for example, the case where a user touches a touch surface of a touch input device with two fingers in the state where the touch input device in the related art is mounted on a cradle in a vehicle.

As illustrated in the left drawing of FIG. 33, the touch input devices in the related art do not recognize one touch between two multi-touches, or as illustrated in the right drawing of FIG. 33, the user inputs two touches, but the touch input device recognizes the two touches as three or four multi-touches.

Figure 34A:
FIGS. 34A to 34C are raw data for describing that the touch input device according to the exemplary embodiment of the present invention recognizes multi-touches.

FIG. 34A represents the raw data when a multi-touch is performed after the touch input device including the touch sensor of the dual layers illustrated in FIG. 3 is placed in the floating state. Referring to FIG. 34A, the level values of the regions multi-touched are relatively low by the LGM jamming signal generated in the floating state. When a reference level value for determining whether a touch is input is set to 65, a portion touched relatively above is not recognized as a touch, and only a portion touched relatively below may be recognized as a touch, so that there occurs a phenomenon in which one of the two touches is not recognized.

Figure 34B:
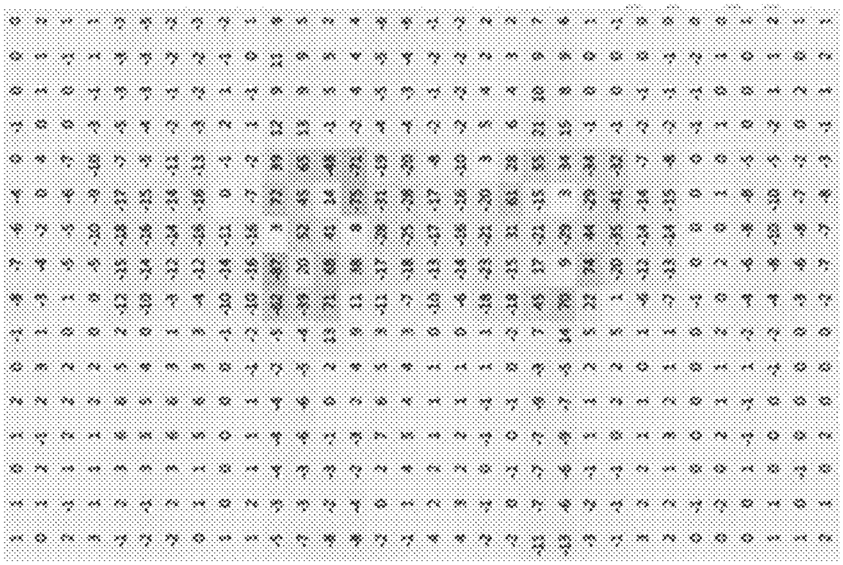

FIG. 34B represents the raw data when a multi-touch is performed after the touch input device including the touch sensor illustrated in FIG. 10 is placed in the floating state. Referring to FIG. 34B, there is a portion in which the level values of the regions multi-touched are relatively low by the LGM jamming signal generated in the floating state. When a reference level value for determining whether a touch is input is set to 65, three or more touches may be recognized as present.

Figure 34C:
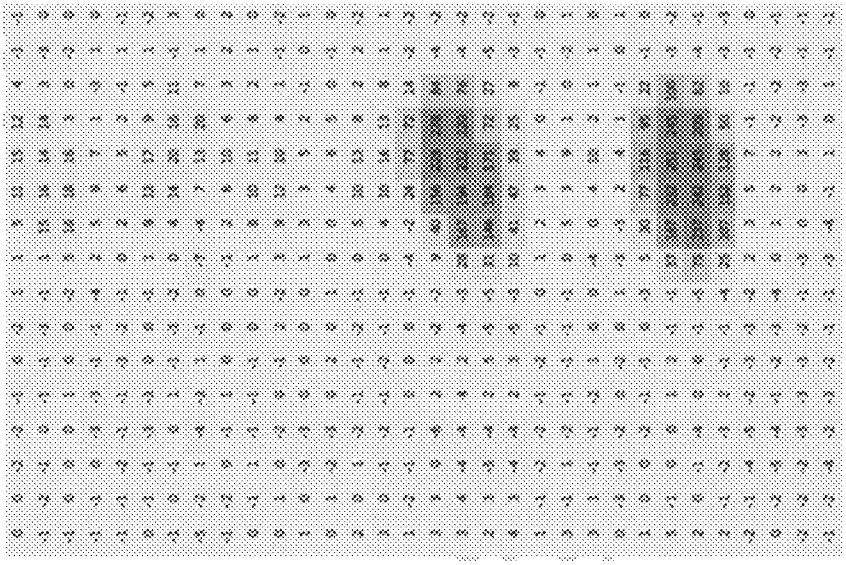

FIG. 34C represents the raw data in the case where a multi-touch is performed after the touch input device is placed in the floating state when the method of subtracting the detection signal output from the receiving electrode that does not form mutual capacitance with the driving electrode from the detection signal output from the receiving electrode that forms mutual capacitance with the driving electrode is applied to the touch input device including the touch sensor illustrated in FIG. 12 as described with reference to FIGS. 20A-C. Referring to FIG. 34C, since the relatively large positive level values are output from the multi-touched two parts, the touch input device may accurately recognize the multi-touch of the user as the multi-touch.

Further, the touch input device including the touch sensor according to the exemplary embodiment of the present invention has a unique advantage in that it is possible to discriminate a third touch touched together with a cross touch.

Figure 35:
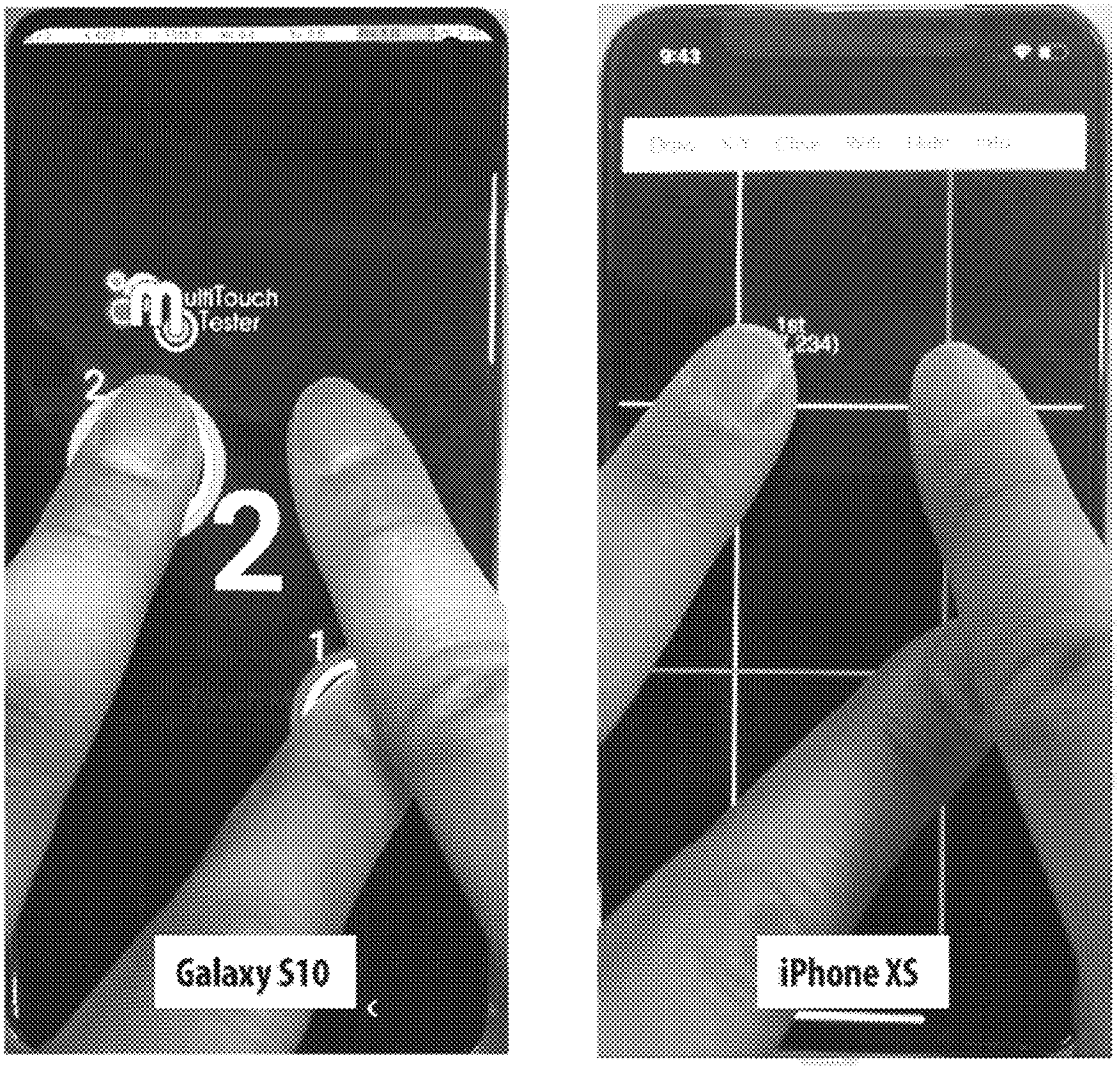
FIG. 35 is a diagram illustrating the case where a third touch is not recognized when a cross touch and the third touch are input together to touch surfaces of the touch input devices in the related art.

FIG. 35 is a diagram illustrating the case where a third touch is not recognized when a cross touch and the third touch are input together to touch surfaces of the touch input devices in the related art.

The touch input devices in the related art could not recognize a third touch among two cross touches by two fingers of the left hand and the third touch by one finger of the right hand as illustrated in the left and right drawings of FIG. 35.

Figure 36C:
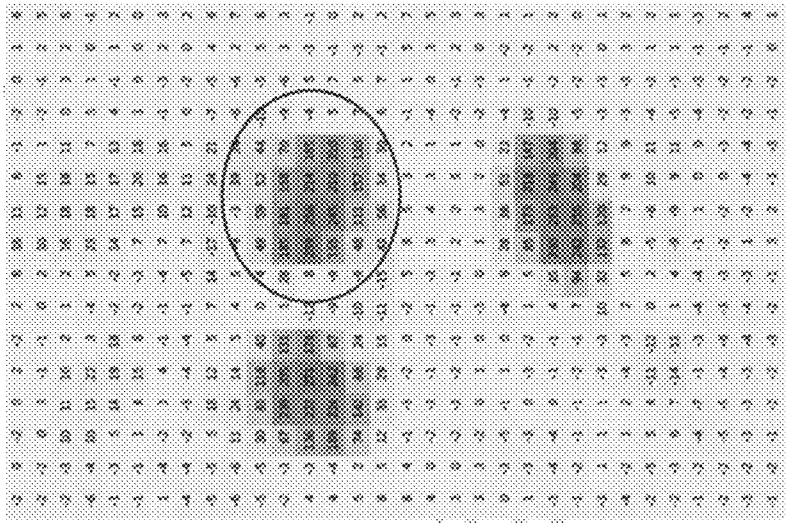
FIGS. 36A to 36C are raw data for describing that the touch input device according to the exemplary embodiment of the present invention recognizes a cross touch and a third touch.
Figure 36B:
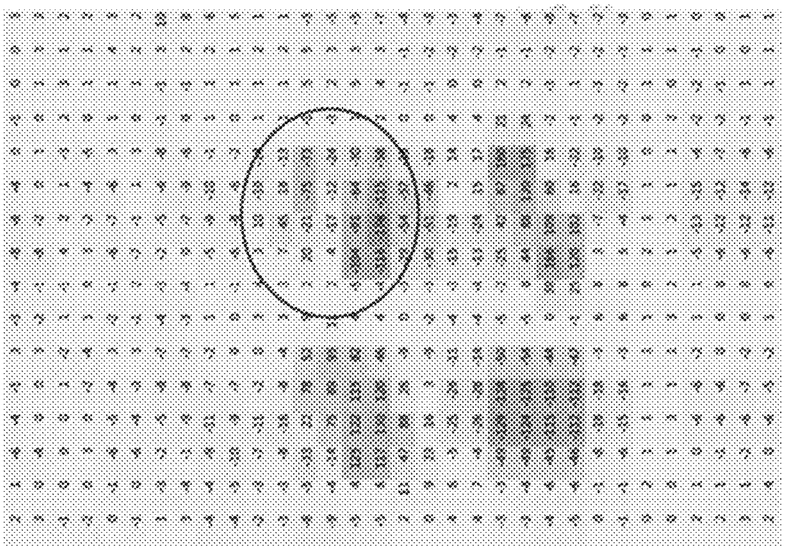
Figure 36A:
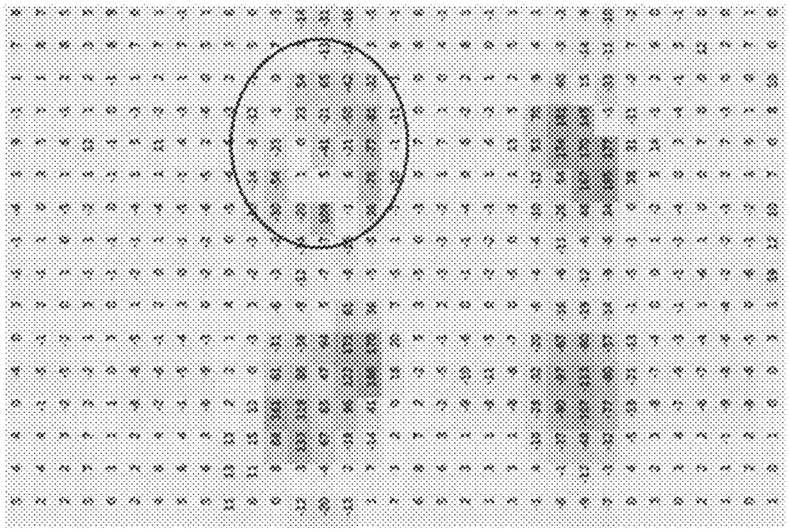

FIG. 36A is the raw data when a cross touch and a third touch are input to the touch input device including the touch sensor of the dual layers illustrated in FIG. 3. Referring to FIG. 36A, a level value in a circle region corresponding to the third touch is relatively low compared to the cross touched portions. Accordingly, the touch input device does not recognize the third touch.

FIG. 36B represents the raw data when a cross touch and the third touch are input to the touch input device including the touch sensor illustrated in FIG. 10. Referring to FIG. 36B, a level value in a circle region corresponding to the third touch is relatively low compared to the cross touched portions. Accordingly, the touch input device does not recognize the third touch.

FIG. 36C represents the raw data in the case where a cross touch and a third touch are input to the touch input device when the method of subtracting the detection signal output from the receiving electrode that does not form mutual capacitance with the driving electrode from the detection signal output from the receiving electrode that forms mutual capacitance with the driving electrode is applied to the touch input device including the touch sensor illustrated in FIG. 12 as described with reference to FIGS. 20A-C. Referring to FIG. 36C, it can be seen that the relatively large positive (+) level values are output from the cross-touched two parts, and the relatively large positive (+) level values are output from a circle region corresponding to the third touch. That is, the touch input device may recognize both the cross touch and the third touch together.

Figure 37:
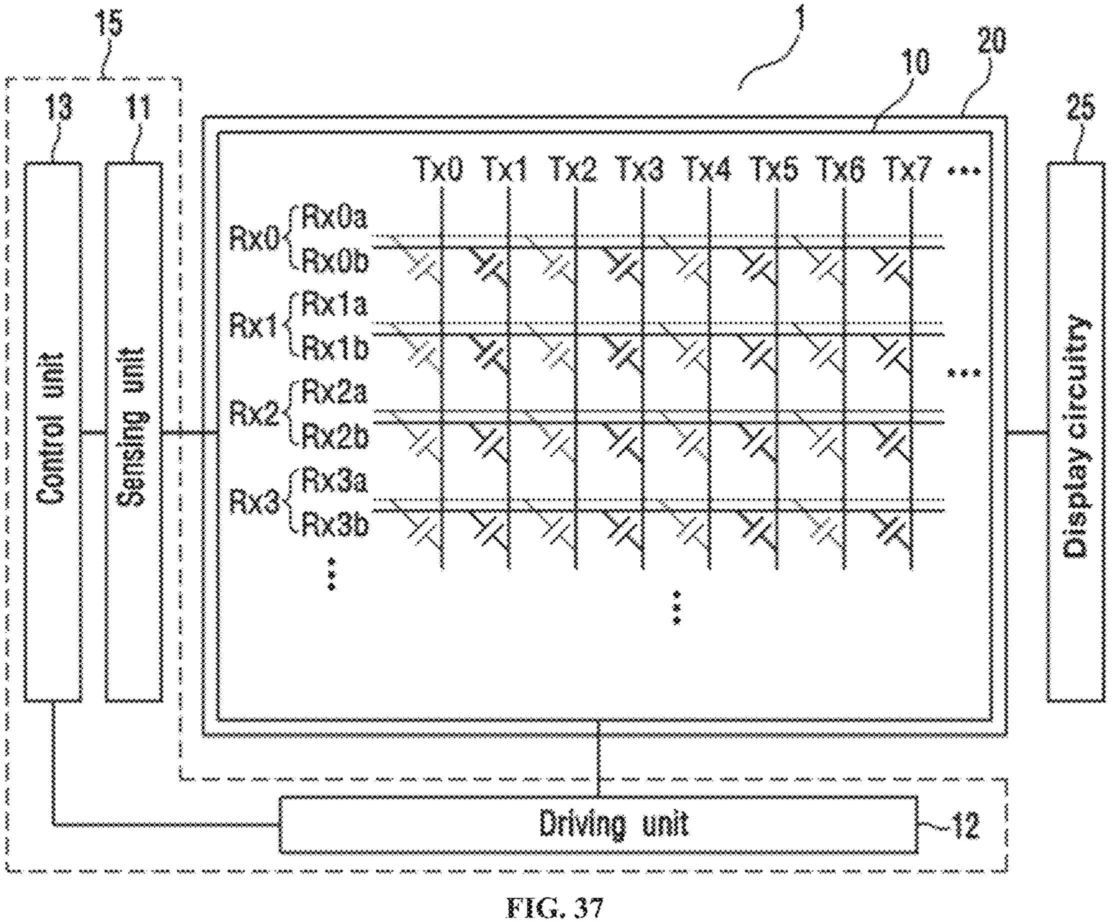
FIG. 37 is a schematic diagram showing a touch input device according to an embodiment of the present invention.

FIG. 37 is a schematic diagram showing a touch input device according to an embodiment of the present invention.

Referring to FIG. 37, a touch input device 1 according to an embodiment of the present invention may include a touch sensor 10, a display panel 20, a circuitry 15 for controlling the touch sensor 10, and a display circuitry 25 for controlling the display panel 20. Here, the circuitry 15 and the display circuitry 25 may be integrated into one controller.

The touch sensor 10 includes a plurality of electrodes (or patterns). The plurality of electrodes includes a plurality of first electrodes and a plurality of second electrodes.

The circuitry 15 may include a driving unit 12, a detection unit 11, and a control unit 13.

The driving unit 12 applies a driving signal (or TX signal) to the touch sensor 10 by control of the controller 13. The detection unit 11 receives a sensing signal (or RX signal) from the touch sensor 10.

The driving unit 12 may sequentially supply driving signals to a plurality of driving electrodes of the touch sensor 10.

The detection unit 11 receives a signal output from a plurality of receiving electrodes of the touch sensor 10. Here, the signal may include information on capacitance variation between a driving electrode and a receiving electrode adjacent to each other, an LGM noise signal, and a display noise signal.

The detection unit 11 outputs a subtracted signal obtained by subtracting two signals from among the signals output from the plurality of receiving electrodes. The detection unit 11 may output the subtracted signal by converting analog to digital. The detection unit 11 may include a comparator and an ADC.

The control unit 13 may detect a touch and/or a touch position based on the digital signal output from the detection unit 11.

In FIG. 37, the detection unit 11, the driving unit 12, and the control unit 13 are shown separately for convenience of description. However, the embodiment of the present invention is not limited thereto. For example, at least one unit or two units of the detection unit 11, the driving unit 12, and the control unit 13 may be implemented as a single unit such as a module, a unit, a chip, or a circuit. In addition, all of the detection unit 11, the driving unit 12, and the control unit 13 may be implemented as one module, unit, chip, or circuit.

Like the OCTA method, the touch sensor 10 may be disposed on the cell of the display panel 20 or may be disposed within the cell of the display panel 20 like the in-cell method. In some cases, the touch sensor 10 may be disposed below the display panel 20. For example, the touch sensor 10 may be formed directly on an upper substrate of the display panel 20 and/or an outer surface of a lower substrate (e.g., a top surface of the upper substrate or a bottom surface of the lower substrate) or the touch sensor 10 may be formed directly in an inner surface (e.g., a bottom surface of the upper substrate or a top surface of the lower substrate). The touch sensor 10 coupled to the display panel 20 is configured to a touch screen panel (TSP) or a touch display.

A plurality of scan lines (or gate lines) and a plurality of data lines may be disposed on the display panel 20. A subpixel may be disposed in an area in which the scan line and the data line intersect.

The display panel 20 may include an active area on which a plurality of subpixels are disposed and an inactive area disposed outside the active area. The active area may include the display screen of the touch input device. The display screen may have a rectangular shape in which a vertical length is longer than a horizontal length.

To control the display panel 20, the display circuitry 25 may include a gate driving circuit for driving various signal lines disposed on the display panel 20, a data driving circuit, and a display controller.

The gate driving circuit, controlled by the display controller, may control the driving timing of a plurality of subpixels by sequentially outputting display scan signals to a plurality of scan lines disposed on a display panel.

The data driving circuit may receive image data from the display controller and convert the image data into an analog-type data voltage. The data-driving circuit may control each subpixel to express brightness based on image data by outputting the data voltage (Vdata) to each data line according to the timing that the scan signal is applied to the scan line.

The display controller may supply various control signals to the gate driving circuit and the data driving circuit. The display controller controls operations of the gate driving circuit and the data driving circuit.

The touch sensor 10 includes a plurality of driving electrodes Tx0, Tx1, Tx2, etc., and a plurality of receiving electrodes Rx0, Rx1, Rx2, Rx3, etc.

The plurality of driving electrodes Tx0, Tx1, Tx2, etc., and the plurality of receiving electrodes Rx0, Rx1, Rx2, Rx3, etc., may be arranged to intersect each other. In particular, a mutual capacitance may be formed at their intersection between the plurality of driving electrodes Tx0, Tx1, Tx2, etc., and the plurality of receiving electrodes Rx0, Rx1, Rx2, Rx3, etc., at their intersections. The capacitance may be changed by an object in contact with or in proximity to the surface of the touch input device.

Each of the driving electrodes Tx0, Tx1, Tx2, etc., extends in a first direction, and each receiving electrode Rx0, Rx1, Rx2, Rx3, etc., extends in a second direction different from the first direction. Here, the second direction may be a direction perpendicular to the first direction.

Each of the plurality of receiving electrodes Rx0, Rx1, Rx2, Rx3, etc., includes a pair of receiving electrode portions Rx0*a* and Rx0*b*, Rx1*a* and Rx1*b*, Rx2*a* and Rx2*b*, Rx3*a* and Rx3*b*, etc. The pair of receiving electrode portions Rx0*a* and Rx0*b*, Rx1*a* and Rx1*b*, Rx2*a* and Rx2*b*, Rx3*a* and Rx3*b*, etc., include a first receiving electrode portion Rx0*a*, Rx1*a*, Rx2*a*, Rx3*a*, etc., and a second receiving electrode portion Rx0*b*, Rx1*b*, Rx2*b*, Rx3*b*, etc.

The first receiving electrode portions Rx0*a*, Rx1*a*, Rx2*a*, Rx3*a*, etc., among the plurality of receiving electrodes Rx0, Rx1, Rx2, Rx3, etc., may be arranged to form mutual capacitance (cm) with a portion of driving electrodes Tx0, Tx2, Tx4, Tx6, etc., among the plurality of driving electrodes Tx0, Tx1, Tx2, etc. The second receiving electrode portions Rx0*b*, Rx1*b*, Rx2*b*, Rx3*b*, etc., among the plurality of receiving electrodes Rx0, Rx1, Rx2, etc., may be arranged to form mutual capacitance with the remaining portion of driving electrodes Tx1, Tx3, Tx5, Tx7, etc., among the plurality of driving electrodes Tx0, Tx1, Tx2, etc.

The first receiving electrode portions Rx0*a*, Rx1*a*, Rx2*a*, Rx3*a*, etc., among the plurality of receiving electrodes Rx0, Rx1, Rx2, Rx3, etc., may be disposed immediately adjacent to the remaining portions of driving electrodes Tx0, Tx2, Tx4, Tx6, etc., among the plurality of driving electrodes Tx0, Tx1, Tx2, etc., Further the first receiving electrode portions Rx0*a*, Rx1*a*, Rx2*a*, Rx3*a* may be disposed not to be immediately adjacent to but spaced apart by a predetermined distance from the remaining portion of driving electrodes Tx1, Tx3, Tx5, Tx7, etc. Here, at least one different electrode may be disposed between the first receiving electrode portions Rx0*a*, Rx1*a*, Rx2*a*, Rx3*a*, etc., and the remaining portion of driving electrodes Tx1, Tx3, Tx5, Tx7, etc. The different electrodes may be a portion of driving electrodes Tx0, Tx2, Tx4, Tx6, etc.

The second receiving electrode portions Rx0*b*, Rx1*b*, Rx2*b*, Rx3*b*, etc., c. among the plurality of receiving electrodes Rx0, Rx1, Rx2, etc., may be disposed to be immediately adjacent to the remaining portion of driving electrodes Tx1, Tx3, Tx5, Tx7, etc., among the plurality of driving electrodes Tx0, Tx1, Tx2, etc., and the second receiving electrode portions Rx0*b*, Rx1*b*, Rx2*b*, Rx3*b*, etc., may be disposed not to be immediately adjacent to but spaced a predetermined distance from a portion of driving electrodes Tx0, Tx2, Tx4, Tx6, etc., among the plurality of driving electrodes Tx0, Tx1, Tx2, etc. Here, at least one different electrode may be disposed between the second receiving electrode portions Rx0*b*, Rx1*b*, Rx2*b*, Rx3*b*, etc., and a portion of driving electrodes Tx0, Tx2, Tx4, Tx6, etc. The different electrodes may be the remaining portion of driving electrodes Tx1, Tx3, Tx5, Tx7, etc.

When a driving signal is applied to a portion of driving electrodes Tx0, Tx2, Tx4, Tx6, etc., a first signal is output from a first receiving electrode portion Rx0*a*, Rx1*a*, Rx2*a*, Rx3*a*, etc., which forms mutual capacitance and a second signal is output from a second receiving electrode portions Rx0*b*, Rx1*b*, Rx2*b*, Rx3*b*, etc., which do not substantially form mutual capacitance. The circuitry 15 may output a third signal by subtracting or differentially amplifying the second signal from the first signal and the circuitry 15 may detect a touch position of an object based on the third signal. Here, the first signal includes information on an amount of change in mutual capacitance caused by the object, a display noise (e.g., Zebra noise), an amount of image change, an LGM noise in a floating state, and the noise of Cathode re-transmission and the like. The cathode re-transmission phenomenon is a phenomenon in which, as a magnitude of resistance (RELVSS) of the ELVSS layer increases (i.e., as GND becomes weaker), a signal having a high frequency is also transmitted to the RX sensor and added to a main signal. On the other hand, the second signal contains almost no information on the amount of change in mutual capacitance caused by the object but includes the remaining noise information. The remaining noise information may include display noise (e.g., Zebra noise), an amount of change according to image change, an LGM noise in a floating state, noise due to a cathode re-transmission phenomenon, and the like. Therefore, since the detection unit 11 subtracts the second signal from the first signal, noise information does not exist in the signal input to the controller 13. However, only information on the amount of change in mutual capacitance caused by the object may be included.

Conversely, when a driving signal is applied to the remaining portion of driving electrodes Tx1, Tx3, Tx5, Tx7, etc., a second signal is output from the second receiving electrode portions Rx0*b*, Rx1*b*, Rx2*b*, Rx3*b*, etc., which form mutual capacitance, and a first signal is output from the first receiving electrode portions Rx0*a*, Rx1*a*, Rx2*a*, Rx3*a*, etc., which do not substantially form mutual capacitance therewith. The circuitry 15 may subtract or differentially amplify the first signal from the second signal to output a third signal and the circuitry 15 may detect the touch position of the object based on the third signal. Here, since the second signal includes information on the amount of change in mutual capacitance caused by the object, noise information does not exist in the third signal obtained by subtracting the first signal from the second signal, and only information on the amount of change in mutual capacitance caused by the object is included in the third signal.

The plurality of driving electrodes Tx0, Tx1, Tx2, etc., and the plurality of receiving electrodes Rx0, Rx1, Rx2, etc., may be disposed together on the same layer (1 layer) or in different double layers (2 layers), respectively. In addition, some of the plurality of driving electrodes Tx0, Tx1, Tx2, etc., may be disposed on a different layer from the other driving electrodes. Some of the plurality of receiving electrodes Rx0, Rx1, Rx2, etc., may also be disposed on a different layer from the other receiving electrodes. The plurality of driving electrodes Tx0, Tx1, Tx2, etc., and the plurality of receiving electrodes Rx0, Rx1, Rx2, etc., may have a diamond pattern, a circular shape, an elliptical shape, or a polygonal shape.

The plurality of driving electrodes Tx0, Tx1, Tx2, etc., and a plurality of receiving electrodes Rx0, Rx1, Rx2, etc., may be composed of a metal mesh and patterned on a thin film encapsulation (TFE) layer within the display panel 20.

Figure 38:
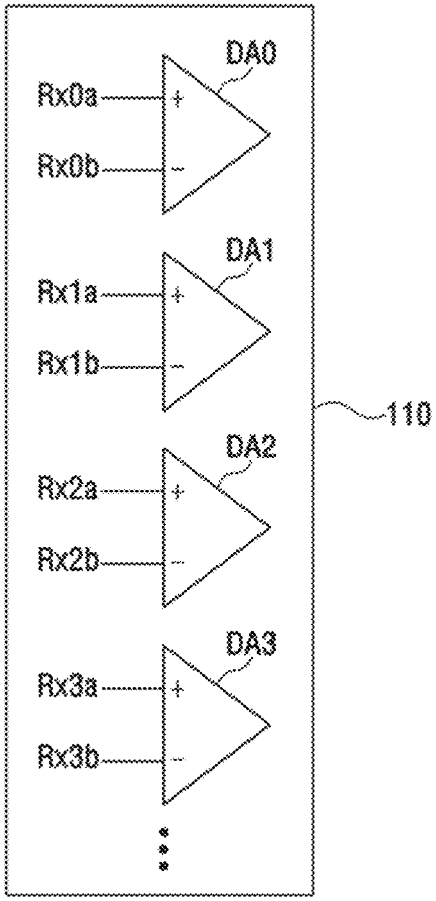
FIG. 38 is a schematic diagram showing a receiving circuit unit 110 according to an embodiment of a circuitry 15 shown in FIG. 37.

FIG. 38 is a schematic diagram showing a receiving circuit unit 110 according to an embodiment of a circuitry 15 shown in FIG. 37.

Referring to FIG. 38, the receiving circuit unit 110 is electrically connected to the plurality of receiving electrodes Rx0, Rx1, Rx2, Rx3, etc., of the touch sensor 10 shown in FIG. 37.

Each of the plurality of receiving electrodes Rx0, Rx1, Rx2, Rx3, etc., of the touch sensor 10 shown in FIG. 37 includes a pair of receiving electrode portions Rx0*a* and Rx0*b*, Rx1*a* and Rx1*b*, Rx2*a* and Rx2*b*, Rx3*a* and Rx3*b*, etc.

The receiving circuit unit 110 may include a plurality of differential amplifiers DA0, DA1, DA2, DA3, etc. Each of the differential amplifiers DA0, DA1, DA2, DA3, etc., includes a pair of inputs. Each of the differential amplifiers DA0, DA1, DA2, DA3, etc., may differentially amplify and output the two signals received through the pair of input terminals.

The pair of input terminals corresponds to a pair of receiving electrode portions Rx0*a* and Rx0*b*, Rx1*a* and Rx1*b*, Rx2*a* and Rx2*b*, Rx3*a* and Rx3*b* of each of receiving electrodes Rx0, Rx1, Rx2, Rx3, etc., of the touch sensor 10. For example, the pair of input terminals of the 0th differential amplifier DA0 is electrically connected to the pair of receiving electrode portions Rx0*a* and Rx0*b* of the 0th receiving electrode Rx0, respectively. In this way, the remaining differential amplifiers DA1, DA2, DA3, etc., are electrically connected to the remaining receiving electrodes Rx1, Rx2, Rx3, etc.

A signal output to an output terminal of each of the differential amplifiers DA0, DAL, DA2, DA3, etc., may be a differential signal or a single signal.

The receiving circuit unit 110 may be included in the detection unit 11 shown in FIG. 37.

Figure 39:
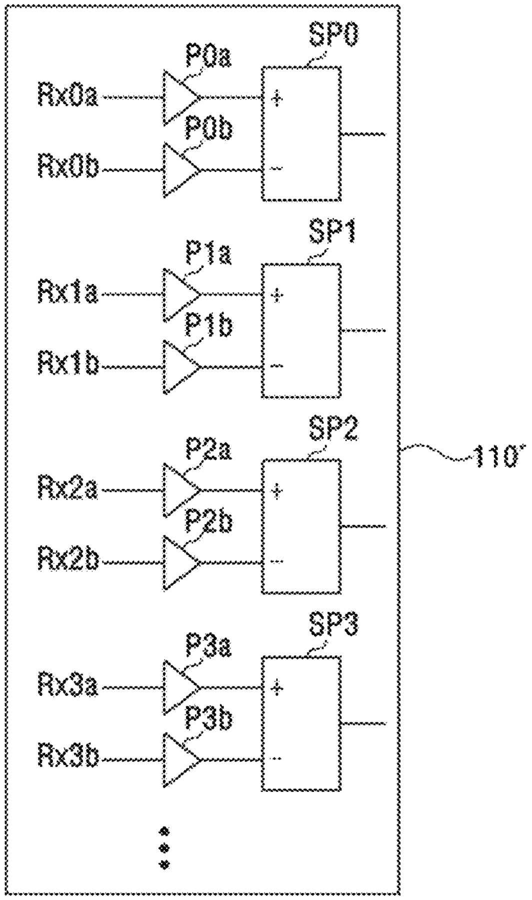
FIG. 39 is a schematic diagram showing a receiving circuit unit 110' according to another embodiment of the circuitry 15 shown in FIG. 37.

FIG. 39 is a schematic diagram showing a receiving circuit unit 110' according to another embodiment of the circuitry 15 shown in FIG. 37.

Referring to FIG. 39, the receiving circuit unit 110' is electrically connected to the plurality of receiving electrodes Rx0, Rx1, Rx2, Rx3, etc., of the touch sensor 10 shown in FIG. 37.

The receiving circuit unit 110' includes a plurality of amplifiers P0*a*, P0*b*, P1*a*, P1*b*, P2*a*, P2*b*, P3*a*, P3*b*, etc., and a plurality of signal processors SP0, SP1, SP2, SP3, etc.

Each of a pair of receiving electrode portions Rx0*a* and Rx0*b*, Rx1*a* and Rx1*b*, Rx2*a* and Rx2*b*, Rx3*a* and Rx3*b*, etc., of each of the receiving electrodes Rx0, Rx1, Rx2, Rx3, etc., of the touch sensor 10 is electrically connected to the input terminal of a pair of amplifiers P0*a* and P0*b*, P1*a* and P1*b*, P2*a* and P2*b*, P3*a* and P3*b*, etc.

Each of signal processors SP0, SP1, SP2, SP3, etc., is electrically connected to the output terminals of the pair of amplifiers P0*a* and P0*b*, P1*a* and P1*b*, P2*a* and P2*b*, P3*a* and P3*b*, etc. One of the pair of amplifiers P0*a* and P0*b*, P1*a* and P1*b*, P2*a* and P2*b*, P3*a* and P3*b*, etc., may be connected to positive (+) input terminals of the signal processors SP0, SP1, SP2, SP3, etc., and the other amplifiers P0*b*, P1*b*, P2*b*, P3*b*, etc., may be connected to negative (−) input terminals of the signal processors SP0, SP1, SP2, SP3, etc.

The receiving circuit unit 110' shown in FIG. 39, after receiving a signal from the pair of receiving electrode portions Rx0*a* and Rx0*b*, Rx1*a* and Rx1*b*, Rx2*a* and Rx2*b*, Rx3*a* and Rx3*b* of each of receiving electrodes Rx0, Rx1, Rx2, Rx3, etc., Rx3*b*, etc., through the input terminal as a single-ended input, a differential operation may be performed by an amplifier and a signal processing unit.

On the other hand, an analog signal from the pair of receiving electrodes Rx0*a* and Rx0*b*, Rx1*a* and Rx1*b*, Rx2*a* and Rx2*b*, Rx3*a*, and Rx3*b*, etc., of the receiving circuit unit 110' shown in FIG. 39 may be converted into a digital signal, and then performed in a digital block.

Figure 40:
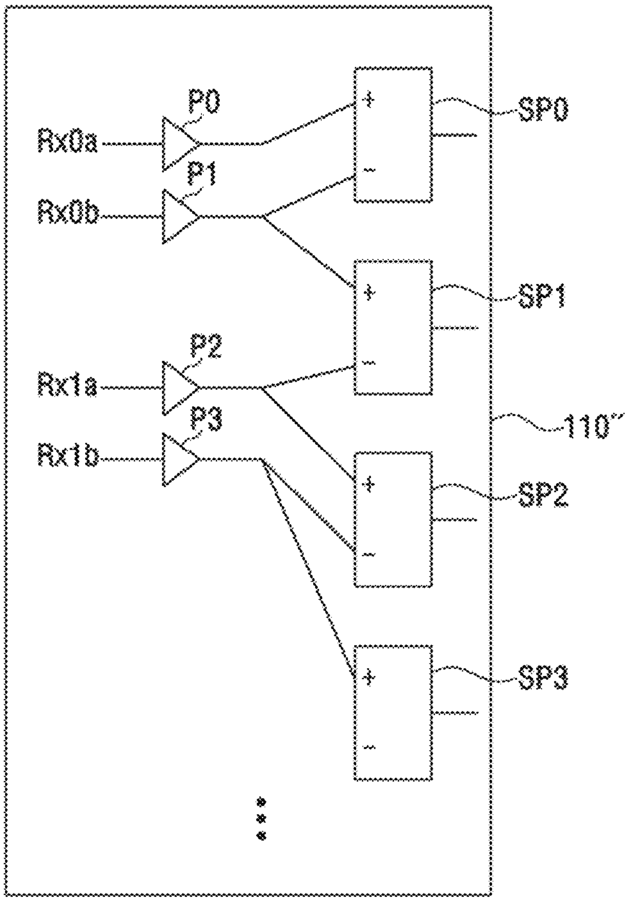
FIG. 40 is a schematic diagram showing a receiving circuit unit 110" according to another embodiment of the circuitry 15 shown in FIG. 37.

FIG. 40 is a schematic diagram showing a receiving circuit unit 110" according to another embodiment of the circuitry 15 shown in FIG. 37.

Referring to FIG. 40, the receiving circuit unit 110" is electrically connected to the plurality of receiving electrodes Rx0, Rx1, Rx2, Rx3, etc., of the touch sensor 10 shown in FIG. 37.

The receiving circuit unit 110" includes a plurality of amplifiers P0, P1, P2, P3, etc., and a plurality of signal processors SP0, SP1, SP2, SP3, etc.

The receiving electrode portions Rx0*a*, Rx0*b*, Rx1*a*, Rx1*b*, etc., of the plurality of receiving electrodes Rx0, Rx1, Rx2, Rx3, etc., of the touch sensor 10 are electrically connected to the input terminals of the plurality of amplifiers P0, P1, P2, P3, etc., in a one-to-one corresponding manner. For example, the 0th amplifier P0 is connected to the first receiving electrode portion Rx0*a* of the 0th receiving electrode Rx0. The first amplifier P1 is connected to the second receiving electrode portion Rx0*b* of the 0th receiving electrode Rx0. The second amplifier P2 is connected to the first receiving electrode portion Rx1*a* of the first receiving electrode Rx1. The third amplifier P3 is connected to the second receiving electrode portion Rx1*b* of the first receiving electrode Rx1. In this way, other receiving electrode portions are electrically connected to the plurality of amplifiers.

Output terminals of the plurality of amplifiers P0, P1, P2, P3, etc., are electrically connected to the plurality of signal processors SP0, SP1, SP2, SP3, etc. Here, the remaining amplifiers are electrically connected to two signal processors, respectively, except the 0th amplifier P0, which is a first amplifier, and a last amplifier. Meanwhile, although not shown in separate drawings, the 0th amplifier P0, which is the first of the amplifier, and the last amplifier may be electrically connected to a separate signal processor. The separated signal processor may output a difference between an output signal of the 0th amplifier P0 and an output signal of the last amplifier.

Each of signal processors SP0, SP1, SP2, SP3, etc., is electrically connected to the output terminals of two amplifiers among the plurality of amplifiers P0, P1, P2, P3, etc. In other words, each of the signal processors SP0, SP1, SP2, SP3, etc., may be configured to receive a differential signal between the receiving electrode portions. For example, the output terminal of the 0th amplifier P0 may be connected to the positive (+) terminal of the 0th signal processor SP0. The output terminal of the first amplifier P1 may be connected to the negative (−) terminal of the 0th signal processor SP1. The output terminal of the first amplifier P1 may be connected to the positive (+) terminal of the first signal processor SP1. The output terminal of the second amplifier P2 may be connected to the negative (−) terminal of the first signal processor SP1. The output terminal of the second amplifier P2 may be connected to the positive (+) terminal of the second signal processor SP2. The output terminal of the third amplifier P3 may be connected to the negative (−) terminal of the second signal processor SP2. The output terminal of the third amplifier P3 may be connected to the positive (+) terminal of the third signal processor SP3. The output terminal of the fourth amplifier (not shown) may be connected to a negative (−) terminal of the third signal processor SP3. Repetitively in this way, the remaining amplifiers that are not shown in the drawing may be electrically connected to the signal processors.

Figure 41A:
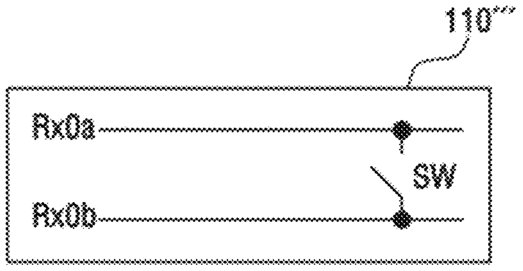
FIGS. 41A and 41B are views showing receiving circuit units 110"' and 110"" according to another embodiment of the circuitry 15 shown in FIG. 37.
Figure 41B:
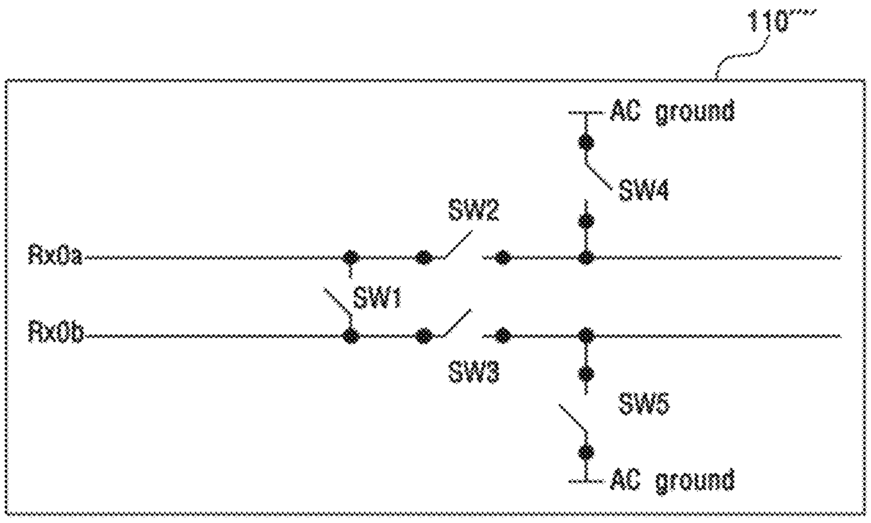

According to the receiving circuit unit 110" shown in FIG. 40, it is possible to prevent erroneous touch operation in a special situation in which water is disposed on the touch sensor 10 or a metal object such as a coin is disposed on the touch sensor 10 shown in FIG. 37. FIGS. 41A and 41B are views showing receiving circuit units 110'" and 110"" according to another embodiment of the circuitry 15 shown in FIG. 37.

Referring to FIG. 41A, the receiving circuit unit 110'" includes a switch element SW for electrically shorting or opening a pair of receiving electrode portions Rx0*a* and Rx0*b* of each receiving electrode Rx0. The switch element SW is controlled by a control unit (not shown). When the switch element SW is closed, a pair of receiving electrode portions Rx0*a* and Rx0*b* of each receiving electrode Rx0 are electrically connected. Meanwhile, although not shown, a switch element may be disposed between a pair of receiving electrode portions of another receiving electrode.

In the receiving circuit unit 110'", the switch element SW may be controlled to connect electrically the pair of receiving electrode portions Rx0*a* and Rx0*b*. This control method may be used when driving the touch sensor 10 shown in FIG. 37 to a self-sensing mode or a stylus sensing mode for sensing a pen signal from a stylus.

Methods for driving the touch sensor 10 include self-sensing and mutual-sensing. The self-sensing is a method of recognizing whether or not an object is touched and/or a touch position from a change in capacitance of each electrode itself by applying a driving signal to each electrode and receiving a sensing signal from the corresponding electrode at the same time. On the other hand, the mutual-sensing is a method of detecting a change of mutual capacitance between a driving electrode and a receiving electrode by an object. The circuitry 15 controls the touch sensor 10 to detect whether or not an object is touched and/or a position of a touch by using any one of the above two methods, or by using both methods. Here, when both methods are used, the circuitry 15 may control each of the two methods to operate independently using time division.

Referring to FIG. 41B, the receiving circuit unit 110"" includes a plurality of switch elements SW1, SW2, SW3, SW4, and SW5.

The first switch element SW1 performs the same role as the switch element SW shown in FIG. 41A. The first switch element SW1 is connected between the pair of receiving electrode portions Rx0*a* and Rx0*b*. The first switch element SW1 may be shorted or opened according to the control of a controller (not shown).

The second to fifth switch elements SW2, SW3, SW4, and SW5 may control to connect any of the receiving electrodes among the pair of receiving electrode portions Rx0*a* and Rx0*b* of each receiving electrode Rx0 to the input terminal of an amplifier (not shown).

The second switch element SW2 may be connected to one end of the first switch element SW1. The third switch element SW3 may be connected to the other end of the first switch element SW1.

The fourth switch element SW4 is connected between the output terminal of the second switch element SW2 and the AC ground. The fifth switch element SW5 is connected between the output terminal of the third switch element SW3 and the AC ground.

On the other hand, the second and fifth switch elements SW2 and SW5 or the third and fourth switch elements SW3 and SW4 may be omitted depending on whether any of the receiving electrode portions between the pair of receiving electrode portions Rx0*a* and Rx0*b* is connected to the input terminal of an amplifier (not shown).

The receiving circuit unit 110'''' controls the first switch element SW1. The receiving circuit unit 110'''' electrically connects the pair of receiving electrode portions Rx0*a* and Rx0*b* and controls the touch sensor 10 shown in FIG. 37 to be in the self-sensing mode or the stylus sensing mode. In addition, the receiving circuit unit 110'''' controls the second to fifth switch elements SW2, SW3, SW4, and SW5 to connect any of the receiving electrode portions between the pair of receiving electrode portions Rx0*a* and Rx0*b* to another electronic device (e.g., an amplifier).

Figure 42:
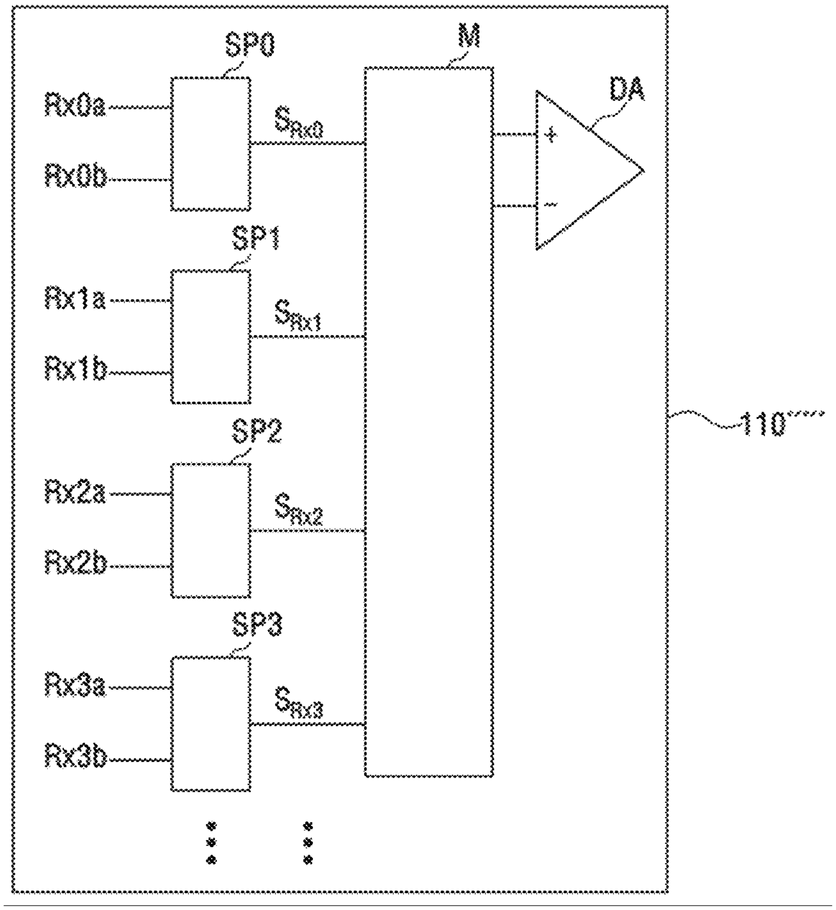
FIG. 42 is a schematic diagram showing a receiving circuit unit 110""' according to another embodiment of the circuitry 15 shown in FIG. 37.

FIG. 42 is a schematic diagram showing a receiving circuit unit 110''''' according to another embodiment of the circuitry 15 shown in FIG. 37.

Referring to FIG. 42, the receiving circuit unit 110''''' may include a plurality of switching units SP0, SP1, SP2, SP3, etc., a multiplexer M, and a differential amplifier DA.

Each switching unit SP0, SP1, SP2, SP3, etc., electrically connects or opens a pair of receiving electrode portions Rx0*a* and Rx0*b*, etc., of each receiving electrode to each other according to a control signal. For example, a pair of input terminals of the 0th switching unit SP0 is electrically connected to a pair of receiving electrode portions Rx0*a* and Rx0*b* of the 0th receiving electrode, and one output terminal is connected to one input terminal among a plurality of input terminals of the multiplexer M. The other switching units SP1, SP2, SP3, etc., are connected in the same manner.

The multiplexer M includes a plurality of input terminals connected with the output terminals of the plurality of switching units SP0, SP1, SP2, SP3, etc., in a one-to-one corresponding manner, and further includes at least two output terminals. The two output terminals are respectively connected to the two input terminals of the differential amplifier DA.

The receiving circuit unit 110''''' may remove a display noise caused by driving the display panel 20 shown in FIG. 37. Specifically, when the touch sensor 10 shown in FIG. 37 drives in the pen sensing mode for sensing the pen signal from a stylus, the receiving circuit unit 110''''' electrically connects the plurality of switching units SP0, SP1, SP2, SP3, etc., to the pair of receiving electrode portions Rx0*a* and Rx0*b*, Rx1*a* and Rx1*b*, Rx2*a* and Rx2*b*, Rx3*a* and Rx3*b*. The receiving circuit unit 110''''' controls the multiplexer M to output two signals to the differential amplifier DA among a plurality of signals SRx0, SRx1, SRx2, SRx3, etc., of a plurality of switching units SP0, SP1, SP2, SP3, etc. The receiving circuit unit 110''''' may differentially amplify the two signals selected by the multiplexer M. The differentially amplified signal includes the mostly removed display noise of the display panel 20, and the receiving circuit unit 110''''' prevents a touch malfunction and improves touch sensitivity.

Figure 43:
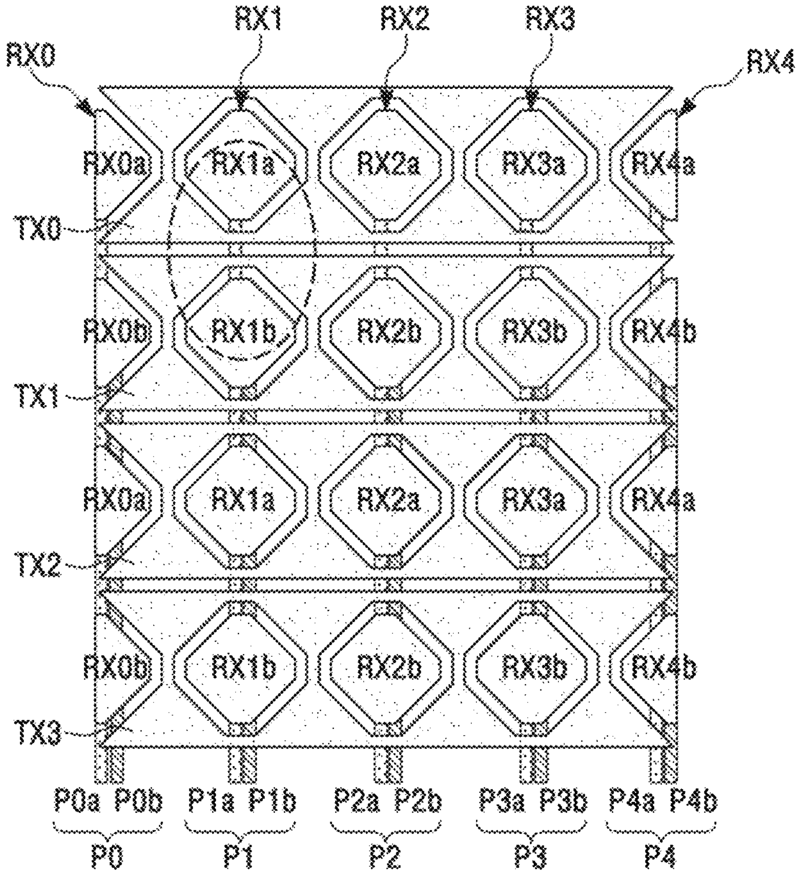
FIG. 43 is a plan view showing a portion of an embodiment of a touch sensor 10 shown in FIG. 37.

FIG. 43 to 17 are schematic diagrams for showing various embodiments of the touch sensor 10 shown in FIG. 37.

Figure 44A:
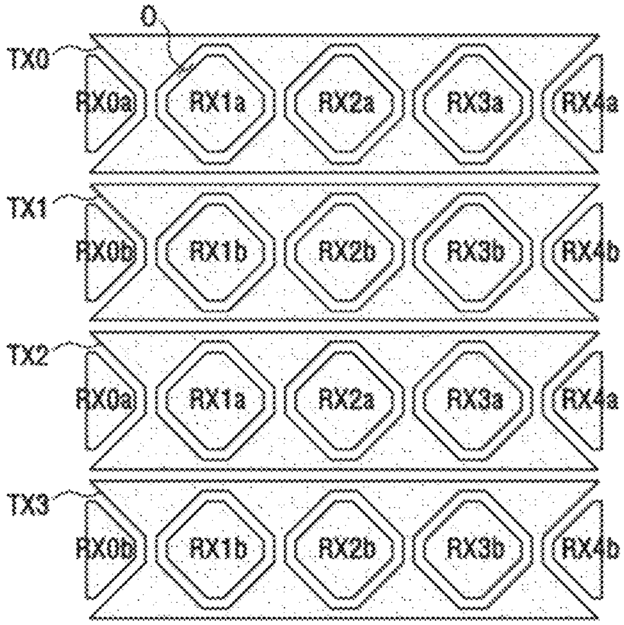
FIGS. 44A and 44B are plan views in which the touch sensor shown in FIG. 43 is separated by layers.
Figure 44B:
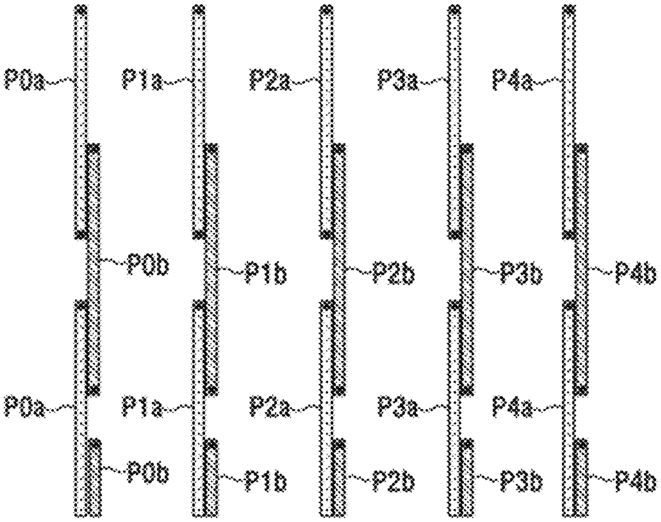
Figure 45:
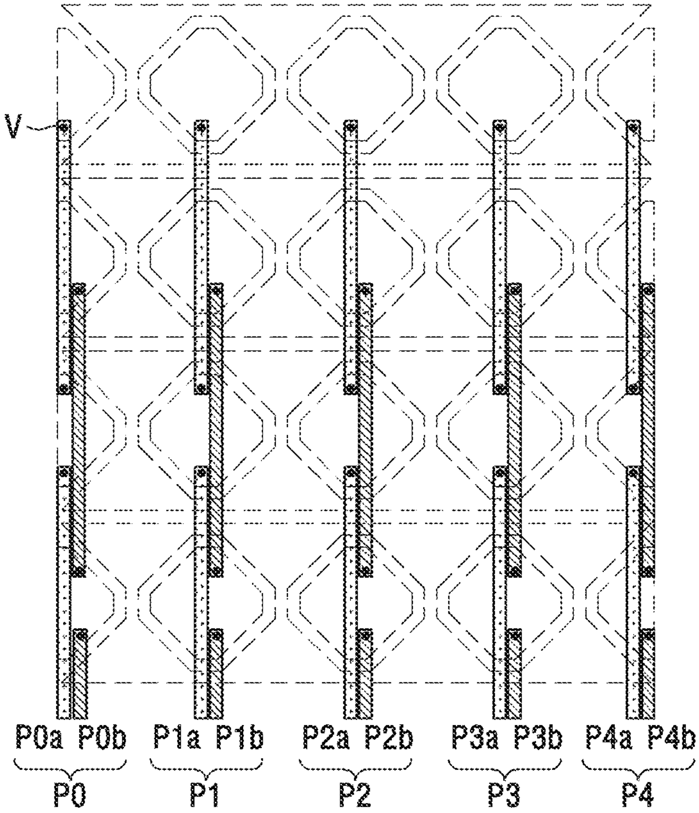
FIG. 45 is a view for explaining electrical connection of a plurality of receiving electrodes shown in FIG. 43.

FIG. 43 is a plan view showing a portion of an embodiment of a touch sensor 10 shown in FIG. 37. FIGS. 44A and 44B are plan views in which the touch sensor shown in FIG. 43 is separated by layers. FIG. 45 is a view for explaining electrical connection of a plurality of receiving electrodes shown in FIG. 43.

Referring to FIGS. 8 to 10, a touch sensor according to an embodiment of the present invention may be disposed on a display panel or inside the display panel.

The touch sensor according to an embodiment of the present invention includes a plurality of first electrodes and a plurality of second electrodes. Among the plurality of first electrodes and the plurality of second electrodes, the electrodes to which the driving signal is applied may be driving electrodes, and the remaining electrodes may be receiving electrodes. Hereinafter, the plurality of first electrodes may be a plurality of driving electrodes TX0, TX1, TX2, TX3, etc., and the plurality of second electrodes may be a plurality of receiving electrodes RX0, RX1, RX2, RX3, RX4, etc.

The plurality of driving electrodes TX0, TX1, TX2, TX3, etc., may include a 0th driving electrode TX0, a first driving electrode TX1, a second driving electrode TX2, and a third driving electrode TX3. Here, the plurality of driving electrodes TX0, TX1, TX2, TX3, etc., correspond to the plurality of driving electrodes Tx0, Tx1, Tx2, etc., shown in FIG. 37.

The plurality of receiving electrodes RX0, RX1, RX2, RX3, RX4, etc., may include a 0th receiving electrode RX0, a first receiving electrode RX1, a second receiving electrode RX2, a third receiving electrode Rx3, and a fourth receiving electrode Rx4. Here, the plurality of receiving electrodes RX0, RX1, RX2, RX3, RX4, etc., correspond to the plurality of receiving electrodes Rx0, Rx1, Rx2, Rx3, Rx4, etc., shown in FIG. 37.

The plurality of driving electrodes TX0, TX1, TX2, TX3, etc., are arranged along the second direction (or vertical direction). Each of the plurality of driving electrodes TX0, TX1, TX2, TX3 . . . extends in the first direction (or horizontal direction) perpendicular to the second direction. The plurality of receiving electrodes RX0, RX1, RX2, RX3, RX4, etc., may be arranged along the second direction. Conversely, the plurality of driving electrodes TX0, TX1, TX2, TX3, etc., are arranged along the first direction (or horizontal direction), and the plurality of receiving electrodes RX0, RX1, RX2, RX3, RX4, etc., may be arranged along the second direction (or vertical direction).

A capacitance may be formed between the plurality of driving electrodes TX0, TX1, TX2, TX3, etc., and the plurality of receiving electrodes RX0, RX1, RX2, RX3, RX4, etc. This capacitance changes when a touch input occurs at or around a corresponding point. Accordingly, it is possible to detect whether a touch occurs and a touch input by detecting the capacitance variation of a signal from the plurality of receiving electrodes RX0, RX1, RX2, RX3, RX4, etc.

Each of the plurality of driving electrodes TX0, TX1, TX2, TX3, etc., may have a shape of a rectangular pattern or a bar pattern extending in the first direction and have a plurality of openings O arranged along the first direction therein.

One receiving electrode may be disposed in each opening O. The shape of each opening O corresponds to a shape of one receiving electrode disposed therein. For example, as shown in FIG. 43, the rest of the plurality of openings O except the openings disposed at the left and right edges may have a lozenge shape. The openings disposed at the left and right edges may have a triangular shape among the plurality of openings O. Although not shown in the drawings, all of the openings O may each have a lozenge shape. Alternatively, the plurality of openings O may have various shapes such as a polygonal shape, a rectangular shape, a circular shape, or an elliptical shape.

Each receiving electrode Rx0, RX1, RX2, RX3, RX4, etc., has a plurality of receiving electrode patterns Rx0*a*, RX0*b*, RX1*a*, RX1*b*, RX2*a*, RX2*b*, RX3*a*, RX3*b*, RX4*a*, RX4*b* and connection patterns P0, P1, P2, P3, P4. Here, some receiving electrode patterns RX0*a*, RX1*a*, RX2*a*, RX3*a*, RX4*a* among the plurality of receiving electrode patterns RX0*a*, RX0*b*, RX1*a*, RX1*b*, RX2*a*, RX2*b*, RX3*a*, RX3*b*, RX4*a*, RX4*b* corresponds to some receiving electrodes Rx0*a*, Rx1*a*, Rx2*a*, Rx3*a*, etc., in FIG. 37. The remaining receiving electrode patterns RX0*b*, RX1*b*, RX2*b*, RX3*b*, RX4*b* correspond to the remaining receiving electrodes Rx0*b*, Rx1*b*, Rx2*b*, Rx3*b*, Rx4*b*, etc., in FIG. 37.

As shown in FIG. 44A, a plurality of driving electrodes TX0, TX1, TX2, TX3, etc., and a plurality of receiving electrode patterns RX0*a*, RX0*b*, RX1*a*, RX1*b*, RX2*a*, RX2*b*, RX3*a*, RX3*b*, RX4*a*, RX4*b* may be disposed together on a first layer. Here, a plurality of driving electrodes Tx0, TX1, TX2, TX3, etc., and a plurality of receiving electrode patterns Rx0*a*, RX0*b*, RX1*a*, RX1*b*, RX2*a*, RX2*b*, RX3*a*, RX3*b* RX4*a*, RX4*b* disposed on the first layer may be implemented as a metal mesh. As shown in FIG. 44B, the plurality of connection patterns P0*a*, P0*b*, P1*a*, P1*b*, P2*a*, P2*b*, P3*a*, P3*b*, P4*a*, and P4*b* may be disposed on a second layer. The second layer is different from the first layer in FIG. 44A and the second layer is electrically insulated from the first layer. Here, the plurality of connection patterns P0*a*, P0*b*, P1*a*, P1*b*, P2*a*, P2*b*, P3*a*, P3*b*, P4*a*, and P4*b* may be implemented as a metal mesh. The first layer of FIG. 44A may be disposed on the second layer in FIG. 44B, and vice versa.

A plurality of receiving electrode patterns of each receiving electrode may be divided into at least two groups. Each of the receiving electrode patterns of one group is alternately disposed between the receiving electrode patterns of the other group. The receiving electrode patterns in one group are electrically separated from the receiving electrode patterns in the other group. Here, the receiving electrode pattern in one group may be referred to as a first receiving electrode pattern, and the receiving electrode pattern in the other group may be referred to as a second receiving electrode pattern.

The plurality of connection patterns included in each receiving electrode include first connection patterns for electrically connecting first receiving electrode patterns in one group and second connection patterns for electrically connecting second receiving electrode patterns in the other group.

For example, the 0th receiving electrode RX0 may include a plurality of receiving electrode patterns RX0*a* and RX0*b* and a plurality of connection patterns P0. The plurality of receiving electrode patterns RX0*a* and RX0*b* may include a receiving electrode pattern RX0*a* of the first group and a receiving electrode pattern RX0*b* of the second group, the receiving electrode patterns RX0*a* of the first group, and the receiving electrode patterns RX0*b* of the second group are alternately arranged one by one along the second direction. The receiving electrode patterns RX0*a* of the first group and the receiving electrode patterns RX0*b* of the second group may be electrically separated from each other. The 0th connection patterns P0 include first connection patterns P0*a* for electrically connecting the first group of receiving electrode patterns RX0*a* and second connection patterns P0*b* for electrically connecting the receiving electrode patterns RX0*b* of the second group.

The first receiving electrode RX1 may include a plurality of receiving electrode patterns RX1*a* and RX1*b*, and a plurality of connection patterns P1. The plurality of receiving electrode patterns RX1*a* and RX1*b* may include a receiving electrode pattern RX0*a* of the first group and a receiving electrode pattern RX1*b* of the second group, the receiving electrode patterns RX1*a* of the first group, and the receiving electrode patterns RX1*b* of the second group are alternately arranged one by one along the second direction. The receiving electrode patterns RX1*a* of the first group and the receiving electrode patterns RX1*b* of the second group may be electrically separated from each other. The first connection patterns P1 include the first connection pattern P1*a* for electrically connecting the receiving electrode patterns RX1*a* of the first group and the second connection pattern P1*b* for electrically connecting the receiving electrode patterns RX1*b* of the second group.

The second receiving electrode RX2 may include a plurality of receiving electrode patterns RX2*a* and RX2*b*, and a plurality of connection patterns P2. The plurality of receiving electrode patterns RX2*a* and RX2*b* may include a receiving electrode pattern RX2*a* of the first group and a receiving electrode pattern RX2*b* of the second group, the receiving electrode patterns RX2*a* of the first group and the receiving electrode patterns RX2*b* of the second group are alternately arranged one by one along the second direction. The receiving electrode patterns RX2*a* of the first group and the receiving electrode patterns RX2*b* of the second group may be electrically separated from each other. The second connection patterns P2 include the first connection pattern P2*a* for electrically connecting the receiving electrode patterns RX2*a* of the first group and the second connection pattern P2*b* for electrically connecting the receiving electrode patterns RX2*b* of the second group.

The third receiving electrode RX3 may include a plurality of receiving electrode patterns RX3*a* and RX3*b*, and a plurality of connection patterns P3. The plurality of receiving electrode patterns RX3*a* and RX3*b* may include a receiving electrode pattern RX3*a* of the first group and a receiving electrode pattern RX3*b* of the second group, the receiving electrode patterns RX3*a* of the first group, and the receiving electrode patterns RX3*b* of the second group are alternately arranged one by one along the second direction. The receiving electrode patterns RX3*a* of the first group and the receiving electrode patterns RX3*b* of the second group may be electrically separated from each other. The third connection patterns P3 include the first connection pattern P3*a* for electrically connecting the receiving electrode patterns RX3*a* of the first group and the second connection pattern P3*b* electrically for connecting the receiving electrode patterns RX3*b* of the second group.

The fourth receiving electrode RX4 may include a plurality of receiving electrode patterns RX4*a* and RX4*b* and a plurality of connection patterns P4. The plurality of receiving electrode patterns RX4*a* and RX4*b* may include a receiving electrode pattern RX4*a* of the first group and a receiving electrode pattern RX4*b* of the second group, the receiving electrode patterns RX4*a* of the first group, and the receiving electrode patterns RX4*b* of the second group are alternately arranged one by one along the second direction. The receiving electrode patterns RX4*a* of the first group and the receiving electrode patterns RX4*b* of the second group may be electrically separated from each other. The fourth connection patterns P4 include the first connection pattern P4*a* for electrically connecting the receiving electrode patterns RX4*a* of the first group and the second connection pattern P4*b* for electrically connecting the receiving electrode patterns RX4*b* of the second group.

The plurality of receiving electrode patterns RX0*a*, RX0*b*, RX1*a*, RX1*b*, RX2*a*, RX2*b*, RX3*a*, RX3*b*, RX4*a*, and RX4*b* are disposed inside the plurality of openings O of the plurality of driving electrodes TX0, TX1, TX2, TX3, etc. One receiving electrode pattern is disposed inside one opening O. Each receiving electrode pattern has a shape corresponding to that of the corresponding opening.

In an arbitrary receiving electrode RX1, between the receiving electrode patterns RX1*a* of the first group and the receiving electrode patterns RX1*b* of the second group disposed adjacent to each other, a portion of the driving electrode TX0 immediately adjacent to a periphery of the receiving electrode patterns RX1*a* in the first group and a portion of the driving electrode TX1 immediately adjacent to the periphery of the receiving electrode pattern RX1*b* in the second group are disposed together.

An arbitrary driving electrode TX0 is disposed immediately adjacent to the periphery of the first group of receiving electrode patterns RX0*a*, RX1*a*, RX2*a*, RX3*a*, and RX4*a*. Another driving electrode TX1 is disposed immediately adjacent to the periphery of the second group of receiving electrode patterns RX0*b*, RX1*b*, RX2*b*, RX3*b*, and RX4*b*. Another driving electrode TX1 is disposed to be separated from the receiving electrode patterns RX0*a*, RX1*a*, RX2*a*, RX3*a*, and RX4*a* of the first group by the arbitrary driving electrode TX0.

Each connection pattern P0*a*, P0*b*, P1*a*, P1*b*, P2*a*, P2*b*, P3*a*, P3*b*, P4*a*, and P4*b* may have a bar pattern shape extending along the second direction. The connection patterns P0*a*, P0*b*, P1*a*, P1*b*, P2*a*, P2*b*, P3*a*, P3*b*, P4*a*, and P4*b* may include at least one conductive via v. The conductive vias v may be disposed at both ends of each connection pattern.

In the 0th receiving electrode RX0, each of the first connection patterns P0*a* connects electrically two adjacent receiving electrode patterns RX0*a* among the first group of receiving electrode patterns through the conductive via v. Each of the first connection patterns P0*a* is disposed to overlap under the second group of the receiving electrode patterns RX0. Each of the first connection patterns is disposed between the two adjacent receiving electrode patterns RX0*a*. Each of the second connection patterns P0*b* electrically connects two adjacent receiving electrode patterns RX0*b* of the second group of receiving electrode patterns RX0*b* through the conductive via v. Each of the second connection patterns P0*b* is disposed to overlap under the first group of the receiving electrode patterns RX0*a* disposed between the two adjacent receiving electrode patterns RX0*b*. The first connection patterns P1*a*, P2*a*, P3*a*, and P4*a*, and the second connection patterns P1*b*, P2*b*, P3*b*, and P4*b* of the remaining receiving electrodes RX1, RX2, RX3, and RX4 are also disposed in the same manner as described above.

Hereinafter, an operation will be described in detail when a driving signal is applied to at least one of the plurality of driving electrodes TX0, TX1, TX2, and TX3. For convenience of explanation, an operation of the first receiving electrode RX1 and an operation of the detection unit 11 of FIG. 37 will be described in detail.

When driving signals are sequentially or simultaneously applied to the plurality of driving electrodes TX0, TX1, TX2, TX3, two sensing signals are output from the first connection pattern P1. The first signal is a signal output from the first connection pattern P1*a*, and the second signal is a signal output from the second connection pattern P1*b*. Accordingly, the first and second signals of two channels are output for each of the receiving electrodes RX0, RX1, RX2, RX3, and RX4. The first and second signals are simultaneously output, and the first and second signals may be applied to the detection unit 11 of FIG. 37.

According to the driving electrodes TX0, TX1, TX2, TX3, etc., to which the driving signal is applied, either the first signal or the second signal may be an active channel signal (or an active receiving signal ARX), and the other may be a dummy channel signal (or dummy receiving signal DRX). Specifically, when the driving signal is applied to the driving electrodes TX0 and/or TX2 of the first group of receiving electrode patterns RX1*a*, the first signal from the first connection pattern P1*a* is an active channel signal, and the second signal output from the second connection pattern P1*b* becomes a dummy channel signal. On the other hand, when a driving signal is applied to the driving electrodes TX1 or/and TX3 of the receiving electrode pattern RX1*b* of the second group, the second signal output from the second connection pattern P1*b* becomes an active channel signal, and the first signal output from the first connection pattern P1*a* becomes a dummy channel signal.

For example, as shown in FIG. 43, it is assumed that an object (dotted line) approaches or contacts an intersection point between the first driving electrode TX1 and the first receiving electrode RX1. When a driving signal is applied to the first driving electrode TX1, the capacitance (or mutual active capacitance) formed between the receiving electrode pattern RX1*b* belonging to the second group of the first receiving electrode RX1 and the first driving electrode TX1 may change. The second signal including the changed capacitance variation information is an active channel signal, and the second signal is output from the second connection pattern P1*b*.

Meanwhile, capacitance (or dummy capacitance) formed between the receiving electrode patterns RX1*a* belonging to the first group of the first receiving electrodes RX1 and the first driving electrode TX1 may also change. The first signal including capacitance variation information is a dummy channel signal output from the first connection pattern P1*a*.

The detection unit 11 shown in FIG. 37 subtracts the first signal output from the second signal. The first signal is output from the first connection pattern P1*a*, the second signal is output from the second connection pattern P1*b*. As a result, all or most of the cathode retransmission noise signal, the LGM noise signal, the display noise signal of the receiving electrode pattern RX1*b* of the second group, and the receiving electrode pattern RX1*a* of the first group may be canceled out.

Figure 46:
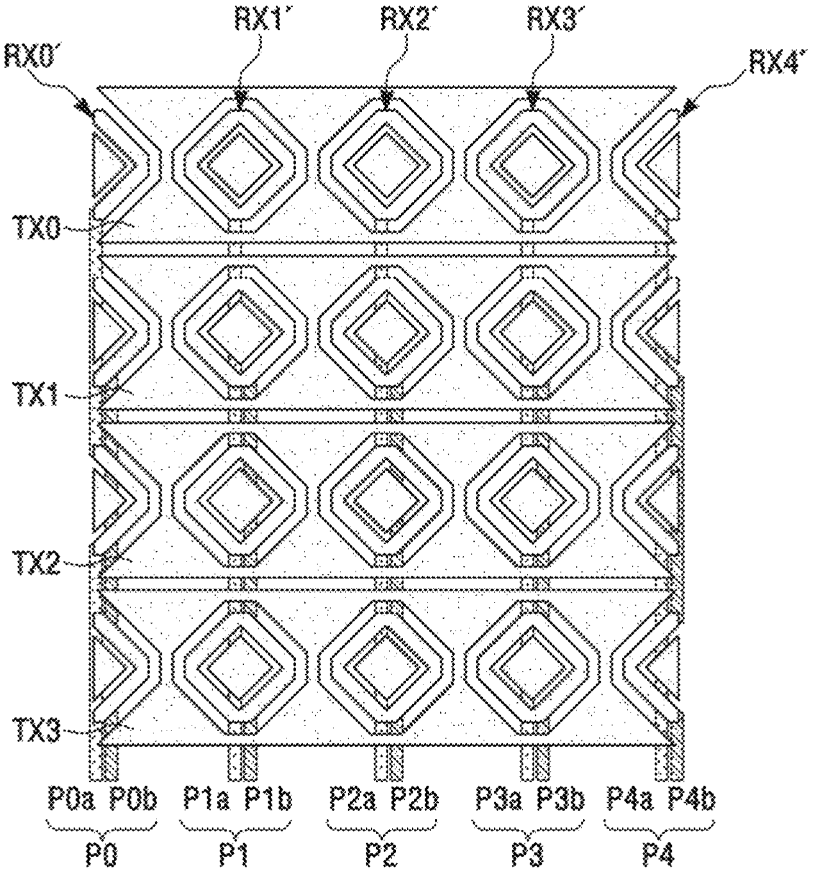
FIG. 46 is a plan view of a portion of another embodiment of the touch sensor 10 shown in FIG. 37.
Figure 47A:
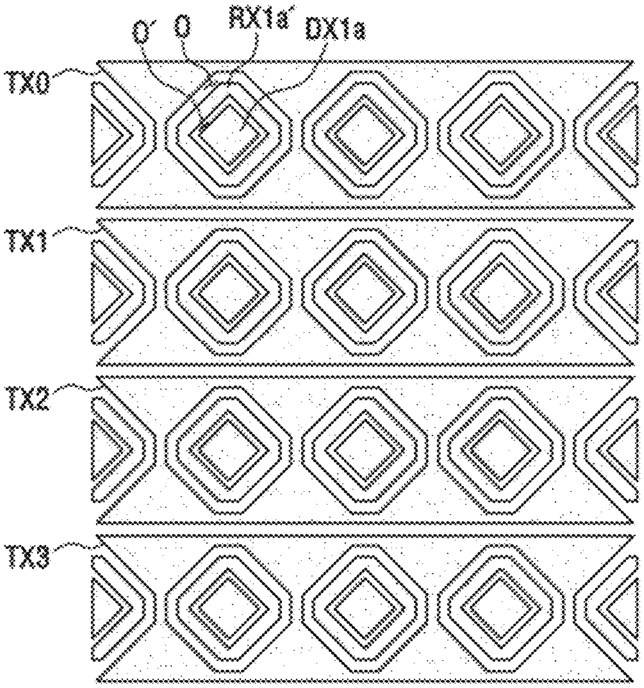
FIGS. 47A and 47B are plan views in which the touch sensor shown in FIG. 46 is separated by layers.
Figure 47B:
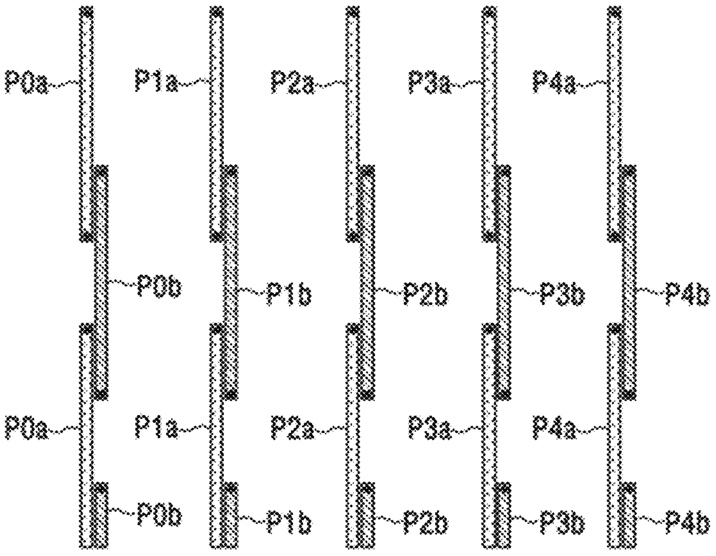
Figure 48:
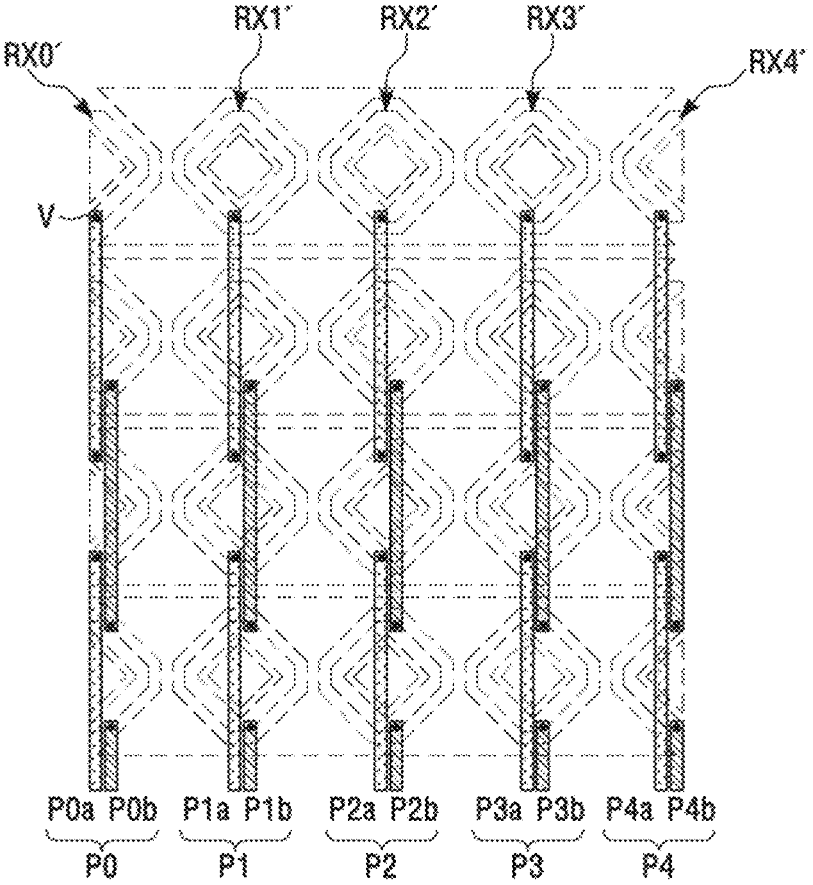
FIG. 48 is a view for explaining electrical connection of a plurality of receiving electrodes shown in FIG. 46.

FIG. 46 is a plan view of a portion of another embodiment of the touch sensor 10 shown in FIG. 37. FIGS. 47A and 47B are plan views in which the touch sensor shown in FIG. 46 is separated by layers. FIG. 48 is a view for explaining electrical connection of a plurality of receiving electrodes shown in FIG. 46.

Compared to the touch sensor of the embodiments of FIGS. 43 to 45, a touch sensor according to another embodiment of the present invention shown in FIGS. 46 to 48 has a difference in a plurality of receiving electrodes Rx0', RX1', RX2', RX3', and RX4'. In particular, structures of the plurality of receiving electrode patterns RX1*a*' included in the respective receiving electrodes RX0', RX1', RX2', RX3', and RX4' are different. Hereinafter, the structures of the plurality of receiving electrode patterns RX1*a*' will be described in detail. Descriptions of remaining configurations will refer to the above descriptions.

The plurality of receiving electrode patterns RX1a' included in each of the receiving electrodes RX0', RX1', RX2', RX3', and RX4' have an opening O' therein, and a dummy pattern DX1a is disposed inside the opening O'. Here, the dummy pattern DX1a may have a shape corresponding to that of the opening O'.

The dummy pattern DX1a is not electrically connected to the connection patterns P0a, P0b, P1a, P1b, P2a, P2b, P3a, P3b, P4a, and P4b. The dummy pattern DX1a remains electrically floating.

An operation of the touch sensor according to another embodiment of the present invention shown in FIGS. 46 to 48 is the same as that of the touch sensor according to an embodiment of the present invention shown in FIGS. 43 to 45. Therefore, the touch input device including the touch sensor according to another embodiment of the present invention shown in FIGS. 46 to 48 also has an advantage of being able to remove various noises occurring at touch sensing, e.g., the cathode retransmission noise signal, the display noise, and the LGM noise.

Figure 49:
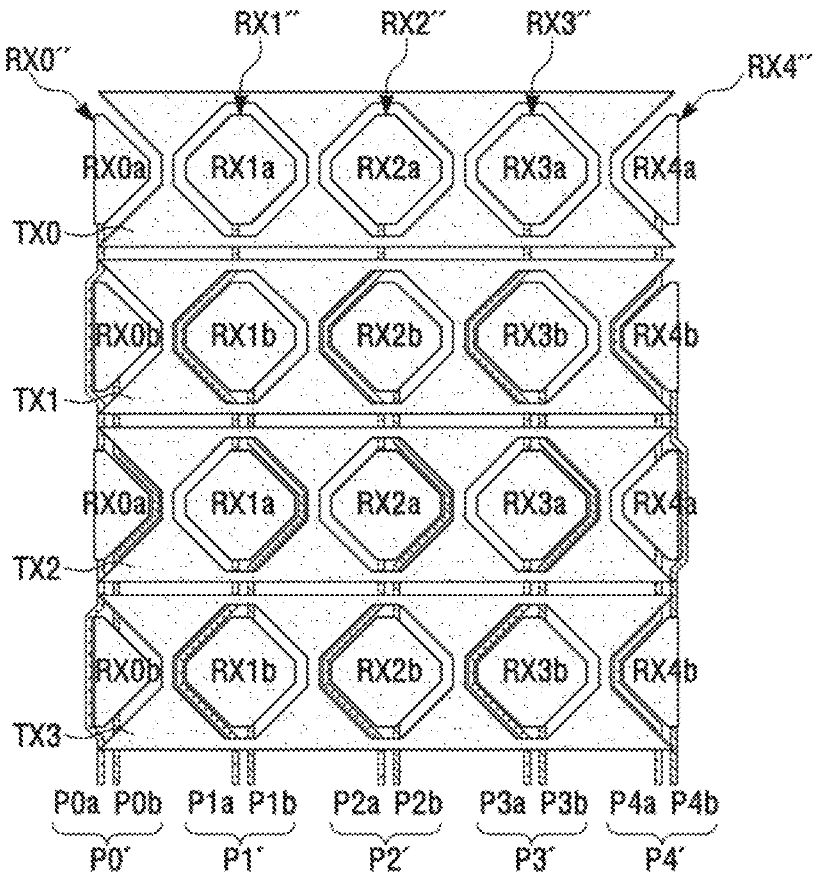
FIG. 49 is a plan view of a portion of another embodiment of the touch sensor 10 shown in FIG. 37.
Figure 50A:
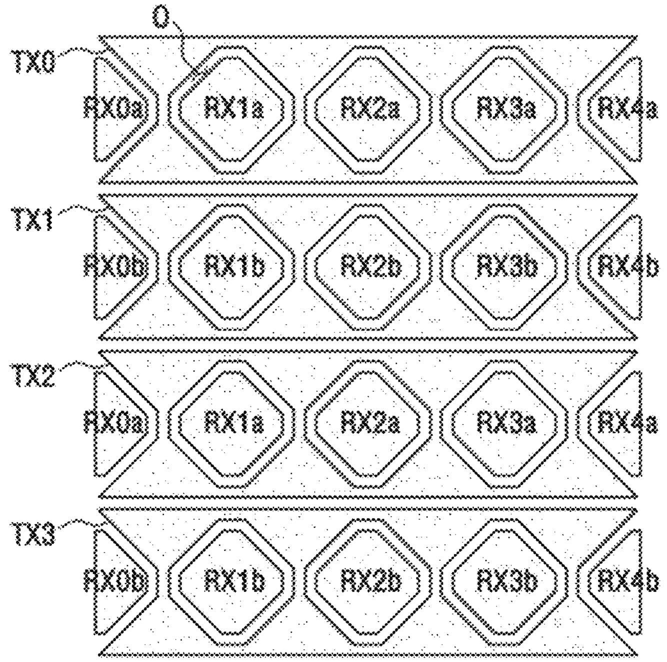
FIGS. 50A and 50B are plan views in which the touch sensor shown in FIG. 49 is separated by layers.
Figure 50B:
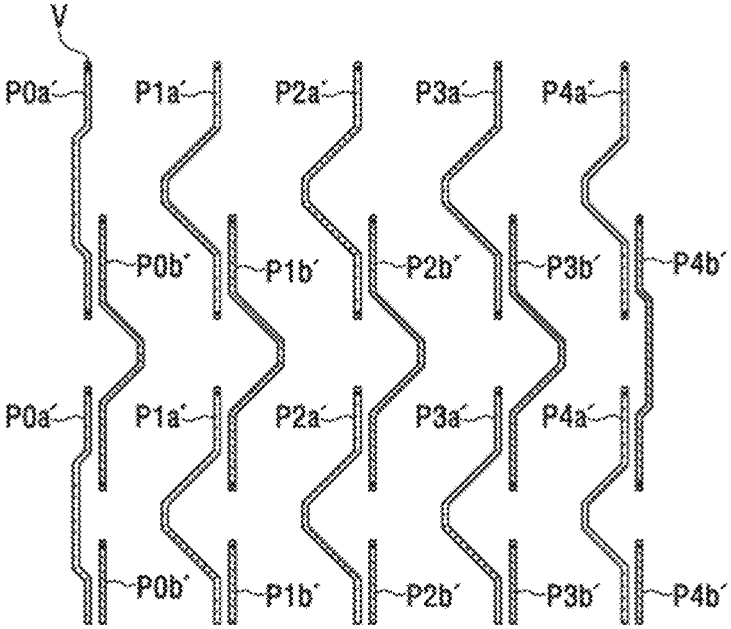

FIG. 49 is a plan view of a portion of another embodiment of the touch sensor 10 shown in FIG. 37. FIGS. 50A and 50B are plan views in which the touch sensor shown in FIG. 49 is separated by layers.

Compared to the touch sensor of the embodiments of FIGS. 43 to 45, the touch sensor according to another embodiment of the present invention shown in FIGS. 49 to 50B has a difference in a plurality of receiving electrodes RX1", RX2", RX3", and RX4". In particular, a plurality of connection patterns P0', P1', P2', P3', and P4' included in the respective receiving electrodes RX0", RX1", RX2", RX3", and RX4" differ in arrangement structure and shape. Hereinafter, the arrangement structure and shape of each of the connection patterns P0', P1', P2', P3', and P4' will be described in detail. Descriptions of remaining configurations will refer to the above descriptions.

Each of the connection patterns P0', P1', P2', P3', and P4' includes the first connection patterns P0a', P1a', P2a', P3a', and P4a' and the second connection patterns P0b', P1b', P2b', P3b', and P4b'.

Each of the first connection patterns P0a', P1a', P2a', P3a', and P4a' electrically connects the two receiving electrode patterns RX0a, RX1a, RX2a, RX3a, and RX4a of the first group. Each of the first connection patterns P0a', P1a', P2a', P3a', and P4a' does not overlap with the second group of receiving electrode patterns RX0b, RX1b, RX2b, RX3b, and RX4b to be between the two receiving electrode patterns. For example, at least a portion of each of the first connection patterns P0a', P1a', P2a', P3a', and P4a' is disposed between the receiving electrode pattern RX0b, RX1b, RX2b, RX3b, and RX4b of the second group and driving electrode TX0, TX1, TX2, and TX3 to be immediately adjacent to the receiving electrode pattern RX0b, RX1b, RX2b, RX3b, and RX4b of the second group not to overlap with the receiving electrode pattern RX0b, RX1b, RX2b, RX3b, and RX4b of the second group. Meanwhile, the remaining portions of each of the first connection patterns P0a', P1a', P2a', P3a', and P4a' may be disposed to overlap the driving electrodes TX0, TX1, TX2, and TX3.

Each of the second connection patterns P0b', P1b', P2b', P3b', and P4b' electrically connects the two receiving electrode patterns RX0b, RX1b, RX2b, RX3b, and RX4b of the second group. Each of the first connection patterns P0b', P1b', P2b', P3b', and P4b' do not overlap with the second group of receiving electrode patterns Rx0a, RX1a, RX2a, RX3a, and RX4a to be between the two receiving electrode patterns. For example, at least a portion of each of the second connection patterns P0b', P1b', P2b', P3b', and P4b' is disposed between the receiving electrode pattern RX0a, RX1a, RX2a, RX3a, and RX4a of the second group and driving electrode TX0, TX1, TX2, and TX3 to be immediately adjacent to the receiving electrode pattern RX0a, RX1a, RX2a, RX3a, and RX4a of the first group not to overlap with the receiving electrode pattern RX0a, RX1a, RX2a, RX3a, and RX4a of the first group. Meanwhile, the remaining portions of each of the second connection patterns P0b', P1b', P2b', P3b', and P4b' may be disposed to overlap the driving electrodes TX0, TX1, TX2, and TX3.

The touch sensor according to another embodiment of the present invention, compared to the touch sensor according to an embodiment of the present invention shown in FIGS. 43 to 45, has an advantage in that a capacitance value may be reduced between the first connection pattern and the second group of the receiving electrode pattern or the second connection pattern and the first group of the receiving electrode pattern.

Meanwhile, although not shown as a separate drawing, the dummy pattern DX1a shown in FIGS. 47A to 48 may be applied to the touch sensor according to other embodiments of the present invention.

Figure 51:
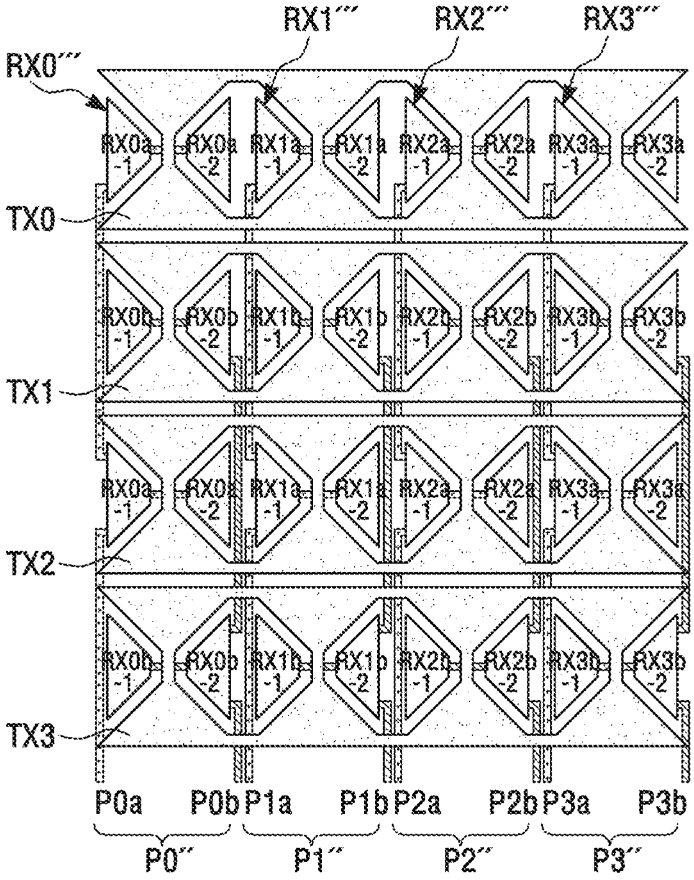
FIG. 51 is a plan view of a portion of another embodiment of the touch sensor 10 shown in FIG. 37.
Figure 52A:
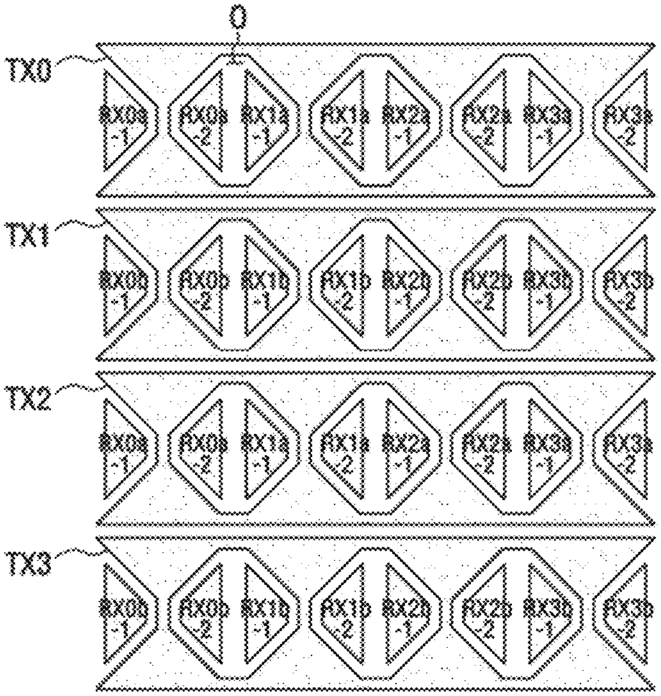
FIGS. 52A and 52B are plan views in which the touch sensor is shown in FIG. 51 is separated by layers.
Figure 52B:
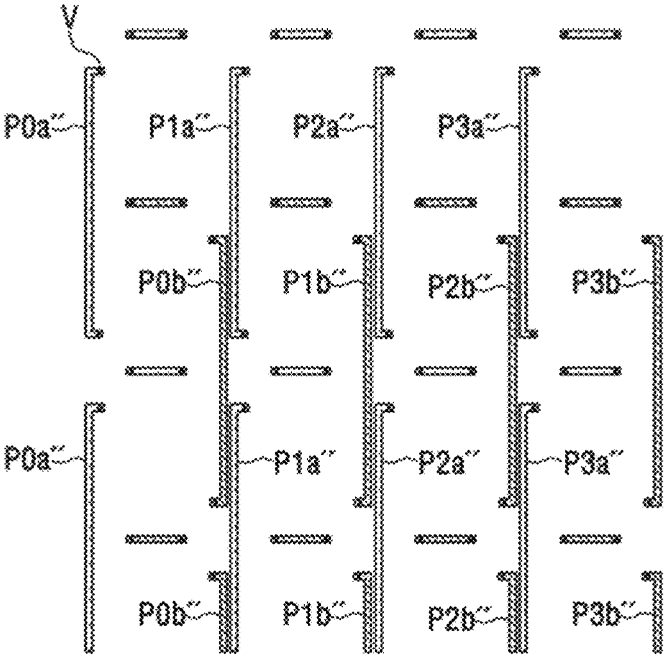

FIG. 51 is a plan view of a portion of another embodiment of the touch sensor 10 shown in FIG. 37. FIGS. 52A and 52B are plan views in which the touch sensor is shown in FIG. 51 is separated by layers.

Compared to the touch sensor of the embodiments of FIGS. 43 to 45, a touch sensor according to another embodiment of the present invention shown in FIGS. 51 to 52B has a difference in a plurality of receiving electrodes RX0'", RX1'", RX2'", RX3'". In particular, a plurality of receiving electrode patterns Rx0a-1, RX0a-2, RX0b-1, RX0b-2, RX1a-1, RX1a-2, RX1b-1, RX1b-2, RX2a-1, RX2a-2, RX2b-1, RX2b-2, RX3a-1, RX3a-2, RX3b-1, and RX3b-2 of each receiving electrode Rx0'", RX1'", RX2'", and RX3'" and the plurality of connection patterns P0", P1", P2", and P3" are different in structure and arrangement shape. Hereinafter, the structure and arrangement of the receiving electrode patterns Rx0a-1, RX0a-2, RX0b-1, RX0b-2, RX1a-1, RX1a-2, RX1b-1, RX1b-2, RX2a-1, RX2a-2, RX2b-1, RX2b-2, RX3a-1, RX3a-2, RX3b-1, and RX3b-2 included in each receiving electrode Rx0'", RX1'", RX2'", and RX3'" and connection patterns P0", P1", P2", and P3" will be described in detail. Descriptions of remaining configurations will refer to the above descriptions.

The plurality of receiving electrode patterns Rx0a-1, RX0a-2, RX0b-1, RX0b-2, RX1a-1, RX1a-2, RX1b-1, RX1b-2, RX2a-1, RX2a-2, RX2b-1, RX2b-2, RX3a-1, RX3a-2, RX3b-1, and RX3b-2 of each receiving electrode Rx0'", RX1'", RX2'", and RX3'" includes receiving electrode patterns Rx0a-1, RX0a-2, RX1a-1, RX1a-2, RX2a-1, RX2a-2, RX3a-1, and RX3a-2 of the first group and receiving electrode patterns RX0b-1, RX0b-2, RX1b-1, RX1b-2, RX2b-1, RX2b-2, RX3b-1, and RX3b-2 of the second group alternately arranged one by one along the second direction. The first group of receiving electrode patterns Rx0a-1, RX0a-2, RX1a-1, RX1a-2, RX2a-1, RX2a-2, RX3a-1, and RX3a-2 and the second group of receiving electrode patterns Rx0b-1, RX0b-2, RX1b-1, RX1b-2, RX2b-1, RX2b-2, RX3b-1, and RX3b-2 may be electrically isolated from each other.

Each of the first group of receiving electrode patterns RX0a-1, RX0a-2, RX1a-1, RX1a-2, RX2a-1, RX2a-2, RX3a-1, and RX3a-2 includes the first receiving electrode patterns RX0a-1, RX1a-1, RX2a-1, and RX3a-1 and second receiving electrode patterns RX0a-2, RX1a-2, RX2a-2, and RX3*a*-2. The first receiving electrode patterns RX0*a*-1, RX1*a*-1, RX2*a*-1, and RX3*a*-1, and the second receiving electrode patterns RX0*a*-2, RX1*a*-2, RX2*a*-2, and RX3*a*-2 are respectively disposed adjacent to each other within the two openings O in the first direction along the corresponding driving electrodes TX0 and TX2. One first or second receiving electrode pattern is disposed in the openings defined at both edges among the plurality of openings O of each the driving electrode TX0, TX1, TX2, and TX3. The second receiving electrode pattern of the receiving electrode pattern which is one of the receiving electrodes of the first group among the plurality of receiving electrodes RX0''', RX1''', RX2''', and RX3''' and the first receiving electrode pattern of the receiving electrode patterns which is one of another receiving electrode of the first group among the plurality of receiving electrodes RX0''', RX1''', RX2''', and RX3''' are disposed in the remaining openings together but spaced apart from each other.

Each of the connection patterns P0", P1", P2", and P3" includes a first connection patterns P0*a*", P1*a*", P2*a*", and P3*a*" for electrically connecting a first group of receiving electrode patterns Rx0*a*-1, RX0*a*-2, RX1*a*-1, RX1*a*-2, RX2*a*-1, RX2*a*-2, RX3*a*-1, and RX3*a*-2 and a second connection patterns P0*b*", P1*b*", P2*b*", and P3*b*" for electrically connecting the second group of receiving electrode patterns Rx0*b*-1, RX0*b*-2, RX1*b*-1, RX1*b*-2, RX2*b*-1, RX2*b*-2, RX3*b*-1, and RX3*b*-2.

Each of the first connection patterns P0*a*", P1*a*", P2*a*", and P3*a*" and the second connection patterns P0*b*", P1*b*", P2*b*", and P3*b*" is configured to connect two adjacent receiving electrode patterns with a shortest distance for each group. For example, each of the first connection patterns P0*a*", P1*a*", P2*a*", and P3*a*" and the second connection patterns P0*b*", P1*b*", P2*b*", and P3*b*" have one end connected to one lower end of one receiving electrode pattern among the two adjacent receiving electrode patterns of one group, and the other end connected to one upper end of the other receiving electrode pattern. The rest portion, except for the one end and the other end, has a shape extending along the second direction. The rest portion does not overlap another group of receiving electrode patterns disposed between the one receiving electrode pattern and the other receiving electrode pattern. The rest portion is disposed to overlap the opening O of the driving electrode with the largest cross-sectional area.

In addition, each of the first connection patterns P0*a*", P1*a*", P2*a*", and P3*a*" further includes the receiving electrode patterns to connect electrically the first receiving electrode patterns and the second receiving electrode patterns of the receiving electrode patterns of the first group. Each of the second connection patterns P0*b*", P1*b*", P2*b*", and P3*b*" further includes the receiving connection patterns to connect electrically the first receiving electrode patterns and the second receiving electrode patterns of the receiving electrode patterns of the second group.

Compared to the touch sensor of the embodiment of the present invention shown in FIGS. 43 to 45, the touch sensor according to another embodiment of the present invention has an advantage of reducing a capacitance value between the first connection patterns and the second group of receiving electrode patterns or reducing a capacitance value between the second connection patterns and the receiving electrode pattern of the first group of receiving electrode patterns. The touch sensor may also reduce a resistance value of each connection pattern.

Figure 53:
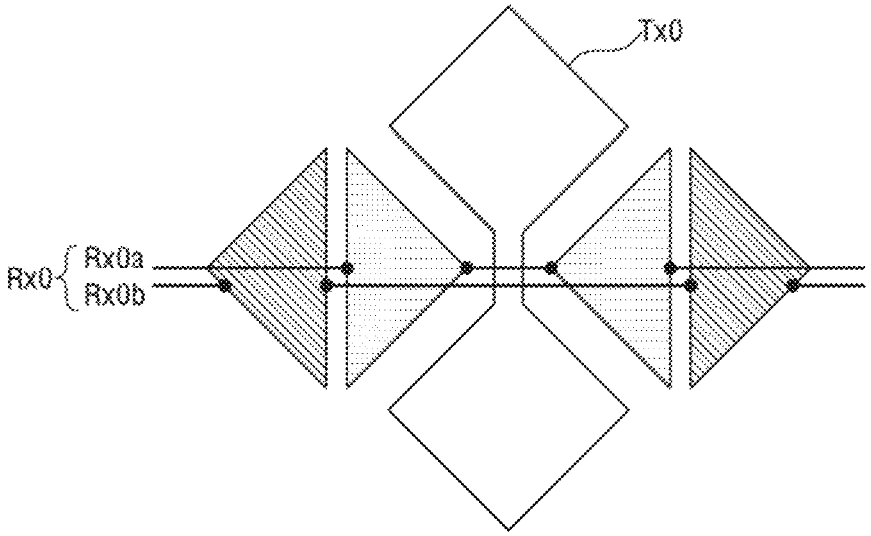
FIG. 53 is a plan view of a portion of another embodiment of the touch sensor 10 shown in FIG. 37.

FIG. 53 is a plan view of a portion of another embodiment of the touch sensor 10 shown in FIG. 37.

The touch sensor according to another embodiment of the present invention shown in FIG. 53 includes a plurality of driving electrodes Tx0 and a plurality of receiving electrodes Rx0.

Each driving electrode Tx0 includes diamond-shaped pattern portions arranged along one direction, and each driving electrode Tx0 includes connection pattern portions to connect two adjacent pattern portions among the pattern portions.

Each receiving electrode Rx0 includes a first electrode portion Rx0*a* and a second electrode portion Rx0*b* arranged along another direction different from the one direction. The first electrode portion Rx0*a* and the second electrode portion Rx0*b* may each have a triangular shape. The first electrode portion Rx0*a* and the second electrode portion Rx0*b* may be disposed adjacent to each other to form a diamond shape as a whole.

The first electrode portion Rx0*a* is disposed closer to the driving electrode Tx0 than the second electrode portion Rx0*b*. The second electrode portion Rx0*b* is disposed closer to the other driving electrode than the first electrode portion Rx0*a*.

The first electrode portion Rx0*a* may be electrically connected through a plurality of conductive traces. The second electrode portion Rx0*b* may also be electrically connected through the plurality of conductive traces.

Figure 54:
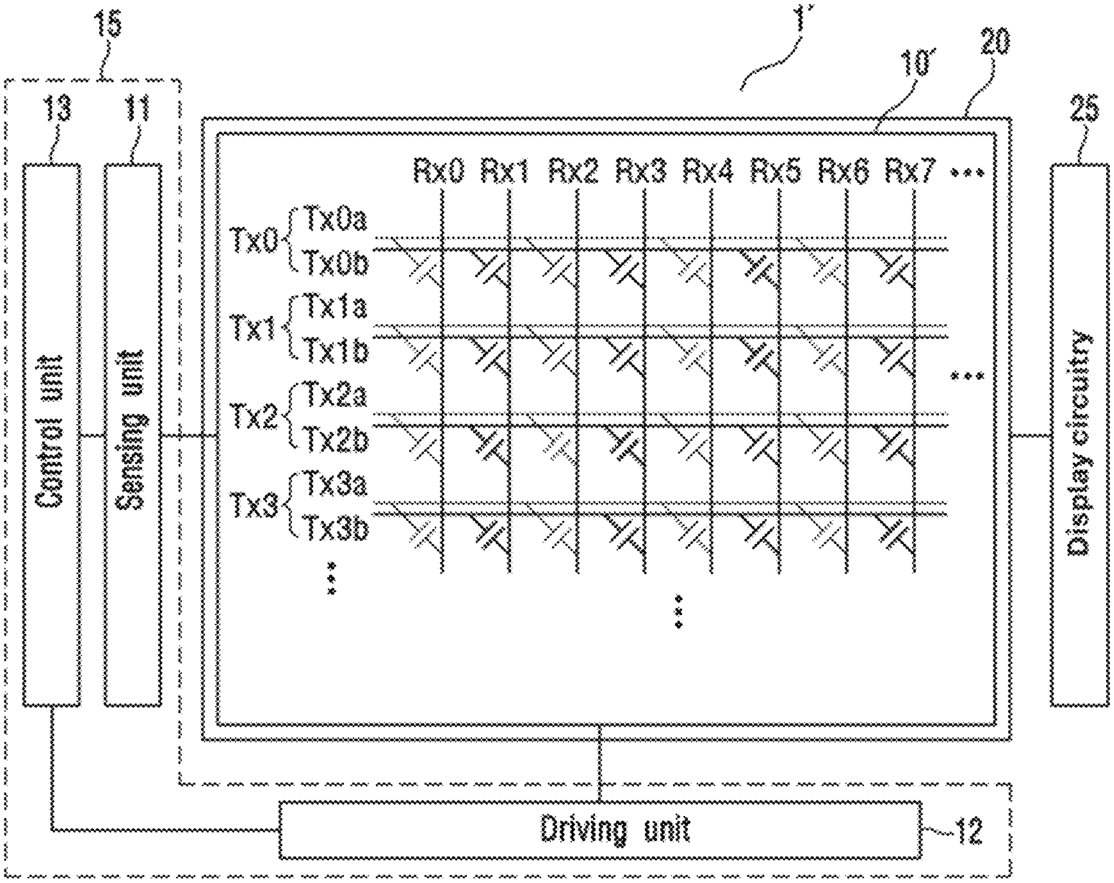
FIG. 54 is a schematic diagram of a touch input device according to another embodiment of the present invention.

FIG. 54 is a schematic diagram of a touch input device according to another embodiment of the present invention.

Referring to FIG. 54, the touch input device 1' according to another embodiment of the present invention includes a touch sensor 10', a display panel 20, a circuitry 15 for controlling the touch sensor 10, and a display circuitry 25 for controlling the display panel 20. Here, other configurations except for the touch sensor 10' are the same as those of the touch input device 1 shown in FIG. 37. The touch sensor 10' will be described in detail below.

The touch sensor 10' includes a plurality of driving electrodes Tx0, Tx1, Tx2, etc., and a plurality of receiving electrodes Rx0, Rx1, Rx2, Rx3, etc.

The plurality of driving electrodes Tx0, Tx1, Tx2, etc., and the plurality of receiving electrodes Rx0, Rx1, Rx2, Rx3, etc., may be arranged to cross each other. A mutual capacitance may be formed between the plurality of driving electrodes Tx0, Tx1, Tx2, etc., and the plurality of receiving electrodes Rx0, Rx1, Rx2, Rx3, etc., particularly at intersections thereof. The capacitance may be changed by an object in contact with or in proximity to a surface of the touch input device.

Each of the driving electrodes Tx0, Tx1, Tx2, etc., extends in a first direction, and each receiving electrode Rx0, Rx1, Rx2, Rx3, etc., extends in a second direction different from the first direction. Here, the second direction may be a direction perpendicular to the first direction.

Each of the plurality of driving electrodes Tx0, Tx1, Tx2, Tx3, etc., includes a pair of driving electrode portions Tx0*a* and Tx0*b*, Tx1*a* and Tx1*b*, Tx2*a* and Tx2*b*, Tx3*a* and Tx3*b*, etc. The pair of driving electrode portions Tx0*a* and Tx0*b*, Tx1*a* and Tx1*b*, Tx2*a* and Tx2*b*, Tx3*a* and Tx3*b*, etc., include a first driving electrode portion Tx0*a*, Tx1*a*, Tx2*a*, Tx3*a*, etc., and a second driving electrode portion Tx0*b*, Tx1*b*, Tx2*b*, Tx3*b*, etc.

The first driving electrode portions Tx0*a*, Tx1*a*, Tx2*a*, Tx3*a*, etc., among the plurality of driving electrodes Tx0, Tx1, Tx2, Tx3, etc., may be arranged to form mutual capacitance (cm) with some receiving electrodes Rx0, Rx2, Rx4, Rx6, etc., among the plurality of receiving electrodes Rx0, Rx1, Rx2, etc. The second driving electrode portions Tx0*b*, Tx1*b*, Tx2*b*, Tx3*b*, etc., among the plurality of driving electrodes Tx0, Tx1, Tx2, Tx3, etc., may be arranged to form mutual capacitance with the remaining receiving electrodes Rx1, Rx3, Rx5, Rx7, etc., among the plurality of receiving electrodes Rx0, Rx1, Rx2, etc.

The first driving electrode portions Tx0*a*, Tx1*a*, Tx2*a*, Tx3*a*, etc., among the plurality of driving electrodes Tx0, Tx1, Tx2, Tx3, etc., may be disposed to be immediately adjacent to some receiving electrodes Rx0, Rx2, Rx4, Rx6, etc., among the plurality of receiving electrodes Rx0, Rx1, Rx2, etc. The first driving electrode portions Tx0*a*, Tx1*a*, Tx2*a*, Tx3*a* may be arranged not to be immediately adjacent but to be spaced a predetermined distance from the remaining receiving electrodes Rx1, Rx3, Rx5, Rx7, etc., among the plurality of receiving electrodes Rx0, Rx1, Rx2, etc. Here, at least one different electrode may be disposed between the first driving electrode portions Tx0*a*, Tx1*a*, Tx2*a*, Tx3*a*, etc., and the remaining receiving electrodes Rx1, Rx3, Rx5, Rx7, etc. At least one different electrode may be some receiving electrodes Rx0, Rx2, Rx4, Rx6, etc.

The second driving electrode portions Tx0*b*, Tx1*b*, Tx2*b*, Tx3*b*, etc., among the plurality of driving electrodes Tx0, Tx1, Tx2, etc., may be disposed to be immediately adjacent to the remaining receiving electrodes Rx1, Rx3, Rx5, Rx7, etc., among the plurality of receiving electrodes Rx0, Rx1, Rx2, etc. The second driving electrode portions Tx0*b*, Tx1*b*, Tx2*b*, Tx3*b*, etc., may be disposed not to be immediately adjacent to but spaced apart by a predetermined distance from some receiving electrodes Rx0, Rx2, Rx4, Rx6, etc., among the plurality of receiving electrodes Rx0, Rx1, Rx2, etc. Here, at least one different electrode may be disposed between the second driving electrode portions Tx0*b*, Tx1*b*, Tx2*b*, Tx3*b*, etc., and some receiving electrodes Rx0, Rx2, Rx4, Rx6, etc. At least one different electrode may be the remaining receiving electrodes Rx1, Rx3, Rx5, Rx7, etc.

A driving signal may be applied to each driving electrode Tx0, Tx1, Tx2, Tx3, etc. Here, a first driving signal is applied to the first driving electrode portion Tx0*a*, Tx1*a*, Tx2*a*, Tx3*a*, etc., of the respective driving electrodes Tx0, Tx1, Tx2, Tx3, etc. A second driving signal is applied to the second driving electrode portion Tx0*b*, Tx1*b*, Tx2*b*, Tx3*b*, etc. The first and second driving signals may be applied simultaneously or at different times. The second driving signal may be obtained only from the 180-degree phase shifting of the first driving signal.

When the first driving signal and the second driving signal are simultaneously applied to the first driving electrode portion Tx0*a* and the second driving electrode portion Tx0*b* of the driving electrode Tx0, a predetermined signal is output from the receiving electrode Rx0 that crosses the driving electrode Tx0. The output signal includes the first capacitance information between the first driving electrode portion Tx0*a* and the receiving electrode Rx0 and capacitance information based on the second capacitance information between the second driving electrode portion Tx0*b* and the receiving electrode Rx0. The capacitance information may be obtained by subtracting the second capacitance information from the first capacitance information.

The circuitry 15 may determine whether or not an object is touched and/or the touch position based on a signal output from the plurality of receiving electrodes Rx0, Rx1, Rx2, Rx3, etc.

The touch input device 1' shown in FIG. 54, may prevent occurrence of flicker in the display panel 20 due to driving of the touch sensor 10' and may make a shortened driving time. Here, the flicker is a phenomenon, in which a portion of the display screen rapidly flickers or vibrates, because the driving signal affects the display panel when the driving signal is electrically applied to a driving electrode of the touch sensor 10'. It will be described in detail with reference to FIGS. 55A to 56B.

FIG. 55A is a graph showing a multi-driving which is performed for each of four driving electrodes of the touch input device in FIG. 37. FIG. 55B is a table showing an example of a driving signal (or a driving code) that is simultaneously applied to four driving electrodes Tx0, Tx1, Tx2, and Tx3 during the multi-driving in FIG. 55A.

As shown in FIG. 55A, a drive sum of the driving signals becomes '2' when the driving signals are shown in FIG. 55B are simultaneously applied to four driving electrodes Tx0, Tx1, Tx2, and Tx3 among 20 driving electrodes Tx0 to Tx19 during an arbitrary time interval 0 to T1. Here, for example, when the driving voltage applied to each driving electrode is 10 [V], a total driving voltage of 20 [V] corresponding to 2*10 [V] may affect the display panel which may cause the flicker on the display screen. Furthermore, as the number of simultaneously driven driving electrodes becomes greater than four, the drive sum of the driving signals increases. Therefore, the total drive voltage also increases and causes a severe flicker on the display screen.

On the other hand, in the touch input device shown in FIG. 54, there is an advantage in that the above-described flicker problem in the display panel does not occur even when the circuitry 15 controls to simultaneously apply a driving signal to more than four electrodes or all the driving electrodes among the plurality of driving electrodes Tx0, Tx1, Tx2, etc. It will be described in detail with reference to FIGS. 56A and 56B.

FIG. 56A is a graph showing the multi-driving of all driving electrodes in the touch input device shown in FIG. 54. FIG. 56B is a table showing an example of a driving signal (or driving code) applied to all driving electrodes Tx0, Tx1, Tx2, Tx3, etc., simultaneously driven during the multi-driving in FIG. 56A.

As shown in FIG. 56A, when the driving signals shown in FIG. 56B are simultaneously applied to all driving electrodes Tx0, Tx1, Tx2, etc., of the touch sensor 10' for a predetermined time interval (0 to T1), the drive sum of the driving signals (drive sum) always becomes '0'. This is because the driving signals simultaneously applied to a portion of driving electrodes Tx0*a*, Tx1*a*, Tx2*a*, Tx3*a*, etc., and the driving signals simultaneously applied to the remaining portion of driving electrodes Tx0*b*, Tx1*b*, Tx2*b*, Tx3*b*, etc., have the same size but the phase is reversed by 180 degrees only. In this way, since the drive sum of the driving signals becomes '0', the display panel is not affected at all. Therefore, there is an advantage in that flicker does not occur on the display screen when the display panel is working.

Further, as shown in FIG. 56A, the touch input device of FIG. 54, the touch input device may reduce the mutual driving time to ⅕ compared to the graph in FIG. 55A because the circuitry 15 may drive simultaneously all or more than four driving electrodes of the plurality of driving electrodes Tx0, Tx1, Tx2, etc. Furthermore, because the touch input device may reduce a turn-on time of the analog front end (AFE), a power consumption of the touch input device also may be reduced.

Also, the touch input device 1' may remove a noise signal caused by the LGM when the touch input device 1' is in the LGM state.

Figure 57A:
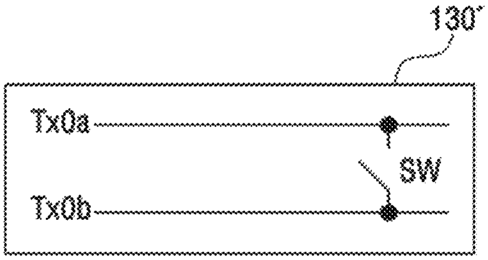
FIGS. 57A and 57B are views for explaining a driving circuit unit 130' according to an embodiment of the circuitry 15 shown in FIG. 43.
Figure 57B:
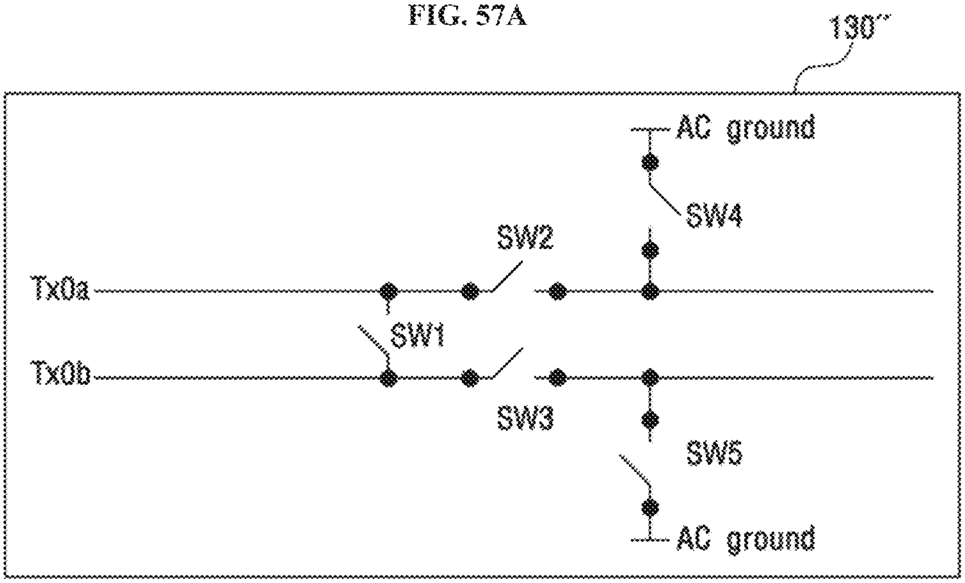

FIGS. 57A and 57B are views for explaining a driving circuit unit 130' according to an embodiment of the circuitry 15 shown in FIG. 43.

Referring to FIG. 57A, the driving circuit unit 130' includes a switch element SW for electrically shorting or opening a pair of driving electrode portions Tx0*a* and Tx0*b* of each driving electrode Tx0. The switch element SW is controlled by a controller (not shown). When the switch element SW is closed, a pair of driving electrode portions Tx0*a* and Tx0*b* of each driving electrode Tx0 are electrically connected. Meanwhile, although not shown in the drawings, the switch element may be disposed between a pair of driving electrode portions of another driving electrode.

According to the driving circuit unit 130', the switch element SW may be controlled to electrically connect the pair of driving electrode portions Tx0*a* and Tx0*b*. This control method may be used when driving the touch sensor 10' shown in FIG. 54 in the self-sensing mode or driving the stylus-sensing mode for sensing a pen signal output from a stylus.

Referring to FIG. 57B, the driving circuit unit 130" includes a plurality of switch elements SW1, SW2, SW3, SW4, and SW5. The first switch element SW1 performs the same role as the switch element SW shown in FIG. 57A. The first switch element SW1 is connected between the pair of driving electrode portions Tx0*a* and Tx0*b*. The first switch element SW1 may be shorted or opened according to the control of a controller (not shown).

The driving circuit unit 130" controls the second to fifth switch elements SW2, SW3, SW4, and SW5 to select one driving electrode portion from the pair of driving electrode portions Tx0*a* and Tx0*b* of each driving electrode Tx0.

The second switch element SW2 may be connected to one end of the first switch element SW1, and the third switch element SW3 may be connected to the other end of the first switch element SW1.

The fourth switch element SW4 is connected between an output terminal of the second switch element SW2 and an AC ground. The fifth switch element SW5 is connected between an output terminal of the third switch element SW3 and the AC ground.

On the other hand, depending on which driving electrode portion is selected from the pair of driving electrode portions Tx0*a* and Tx0*b*, the second and fifth switch elements SW2 and SW5 or the third and fourth switch elements SW3 and SW4 may be omitted.

The driving circuit unit 130" may control the first switch element SW1 to electrically connect the pair of driving electrode portions Tx0*a* and Tx0*b* so that the touch sensor 10' shown in FIG. 54 may be driven in the self-sensing mode or the stylus-sensing mode. In addition, by controlling the second to fifth switch elements SW2, SW3, SW4, and SW5, it is possible to control that one driving electrode portion among the pair of driving electrode portions Tx0*a* and Tx0*b* is selected, and then the one driving electrode portion is connected to the other electronic device.

Figure 58:
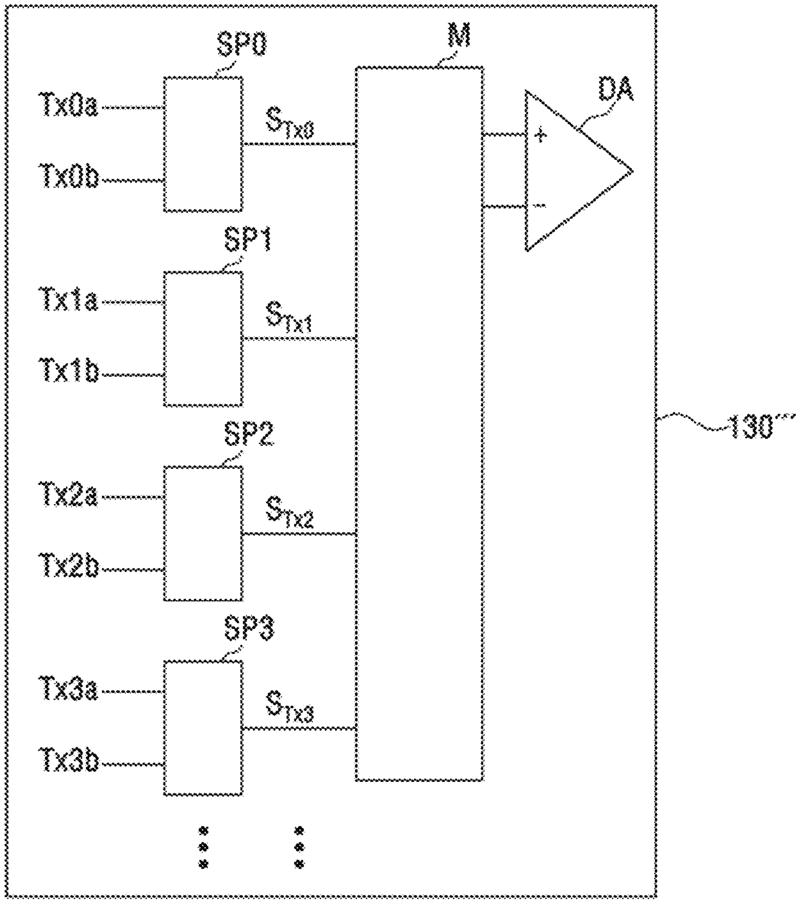
FIG. 58 is a view for explaining a driving circuit unit 130"' according to another embodiment of the circuitry 15 shown in FIG. 43.

FIG. 58 is a view for explaining a driving circuit unit 130'" according to another embodiment of the circuitry 15 shown in FIG. 43.

Referring to FIG. 58, when the touch sensor 10' is working in the self-sensing mode or the pen-sensing mode, a plurality of driving electrodes Tx0, Tx1, Tx2, etc., of the driving circuit unit 130'" may perform a function to output a predetermined signal.

The driving circuit unit 130'" may include a plurality of switching units SP0, SP1, SP2, SP3, etc., a multiplexer M, and a differential amplifier DA.

Each switching unit SP0 electrically connects or electrically opens a pair of driving electrode portions Tx0*a* and Tx0*b* of each driving electrode to each other. A pair of input terminals of each signal processor SP0 is electrically connected to the pair of driving electrode portions Tx0*a* and Tx0*b*. One output terminal of each signal processor SP0 is connected to one of the plurality of input terminals of the multiplexer M. The other switching units SP1, SP2, SP3, etc., are connected in the same manner.

The multiplexer M includes a plurality of input terminals to be connected to the output terminals of the plurality of switching units SP0, SP1, SP2, SP3, etc., on a one-to-one basis, and the multiplexer M includes at least two output terminals. The two output terminals are respectively connected to corresponding two input terminals of the differential amplifier DA.

The driving circuit unit 130'" may remove a display noise caused by driving of the display panel 20 shown in FIG. 54. Specifically, when the touch sensor 10' shown in FIG. 54 is working as the pen sensing mode for sensing a pen signal output from the stylus, the plurality of switching units SP0, SP1, SP2, SP3, etc., make a pair of driving electrode portions Tx0*a* and Tx0*b*, Tx1*a* and Tx1*b*, Tx2*a* and Tx2*b*, Tx3*a* and Tx3*b*, etc., of each driving electrode to be electrically connected. The multiplexer M outputs two signals to the differential amplifier DA among a plurality of signals STx0, STx1, STx2, STx3, etc., from a plurality of signal processors SP0, SP1, SP2, SP3, etc. The differential amplifier DA outputs a differentially amplified signal with two signals which are selected by the multiplexer M. Since most of the display noise caused by the driving of the display panel 20 is removed from the differentially amplified signal, a touch malfunction may be prevented. Touch sensitivity also may be improved.

Figure 59:
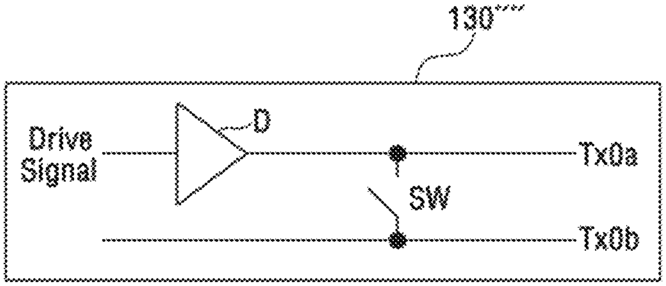
FIG. 59 is a view for explaining a driving circuit unit 130"" according to another embodiment of the circuitry 15 shown in FIG. 43.

FIG. 59 is a view for explaining a driving circuit unit 130"" according to another embodiment of the circuitry 15 shown in FIG. 43.

Referring to FIG. 59, the driving circuit unit 130"" may include a driving driver D and a switch element SW.

The driving driver D amplifies a driving signal which is input to an input terminal and then outputs the driving signal. An output terminal of the driving driver D is connected to the first driving electrode portion Tx0*a* of each driving electrode.

The switch element SW has one end connected to the output terminal of the driving driver D and the other end connected to the second driving electrode portion Tx0*b* of each driving electrode. The switch element SW may be closed or opened by the circuitry 15.

The driving circuit unit 130"" may be used when the touch sensor 10' shown in FIG. 54 is working in the self-sensing mode or working in the pen-driving mode for driving the stylus.

Meanwhile, although not shown in a separate drawing, the driving circuit unit may be bundled to use a multiplexer (MUX), and then the driving circuit unit may be worked by a single-driving driver. In this case, the driving driver may be an inverter-type logic circuit or a buffer using an analog amplifier.

Figure 60:
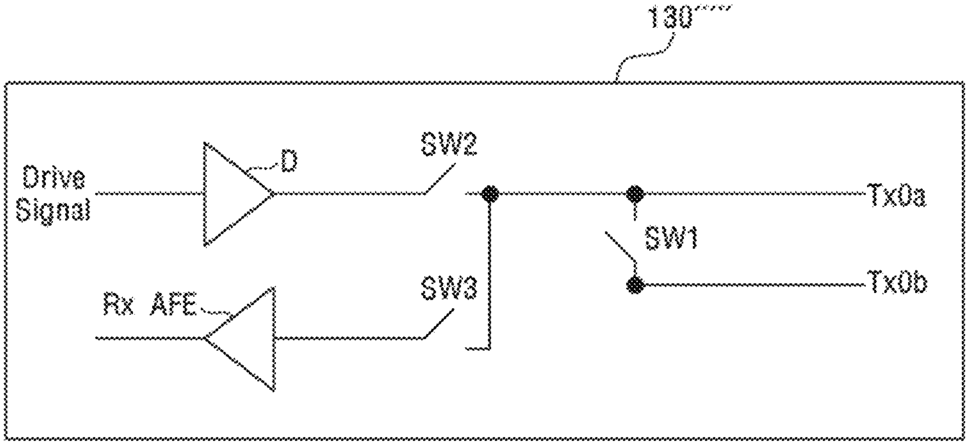
FIG. 60 is a view for explaining a driving circuit unit 130""' according to another embodiment of the circuitry 15 shown in FIG. 54.

FIG. 60 is a view for explaining a driving circuit unit 130'"" according to another embodiment of the circuitry 15 shown in FIG. 54.

The driving circuit unit 130'"" includes a driving driver D, a plurality of switch elements SW1, SW2, and SW3, and a reception analog front-end Rx AFE.

The driving driver D amplifies a driving signal which is input to an input terminal and then outputs the driving signal. An output terminal of the driving driver D is connected to the first driving electrode portion Tx0*a* of each driving electrode.

The first switch element SW1 has one end connected to the output terminal of the driving driver D and the other end connected to the second driving electrode portion Tx0*b* of each driving electrode. The first switch element SW1 may be closed or opened by the circuitry 15.

The second switch element SW2 is connected between the driving driver D and the first driving electrode portion Tx0*a*. When the second switch element SW2 is turned on, the driving driver D and the first driving electrode portion Tx0*a* are electrically connected. When the second switch element SW2 is turned off, the driving driver D and the first driving electrode portion Tx0*a* are electrically disconnected.

The third switch element SW3 is connected between the reception analog front-end Rx AFE and the first driving electrode portion Tx0*a*. When the third switch element SW3 is turned on, the reception analog front-end Rx AFE and the first driving electrode portion Tx0*a* are electrically connected. When the third switch element SW3 is turned off, the reception analog front-end Rx AFE and the first driving electrode portion Tx0*a* are electrically disconnected.

When the circuitry 15 performs a self-sensing using each driving electrode of the touch sensor, the circuitry 15 may turn on the first switch element SW1 to connect the first driving electrode portion Tx0*a* and the second driving electrode portion Tx0*b*. The circuitry 15 may turn on the second switch element SW2 to connect electrically the driving driver D and the first driving electrode portion Tx0*a*. The circuitry 15 may turn off the third switch element SW. The self-sensing driving signal, which is amplified by the driving driver D, may be simultaneously applied to the first driving electrode portion Tx0*a* and the second driving electrode portion Tx0*b* by the control of the circuitry 15.

When the circuitry 15 performs a stylus sensing using each driving electrode of the touch sensor to sense the pen signal emitted from the stylus, the circuitry 15 may turn on the first switch element SW1 to connect electrically the first driving electrode portion Tx0*a* and the second driving electrode portion Tx0*b*. The circuitry 15 may turn on the third switch element SW3 to connect electrically the reception analog front-end Rx AFE and the first driving electrode portion Tx0*a*. The circuitry 15 may turn off the second switch element SW2. The pen signal, which is received by the first driving electrode portion Tx0*a* and the second driving electrode portion Tx0*b*, may be applied to the reception analog front-end Rx AFE by the control of the circuitry 15.

Meanwhile, although not shown in separate drawings, additional switch elements in FIGS. 57A and 57B may be worked together in addition to the plurality of switch elements SW1, SW2, and SW3. In addition, an additional multiplexer M shown in FIG. 58 may be disposed between the third switch element SW3 and the reception analog front-end Rx AFE.

Figure 61:
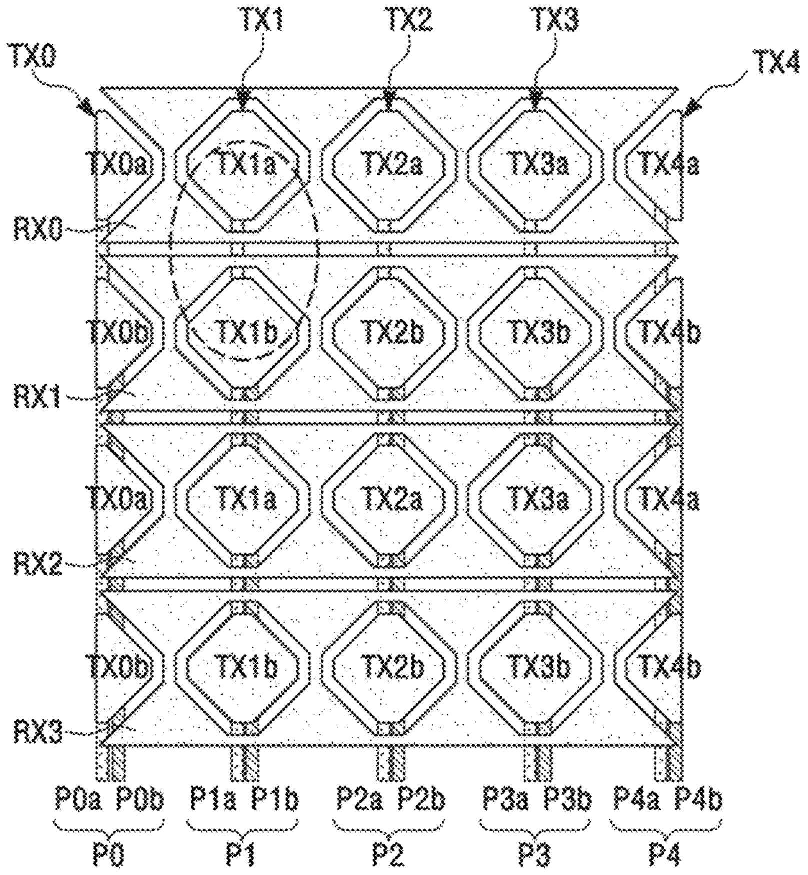
FIG. 61 is a plan view of a portion of an embodiment of a touch sensor 10' shown in FIG. 54.

FIG. 61 is a plan view of a portion of an embodiment of a touch sensor 10' shown in FIG. 54.

An embodiment of the touch sensor 10' shown in FIG. 61 has the same structure as that of the plurality of electrodes of the embodiment of the touch sensor 10 shown in FIG. 43. However, the touch sensor 10' and the touch sensor 10 have a difference in that the driving electrodes TX0, TX1, TX2, TX3, and TX4 to apply driving signals and receiving electrodes Rx0, RX1, RX2, and RX3 to output the receiving signal are reversely configured.

Referring to FIG. 61, the circuitry 15 shown in FIG. 54 may control so that predetermined driving signals may be simultaneously applied to connection patterns P0, P1, P2, P3, P4, etc., of the plurality of driving electrodes TX0, TX1, TX2, TX3, TX4, etc. Here, the driving signal applied to the second connection pattern P0*b* of each connection pattern P0 is an inverted driving signal which is a signal obtained by 180 degrees inverting the phase of the driving signal to be applied to the first connection pattern P0*a*.

Figure 62:
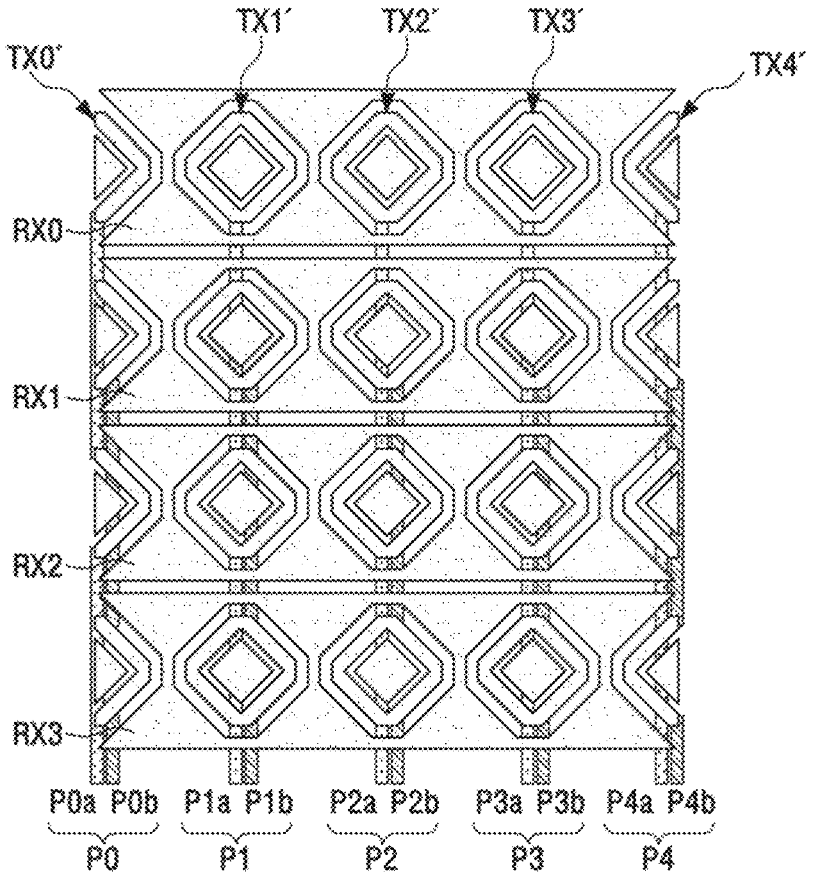
FIG. 62 is a plan view of a portion of another embodiment of the touch sensor 10' shown in FIG. 54.

FIG. 62 is a plan view of a portion of another embodiment of the touch sensor 10' shown in FIG. 54.

Another embodiment of the touch sensor 10' shown in FIG. 62 has the same structure as that of the plurality of electrodes of the embodiment of the touch sensor 10 shown in FIG. 46. However, the touch sensor 10' and the touch sensor 10 have a difference in that the driving electrodes to be applied to driving signals and the receiving electrodes to output the receiving signals are reversely configured.

Referring to FIG. 62, the circuitry 15 shown in FIG. 54 may control so that predetermined driving signals are simultaneously applied to connection patterns P0, P1, P2, P3, P4, etc., of the plurality of driving electrodes TX0', TX1', TX2', TX3', TX4', etc. Here, the driving signal applied to the second connection pattern P0*b* of each connection pattern P0 is an inverted driving signal which is a signal obtained by 180 degrees inverting the phase of the driving signal to be applied to the first connection pattern P0*a*.

Figure 63:
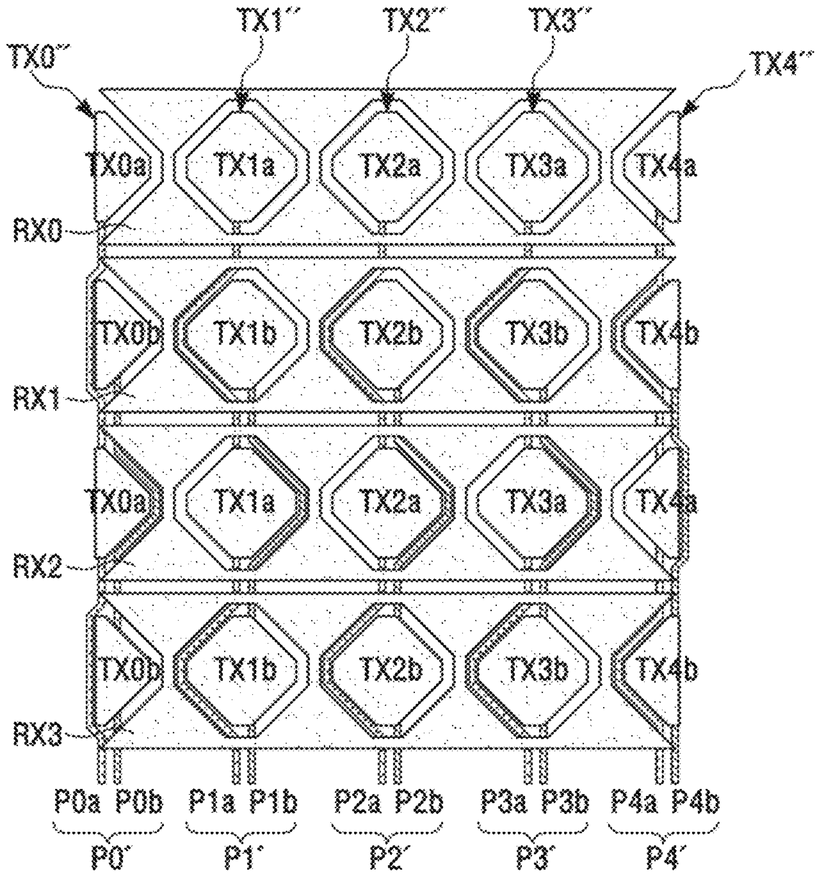
FIG. 63 is a plan view of a portion of another embodiment of the touch sensor 10' shown in FIG. 54.

FIG. 63 is a plan view of a portion of another embodiment of the touch sensor 10' shown in FIG. 54.

Another embodiment of the touch sensor 10' shown in FIG. 63 has the same structure as that of the plurality of electrodes of the embodiment of the touch sensor 10 shown in FIG. 49. However, the touch sensor 10' and the touch sensor 10 have a difference in that the driving electrodes to be applied to driving signals and the receiving electrodes to output the receiving signals are reversely configured.

Referring to FIG. 63, the circuitry 15 shown in FIG. 54 may control so that predetermined driving signals are simultaneously applied to connection patterns P0', P1', P2', P3', P4', etc., of the plurality of driving electrodes TX0", TX1", TX2", TX3", TX4", etc. Here, the driving signal applied to the second connection pattern P0*b* of each connection pattern P0' is an inverted driving signal which is a signal obtained by 180 degrees inverting the phase of the driving signal to be applied to the first connection pattern P0*a*.

Figure 64:
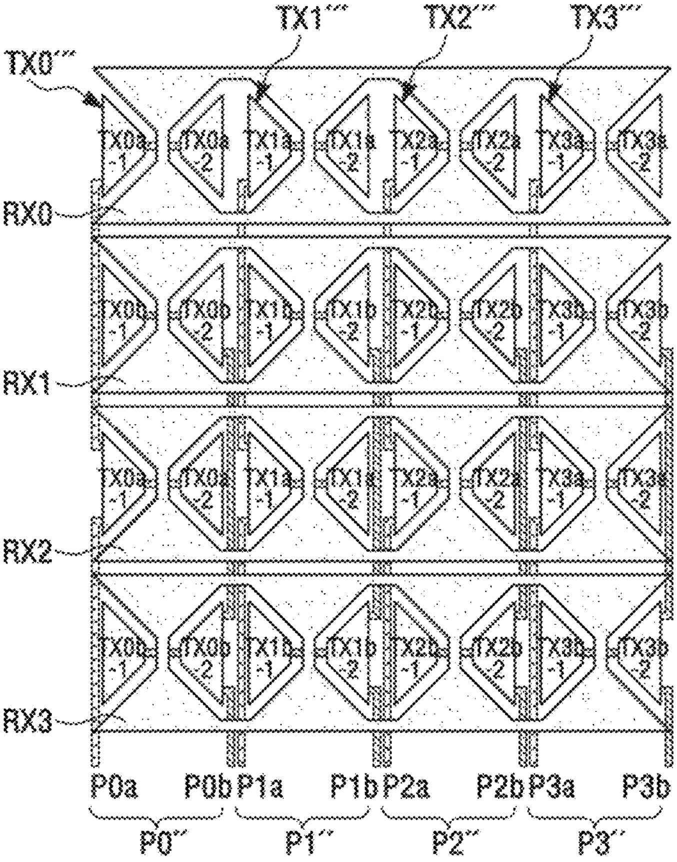
FIG. 64 is a plan view of a portion of another embodiment of the touch sensor 10' shown in FIG. 54.

FIG. 64 is a plan view of a portion of another embodiment of the touch sensor 10' shown in FIG. 54.

Another embodiment of the touch sensor 10' shown in FIG. 64 has the same structure as that of the plurality of electrodes of the embodiment of the touch sensor 10 shown in FIG. 51. However, the touch sensor 10' and the touch sensor 10 have a difference in that the driving electrodes to be applied to driving signals and the receiving electrodes to output the receiving signals are reversely configured.

Referring to FIG. 64, the circuitry 15 shown in FIG. 54 may control so that predetermined driving signals are simultaneously applied to connection patterns P0", P1", P2", P3", etc., of the plurality of driving electrodes TX0'", TX1'", TX2'", TX3'", etc. Here, the driving signal applied to the second connection pattern P0*b* of each connection pattern P0" is an inverted driving signal which is a signal obtained by 180 degrees inverting the phase of the driving signal to be applied to the first connection pattern P0*a*.

Figure 65:
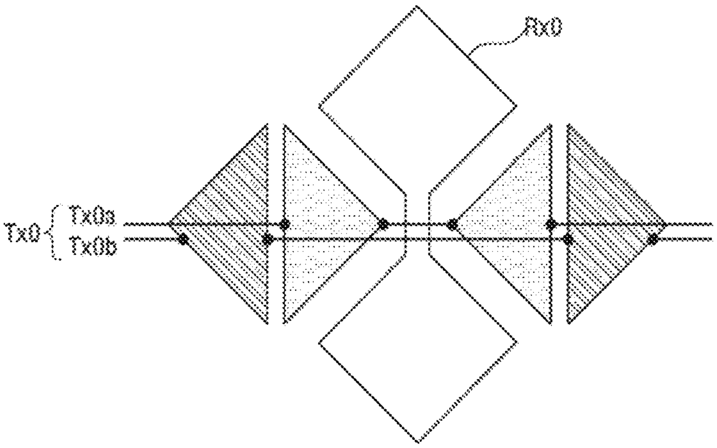
FIG. 65 is a plan view of a portion of another embodiment of the touch sensor 10' shown in FIG. 54.

FIG. 65 is a plan view of a portion of another embodiment of the touch sensor 10' shown in FIG. 54.

Another embodiment of the touch sensor shown in FIG. 65 has the same structure as that of the plurality of electrodes of the embodiment of the touch sensor 10 shown in FIG. 53. However, the touch sensors have a difference in that the driving electrodes to be applied to driving signals and the receiving electrodes to output the receiving signals are reversely configured.

Referring to FIG. 65, the circuitry 15 shown in FIG. 54 may control so that predetermined driving signals are simultaneously applied to the first driving electrode portion Tx0*a* and the second driving electrode portion Tx0*b* of the plurality of driving electrodes Tx0. Here, the driving signal applied to the first driving electrode portion Tx0*a* is an inverted driving signal which is a signal obtained by 180 degrees inverting the phase of the driving signal to be applied to the second driving electrode portion Tx0*b*.

The circuitry 15 shown in FIG. 54 may receive signals having mutual capacitance variation information from one of the plurality of receiving electrodes RX0, RX1, RX2, RX3, etc., of the touch sensors shown in FIGS. 61 to 65. The circuitry 15 may output differential signals from the received receiving signals. The circuitry 15 may be restored by integrating the differential signals which are receiving signals from the plurality of receiving electrodes RX0, RX1, RX2, RX3, etc. The circuitry 15 may determine a touch position of an object based on information on an amount of variation in mutual capacitance of the processed signals which include the codes of the restored receiving signals.

Figure 66:
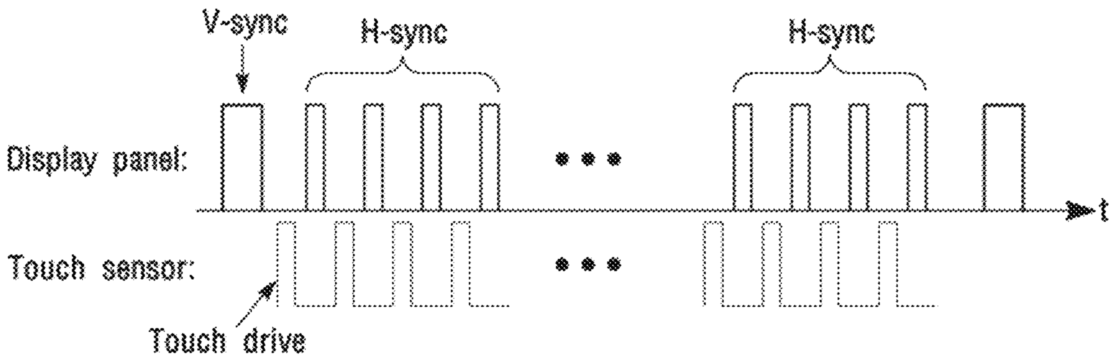
FIG. 66 is a view for explaining a first driving method of touch input devices 1 and 1' shown in FIGS. 37 and 54.

FIG. 66 is a view for explaining a first driving method of touch input devices 1 and 1' shown in FIGS. 37 and 54.

The first driving method shown in FIG. 66 is a driving method of the touch sensors 10 and 10' considering the driving of the display panel 20. This first driving method may be performed by the circuitry 15 of FIGS. 37 and 54.

The first driving method may drive the touch sensor 10 and 10' by synchronizing with at least one horizontal synchronization signal H-sync. The first driving method may drive the touch sensors 10 and 10' for a predetermined time interval after starting the horizontal synchronization signal and applying the horizontal sync signal to the display panel 20. Here, the predetermined time interval may be a time between the time of a horizontal synchronization signal starting and the right before a time of a next horizontal synchronization signal to reach the display panel 20.

Here, the horizontal synchronization signal H-sync is a signal for refreshing one scan line of the display panel 20. Driving of the touch sensors 10 and 10' means that the circuitry 15 applies driving signals to the selected driving electrodes of the touch sensors 10 and 10' and receives sensing signals from the receiving electrodes.

The first driving method may drive the touch sensor 10 and 10' by synchronizing with at least one horizontal synchronization signal H-sync. In the first driving method, the first driving method drives the touch sensors 10 and 10' for a predetermined time interval after the horizontal synchronization signal is applied to the display panel 20. Therefore, the horizontal synchronization signal H-sync is not applied to the display panel 20 while the touch sensor 10 and 10' is working. Therefore, the display noise caused by the driving of the display panel 20 may be minimized.

FIG. 66 shows that the touch sensors 10 and 10' may drive one time during a time interval between two horizontal synchronization signals H-sync adjacent to each other along a time axis. However, the touch sensors 10 and 10' may be driven more than once.

Figure 67:
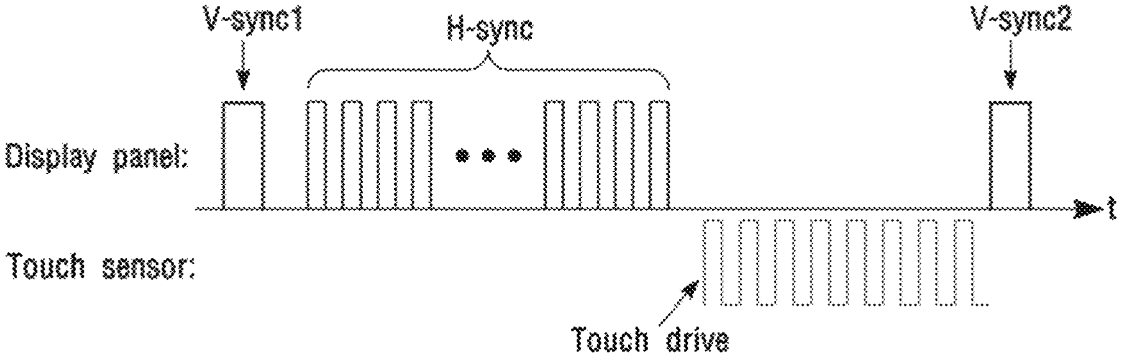
FIG. 67 is a view for explaining a second driving method of the touch input devices 1 and 1' shown in FIGS. 37 and 54.

FIG. 67 is a view for explaining a second driving method of the touch input devices 1 and 1' shown in FIGS. 37 and 54.

In the second driving method in FIG. 67, the second driving method is a driving method of the touch sensors 10 and 10' considering the driving of the display panel 20. The second driving method may be performed by the circuitry 15 of FIGS. 37 and 54.

The second driving method is a method that completely separates the driving time interval of the touch sensors 10 and 10' from the driving time interval of the display panel 20. For example, the second driving method may control the touch sensors 10 and 10' to be worked after all the horizontal synchronization signals H-sync are driven. Alternatively, although not shown in the drawings, the second driving method may control the horizontal synchronization signals H-sync to be applied after the touch sensors 10 and 10' are worked.

Referring to FIG. 67, a first time interval is configured as one frame of horizontal synchronization signals (H-sync) in a time interval between two vertical synchronization signals (V-sync1 and V-sync2). A second time interval is a time interval in which the touch sensors 10 and 10' are working. In this case, the circuitry 15 shown in FIGS. 37 and 54 may control the first time interval and the second time interval to be separated completely from each other.

Here, the second time interval may be equal to or less than the first time interval. Meanwhile, although not shown in the drawings, the second time interval may precede the first time interval in terms of time. In other words, after the touch sensors 10 and 10' are working first, and then the plurality of horizontal synchronization signals (H-sync) may be applied.

In this second driving method, there is no display update of the display panel 20 while the touch sensor 10 and 10' is working. Therefore, it is an advantage that the display noise caused by the display panel 20 does not affect while the touch sensors 10 and 10' are working. In addition, the second driving method may minimize the influence of flicker from the display panel 20 while the touch sensor 10 and 10' is working.

Figure 68:
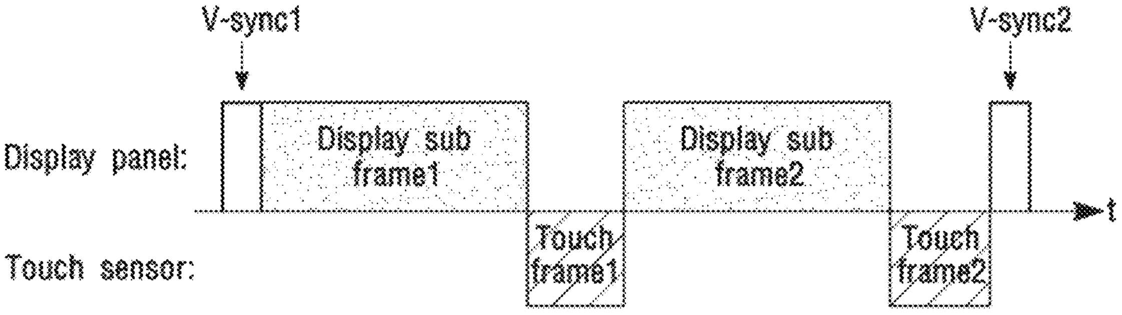
FIG. 68 is a view for explaining a third driving method of the touch input devices 1 and 1' shown in FIGS. 37 and 54.

FIG. 68 is a view for explaining a third driving method of the touch input devices 1 and 1' shown in FIGS. 37 and 54.

The third driving method of FIG. 68 is a driving method of the touch sensor 10 and 10' considering the operation of the display panel 20. This third driving method may be performed by the circuitry 15 of FIGS. 37 and 54.

Referring to FIG. 68, the third driving method is a driving method in which a touch report rate is higher than a display refresh rate when the driving timing of the touch sensors 10 and 10' and the driving timing of the display panel 20 are completely separated.

As shown in FIG. 68, the display circuitry 25 divides the entire time interval in which the horizontal synchronization signals are driven between two vertical synchronization signals V-sync1 and V-sync2 into a first time interval (display subframe 1) and a second time interval (display subframe 2). Then, the circuitry 15 may drive the touch sensors 10 and 10' for a predetermined time interval (touch frame 1) between the two time intervals (display subframe 1 and display subframe 2), or the circuitry 15 may drive the touch sensors 10 and 10' for a predetermined time interval (touch frame 2) between the second time interval (display subframe 2) and the second vertical synchronization signal V-sync 2. Here, when the display refresh rate is 60 Hz, the touch report rate may be 120 Hz.

Meanwhile, although the touch report rate is two times greater than the display refresh rate in FIG. 68, the embodiment of the present invention is not limited thereto. The touch report rate may be 3 times, 4 times, etc., or N times of the display refresh rate.

In the third driving method, there is no display update of the display panel 20 while the touch sensors 10 and 10' are working. Therefore, it is advantageous that the touch sensors 10 and 10' are not affected by display noise caused by the display panel 20 while the touch sensors 10 and 10' are working. In addition, the influence of flicker may be minimized in the display panel 20 because of the touch sensors 10 and 10' operation.

Figure 69:
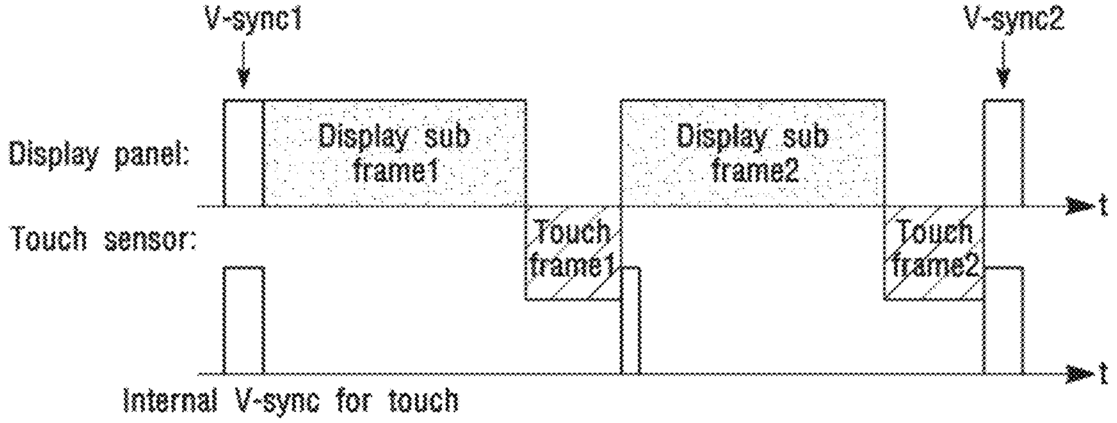
FIG. 69 is a view for explaining a fourth driving method of the touch input devices 1 and 1' shown in FIGS. 37 and 54.

FIG. 69 is a view for explaining a fourth driving method of the touch input devices 1 and 1' shown in FIGS. 37 and 54.

The fourth driving method in FIG. 69 is a driving method of the touch sensors 10 and 10' considering the driving of the display panel 20. This fourth driving method may be performed by the circuitry 15 of FIGS. 37 and 54.

Referring to FIG. 69, the fourth driving method is a driving method in which the touch report rate is higher than the display refresh rate when the driving timing of the touch sensors 10 and 10' and the driving timing of the display panel 20 are completely separated.

As shown in FIG. 69, the display circuitry 25 divides the entire driving time interval, including horizontal synchronization signals (H-sync), into a first-time interval (display subframe 1) and a second time interval (display subframe 2) between the two vertical synchronization signals V-sync1 and V-sync2. Here, the circuitry 15 receives a vertical synchronization signal (V-sync). The circuitry 15 generates at least one internal signal having a frequency of 1/N times (N is a natural number) or frequency of N times (N is a natural number) based on the vertical synchronization signal V-sync 1. Then, the circuitry 15 may control the timing of the driving signal to be applied to the touch sensors 10 and 10' based on the generated internal signal.

When the internal signal may not be used, the circuitry 15 is required to individually control a plurality of time frames (touch frame 1 and touch frame 2) that the touch sensors 10 and 10' are driven. However, according to the fourth driving method described above, the circuitry 15 may respectively control two or more time intervals which may drive the touch sensors 10 and 10' based on the generated internal signals. It is an advantage that driving control of the touch sensor 10 and 10' is simplified.

Also, in the fourth driving method, there is no display update of the display panel 20 while the touch sensors 10 and 10' are working. Therefore, it is advantageous that the touch sensors 10 and 10' are not affected by the display noise caused by the display panel 20 while the touch sensors 10 and 10' are working. In addition, the influence of flicker may be minimized in the display panel 20 because of the touch sensors 10 and 10' operation.

Figure 70:
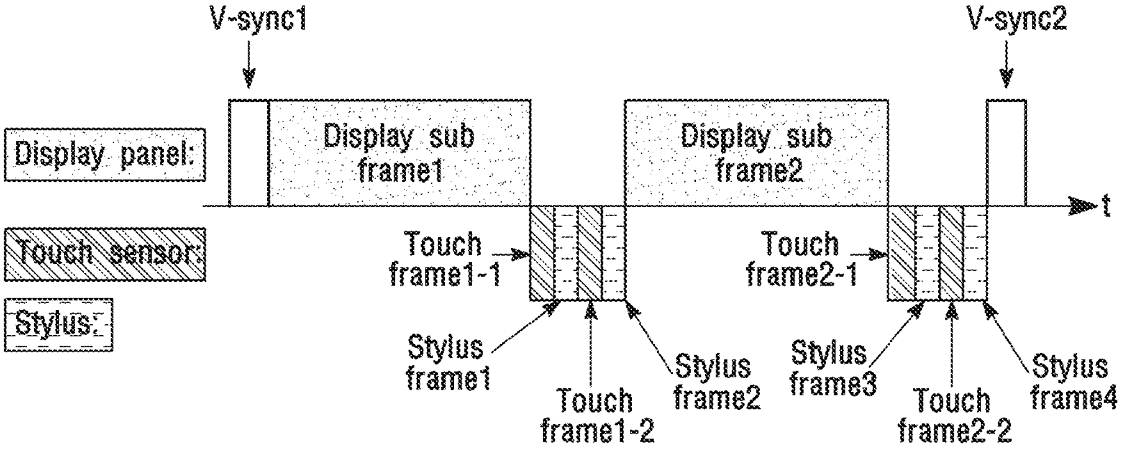
FIG. 70 is a view for explaining a fifth driving method of the touch input devices 1 and 1' shown in FIGS. 37 and 54.

FIG. 70 is a view for explaining a fifth driving method of the touch input devices 1 and 1' shown in FIGS. 37 and 54.

The fifth driving method in FIG. 70 is a driving method of the touch sensors 10 and 10' considering the driving of the display panel 20. This fifth driving method may be performed by the circuitry 15 of FIGS. 37 and 54.

Referring to FIG. 70, the fourth driving method is a driving method in which the touch report rate is higher than the display refresh rate when the driving timing of the touch sensors 10 and 10' and the driving timing of the display panel 20 are completely separated. The fourth driving method may support not only the touch sensors 10 and 10' but also a stylus.

When simultaneously supporting the touch sensors 10 and 10' and the stylus, the circuitry 15 may drive the touch sensors 10 and 10' by time-dividing the driving/receiving time interval of the touch sensors 10 and 10' and the stylus.

As shown in FIG. 70, the display circuitry 25 divides the entire driving time interval, including horizontal synchronization signals (H-sync), into a first-time interval (display subframe 1) and a second time interval (display subframe 2) between the two vertical synchronization signals V-sync1 and V-sync2. In this case, the circuitry 15 drives the touch sensors 10 and 10' and drives and receives the stylus for a predetermined time interval between the two time frames (display sub-frame 1 and display sub-frame 2). The circuitry 15 may determine separately the driving time of the sensor and the driving/receiving time of the stylus.

For example, for a predetermined time interval between the two time intervals (display subframe 1 and display subframe 2), the touch sensors 10 and 10' and the stylus may be alternately driven (Touch frame 1-1, Stylus frame 1, Touch frame 1-2, and Stylus frame 2).

Here, an expression of "the circuitry 15 drives the stylus" may mean that the circuitry 15 may control a pen driving signal to the touch sensors (10 and 10) to drive an externally positioned stylus by using the principle of an electric field or a magnetic field. Here, the circuitry 15 may input the pen driving signal to the plurality of the first electrodes or the plurality of the second electrodes of the touch sensors (10 and 10'), otherwise, the circuitry 15 may input the pen driving signal to other electrodes of the touch sensors 10 and 10'.

As another example, the display circuitry 25 may control the driving of the touch sensors 10 and 10' and the receiving of the stylus alternately to perform repeatedly (e.g. Touch frame 1-1, Stylus frame 1, Touch frame 1-2, and Stylus frame 2) for a predetermined time interval between the two time intervals (display subframe 1, display subframe 2).

Here, an expression of "the circuitry 15 receives the stylus" may mean that a pen signal from an externally positioned stylus is received using the principle of an electric field or a magnetic field. Here, the circuitry 15 may receive the pen signal from a plurality of the first electrodes or a plurality of the second electrodes of the touch sensors 10 and 10', otherwise, the circuitry 15 may receive the pen signal from other separate electrodes of the touch sensors 10 and 10'.

As another example, the display circuitry 25 may control the driving of the touch sensors 10 and 10' and the driving and receiving of the stylus alternately to perform repeatedly (e.g. Touch frame 1-1, Stylus frame 1, Touch frame 1-2, and Stylus frame 2) for a predetermined time interval between the two time intervals (display subframe 1 and display subframe 2).

Also, the display circuitry 25 may control the touch sensors 10 and 10' and the stylus together to drive alternately to perform repeatedly (e.g. Touch frame 2-1, Stylus frame 3, Touch frame 2-2, and Stylus frame 4) during the time interval between the last refresh time interval (display subframe 2) and the next vertical synchronization signal (V-sync 2), and the touch sensor and the stylus may be repeatedly performed (Touch frame 2-1, Stylus frame 3, Touch frame 2-2, and Stylus frame 4). The display circuitry 25 may control the driving of the touch sensors 10 and 10' and the driving or/and receiving of the stylus alternately to perform repeatedly (e.g. Touch frame 2-1, Stylus frame 3, Touch frame 2-2, Stylus frame 4).

When the circuitry 15 controls to make the stylus report rate higher than the touch report rate, the stylus report rate may be N (N is a natural number greater than 1) times of the touch report rate. In FIG. 70, it is assumed that the stylus report rate is twice of the touch report rate. For example, in FIG. 70, when the display refresh rate is 60 Hz, the touch report rate may be 120 Hz, and the stylus report rate may be 240 Hz. In this case, the circuitry 15 may divide the entire time interval for driving the touch sensors 10 and 10' into two (Touch frame 1-1 and Touch frame 1-2), and the circuitry 15 drives the stylus (Stylus frame 1) for a predetermined time interval between the divided two time intervals. The circuitry 15 drives the stylus (Stylus frame 2) again for a predetermined time interval after the second driving time interval (Touch frame 1-2).

In this fifth driving method, there is no display update of the display panel 20 while the touch sensors 10 and 10' are working. Therefore, it is advantageous that the touch sensors 10 and 10' are not affected by display noise caused by the display panel 20 while the touch sensors 10 and 10' are working. In addition, the influence of flicker may be minimized in the display panel 20 because of the touch sensors 10 and 10' operation.

When the touch sensor according to the exemplary embodiment of the present invention and the touch input device including the same are used, there is an advantage in that a touch signal may be detected even in the state where the touch input device is in a floating state identically or similarly to the state where the touch input state is in a grip state.

Further, there is an advantage in that the touch input device is capable of recognizing two or more multi-touches even in a floating state.

Further, there is an advantage in that the touch input device is capable of recognizing a third touch touched together with a cross touch.

In addition, according to the present invention, the display noise caused by the driving of the display panel may be minimized.

In addition, according to the present invention, the effect of the flicker which occurs on the display panel by the driving of the touch sensor may be minimized.

In addition, according to the present invention, the touch malfunction in the LGM state may be improved.

The aforementioned characteristic, structure, effect, and the like described in the exemplary embodiments are included in one exemplary embodiment of the present invention and are not essentially limited to only one exemplary embodiment. Further, the characteristic, structure, effect, and the like described in each exemplary embodiment may be carried out in other exemplary embodiments through combination or modification by those skilled in the art to which the exemplary embodiments pertain. Accordingly, it shall be construed that contents relating to the combination and the modification are included in the scope of the present invention.

What is claimed is:

1. An electronic device, comprising:
a display panel;
a sensor including:
a plurality of driving electrodes; and
a plurality of receiving electrodes disposed to interleave the plurality of driving electrodes, and electrically insulated from the plurality of driving electrodes, and
a circuitry connected to the plurality of driving electrodes and the plurality of receiving electrodes,
wherein at least one of the plurality of driving electrodes includes:
a first driving electrode; and
a second driving electrode disposed adjacent to the first driving electrode, and electrically insulated from the first driving electrode,
wherein at least one of the plurality of receiving electrodes is configured to:
output a first detection signal including first capacitance information associated with the first driving electrode when a first driving signal is applied to the first driving electrode by the circuitry, and
output a second detection signal including second capacitance information associated with the second driving electrode when a second driving signal is applied to the second driving electrode by the circuitry,
wherein the circuitry is configured to output a third detection signal corresponding to a subtraction based on the first detection signal and the second detection signal, and
wherein the circuitry is configured to:
drive the at least one of the plurality of driving electrodes in synchronization with at least one horizontal synchronization signal applied to the display panel, and
drive the at least one of the plurality of driving electrodes for a predetermined period of time after the horizontal synchronization signal starts to be applied to the display panel, and
wherein the at least one of the plurality of receiving electrodes comprises a first receiving electrode and a second receiving electrode electrically insulated from the first receiving electrode,
wherein the first receiving electrode is positioned closer to the first driving electrode than the second driving electrode, and
wherein the second receiving electrode is positioned closer to the second driving electrode than the first driving electrode.

2. The electronic device of claim 1,
wherein the above circuitry controls the first driving signal and the second driving signal to be simultaneously applied to the first driving electrode and the second driving electrode,
wherein a magnitude of the second driving signal is the same as that of the first driving signal, and
wherein a phase of the second driving signal is 180 degrees reversed from a phase of the first driving signal.

3. The electronic device of claim 1,
wherein the circuitry controls a touch report rate of the sensor to be the same as a display refresh rate of the display panel.

4. An electronic device, comprising:
a display panel;
a sensor including:
a plurality of driving electrodes; and
a plurality of receiving electrodes disposed to interleave the plurality of driving electrodes, and electrically insulated from the plurality of driving electrodes, and
a circuitry connected to the plurality of driving electrodes and the plurality of receiving electrodes,
wherein at least one of the plurality of driving electrodes includes:
a first driving electrode; and
a second driving electrode disposed adjacent to the first driving electrode, and electrically insulated from the first driving electrode,
wherein at least one of the plurality of receiving electrodes is configured to:

output a first detection signal including first capacitance information associated with the first driving electrode when a first driving signal is applied to the first driving electrode by the circuitry, and output a second detection signal including second capacitance information associated with the second driving electrode when a second driving signal is applied to the second driving electrode by the circuitry, wherein the circuitry is configured to output a third detection signal corresponding to a subtraction based on the first detection signal and the second detection signal, wherein the circuitry is configured to drive the at least one of the plurality of driving electrodes in a second time period different from a first time period in which a plurality of horizontal synchronization signals are applied to the display panel, wherein the at least one of the plurality of receiving electrodes comprises a first receiving electrode and a second receiving electrode electrically insulated from the first receiving electrode, wherein the first receiving electrode is positioned closer to the first driving electrode than the second driving electrode, and wherein the second receiving electrode is positioned closer to the second driving electrode than the first driving electrode.

5. The electronic device of claim 4, wherein the circuitry controls a touch report rate of the sensor to be higher than a display refresh rate of the display panel.

6. The electronic device of claim 4, wherein the circuitry controls the first driving signal and the second driving signal to be simultaneously applied to the first driving electrode and the second driving electrode, wherein a magnitude of the second driving signal is the same as that of the first driving signal, and wherein a phase of the second driving signal is 180 degrees reversed from a phase of the first driving signal.

7. The electronic device of claim 4, further comprising a display circuitry configured to control driving of the display panel, wherein the display circuitry is configured to drive the display panel by dividing an entire time interval in which the horizontal synchronization signals are applied into at least two time intervals, and wherein the circuitry is configured to drive the sensor in a predetermined time interval between the two time intervals.

8. The electronic device of claim 7, wherein the circuitry is configured to:

receive a vertical synchronization signal applied to the display panel;

generate at least one internal signal having a frequency corresponding to 1/N times (N is a natural number) of a frequency of the received vertical synchronization signal; and control a timing of a driving signal for driving the sensor based on the generated internal signal.

9. The electronic device of claim 7, wherein the circuitry is configured to control by dividing a time for driving the sensor and a time for driving or/and receiving a stylus within a predetermined time interval between the two time intervals.

10. The electronic device of claim 9, wherein the circuitry controls a stylus report rate of the stylus to be N times (N is a natural number greater than 1) faster than a touch report rate.

11. An electronic device, comprising:

a display panel;

a sensor including:

a plurality of driving electrodes; and a plurality of receiving electrodes disposed to interleave the plurality of driving electrodes, and electrically insulated from the plurality of driving electrodes, and a circuitry connected to the plurality of driving electrodes and the plurality of receiving electrodes, wherein at least one of the plurality of driving electrodes includes:

a first driving electrode; and a second driving electrode disposed adjacent to the first driving electrode, and electrically insulated from the first driving electrode, wherein at least one of the plurality of receiving electrodes is configured to:

include first capacitance information associated with the first driving electrode when a first driving signal is applied to the first driving electrode by the circuitry, and include second capacitance information associated with the second driving electrode when a second driving signal is applied to the second driving electrode by the circuitry, and wherein the circuitry is configured to output a detection signal based on the first capacitance information and the second capacitance information, and wherein the circuitry is configured to:

drive the at least one of the plurality of driving electrodes in synchronization with at least one horizontal synchronization signal applied to the display panel, drive the at least one of the plurality of driving electrodes for a predetermined period of time after the horizontal synchronization signal starts to be applied to the display panel, wherein the at least one of the plurality of receiving electrodes comprises a first receiving electrode and a second receiving electrode electrically insulated from the first receiving electrode, wherein the first receiving electrode is positioned closer to the first driving electrode than the second driving electrode, and wherein the second receiving electrode is positioned closer to the second driving electrode than the first driving electrode.

12. The electronic device of claim 11, wherein the circuitry controls the first driving signal and the second driving signal to be simultaneously applied to the first driving electrode and the second driving electrode, wherein a magnitude of the second driving signal is the same as that of the first driving signal, and wherein a phase of the second driving signal is 180 degrees reversed from a phase of the first driving signal.

13. The electronic device of claim 11, wherein the circuitry controls a touch report rate of the sensor to be the same as a display refresh rate of the display panel.

14. An electronic device, comprising:

a display panel;

a sensor including:

a plurality of driving electrodes; and a plurality of receiving electrodes disposed to interleave the plurality of driving electrodes, and electrically insulated from the plurality of driving electrodes, and a circuitry connected to the plurality of driving electrodes and the plurality of receiving electrodes, wherein at least one of the plurality of driving electrodes includes:

a first driving electrode; and a second driving electrode disposed adjacent to the first driving electrode, and electrically insulated from the first driving electrode, wherein at least one of the plurality of receiving electrodes is configured to:

include first capacitance information associated with the first driving electrode when a first driving signal is applied to the first driving electrode by the circuitry, and include second capacitance information associated with the second driving electrode when a second driving signal is applied to the second driving electrode by the circuitry, and wherein the circuitry is configured to output a detection signal based on the first capacitance information and the second capacitance information, wherein the circuitry is configured to drive the at least one of the plurality of driving electrodes in a second time period different from a first time period in which a plurality of horizontal synchronization signals are applied to the display panel, wherein the at least one of the plurality of receiving electrodes comprises a first receiving electrode and a second receiving electrode electrically insulated from the first receiving electrode, wherein the first receiving electrode is positioned closer to the first driving electrode than the second driving electrode, and wherein the second receiving electrode is positioned closer to the second driving electrode than the first driving electrode.

15. The electronic device of claim 14, wherein the circuitry controls a touch report rate of the sensor to be higher than a display refresh rate of the display panel.

16. The electronic device of claim 14, wherein the circuitry controls the first driving signal and the second driving signal to be simultaneously applied to the first driving electrode and the second driving electrode, wherein a magnitude of the second driving signal is the same as that of the first driving signal, and wherein a phase of the second driving signal is 180 degrees reversed from a phase of the first driving signal.

17. The electronic device of claim 14, further comprising a display circuitry configured to control driving of the display panel, wherein the display circuitry is configured to drive the display panel by dividing an entire time interval in which the horizontal synchronization signals are applied into at least two time intervals, and wherein the circuitry is configured to drive the sensor in a predetermined time interval between the two time intervals.

18. The electronic device of claim 17, wherein the circuitry is configured to:

receive a vertical synchronization signal applied to the display panel;

generate at least one internal signal having a frequency corresponding to 1/N times (N is a natural number) of a frequency of the received vertical synchronization signal; and control a timing of a driving signal for driving the sensor based on the generated internal signal.

19. The electronic device of claim 17, wherein the circuitry is configured to control by dividing a time for driving the sensor and a time for driving or/and receiving a stylus within a predetermined time interval between the two time intervals.

20. The electronic device of claim 19, wherein the circuitry controls a stylus report rate of the stylus to be N times (N is a natural number greater than 1) faster than a touch report rate.

* * * * *